US011239326B2

(12) United States Patent
LaRoche et al.

(10) Patent No.: US 11,239,326 B2
(45) Date of Patent: Feb. 1, 2022

(54) ELECTRODE STRUCTURE FOR FIELD EFFECT TRANSISTOR

(71) Applicant: Raytheon Company, Waltham, MA (US)

(72) Inventors: Jeffrey R. LaRoche, Austin, TX (US); Kelly P. Ip, Lowell, MA (US); Thomas E. Kazior, Sudbury, MA (US); Kamal Tabatabaie Alavi, Methuen, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/381,485

(22) Filed: Apr. 11, 2019

(65) Prior Publication Data

US 2019/0237554 A1 Aug. 1, 2019

Related U.S. Application Data

(62) Division of application No. 15/714,382, filed on Sep. 25, 2017, now abandoned.

(51) Int. Cl.
*H01L 29/40* (2006.01)
*H01L 21/285* (2006.01)
(Continued)

(52) U.S. Cl.
CPC ...... *H01L 29/404* (2013.01); *H01L 21/28575* (2013.01); *H01L 23/481* (2013.01);
(Continued)

(58) Field of Classification Search
USPC ........................................................ 257/365
(Continued)

(56) References Cited

U.S. PATENT DOCUMENTS

| 7,893,500 B2 | 2/2011 | Wu et al. |
| 7,915,644 B2 | 3/2011 | Wu et al. |

(Continued)

FOREIGN PATENT DOCUMENTS

| CN | 101958450 | 1/2011 |
| JP | H0884007 | 3/1996 |

(Continued)

OTHER PUBLICATIONS

Notification of Transmittal of the International Search Report and Written Opinion of the ISA dated Nov. 9, 2018 for International Application No. PCT/US2018/044517; 1 Page.

(Continued)

*Primary Examiner* — Hrayr A Sayadian
(74) *Attorney, Agent, or Firm* — Daly, Crowley, Mofford & Durkee, LLP

(57) ABSTRACT

A Field Effect Transistor (FET) structure having: a semiconductor; a first electrode structure; a second electrode structure; and a third electrode structure for controlling a flow of carriers in the semiconductor between the first electrode structure and the second electrode structure; a dielectric structure disposed over the semiconductor and extending horizontally between first electrode structure, the second electrode structure and the third electrode structure; and a fourth electrode passing into the dielectric structure and terminating a predetermined, finite distance above the semiconductor for controlling an electric field in the semiconductor under the fourth electrode structure.

19 Claims, 55 Drawing Sheets

(51) Int. Cl.

| | |
|---|---|
| *H01L 23/48* | (2006.01) |
| *H01L 23/485* | (2006.01) |
| *H01L 29/417* | (2006.01) |
| *H01L 29/45* | (2006.01) |
| *H01L 29/66* | (2006.01) |
| *H01L 29/778* | (2006.01) |
| *H01L 29/20* | (2006.01) |
| *H01L 23/535* | (2006.01) |
| *H01L 21/28* | (2006.01) |
| *H01L 29/423* | (2006.01) |
| *H01L 23/532* | (2006.01) |
| *H01L 29/51* | (2006.01) |

(52) U.S. Cl.
CPC .......... *H01L 23/485* (2013.01); *H01L 23/535* (2013.01); *H01L 29/2003* (2013.01); *H01L 29/402* (2013.01); *H01L 29/408* (2013.01); *H01L 29/4175* (2013.01); *H01L 29/41725* (2013.01); *H01L 29/45* (2013.01); *H01L 29/452* (2013.01); *H01L 29/66462* (2013.01); *H01L 29/7786* (2013.01); *H01L 21/28114* (2013.01); *H01L 21/28587* (2013.01); *H01L 23/53238* (2013.01); *H01L 29/42316* (2013.01); *H01L 29/517* (2013.01); *H01L 2229/00* (2013.01)

(58) Field of Classification Search
IPC .......... H01L 29/452, 29/7786, 29/2003, 29/402, 29/408, 21/28575, 23/535, 23/481, 29/66462, 29/404, 29/4175, 29/45, 29/41725, 23/485, 2229/00, 29/517, 21/28587, 21/28814, 23/53238, 29/42316
See application file for complete search history.

(56) References Cited

U.S. PATENT DOCUMENTS

| | | | |
|---|---|---|---|
| 9,306,014 | B1 | 4/2016 | Kudymov et al. |
| 2010/0176421 | A1 | 7/2010 | Van Hove et al. |
| 2012/0193597 | A1* | 8/2012 | Shingu .................... H01L 45/08 257/2 |
| 2012/0228632 | A1 | 9/2012 | Takada et al. |
| 2013/0221356 | A1* | 8/2013 | Yamazaki .......... H01L 27/1207 257/57 |
| 2015/0021666 | A1 | 1/2015 | Chen et al. |
| 2015/0357422 | A1* | 12/2015 | Liao .................... H01L 29/7786 257/76 |
| 2017/0018617 | A1 | 1/2017 | Xia et al. |

FOREIGN PATENT DOCUMENTS

| | | |
|---|---|---|
| JP | 2016171265 | 9/2016 |
| JP | 2017-123432 A | 7/2017 |

OTHER PUBLICATIONS

Non-Final Office Action dated Jan. 14, 2019 for U.S. Appl. No. 15/714,382; 10 Pages.
Pala, et al.; "Drain-to-gate field engineering for improved frequency response of GaN-based HEMTs"; Solid-State Electronics 52; pp. 1217-1220; 2008; 4 Pages.
Sachse, et al.; Quasi-Ideal Multilayer Two- and Three-Strip Directional Couplers for Monolithic and Hybrid MIC's; IEEE Transactions on Microwave Theory and Techniques; vol. 47; No. 9; Sep. 1999; pp. 1873-1999; 10 Pages.
Search Report dated Nov. 9, 2018 for International Application No. PCT/US2018/044517; 4 Pages.
Written Opinion of the ISR dated Nov. 9, 2018 for International Application No. PCT/US2018/044517; 7 Pages.
Japanese Office Action with English Translation dated Aug. 24, 2021, Application No. 2020-517142; 10 Pages.
Japanese Office Action with English Translation dated Nov. 8, 2021, Application No. 2020-517142; 10 Pages.

* cited by examiner

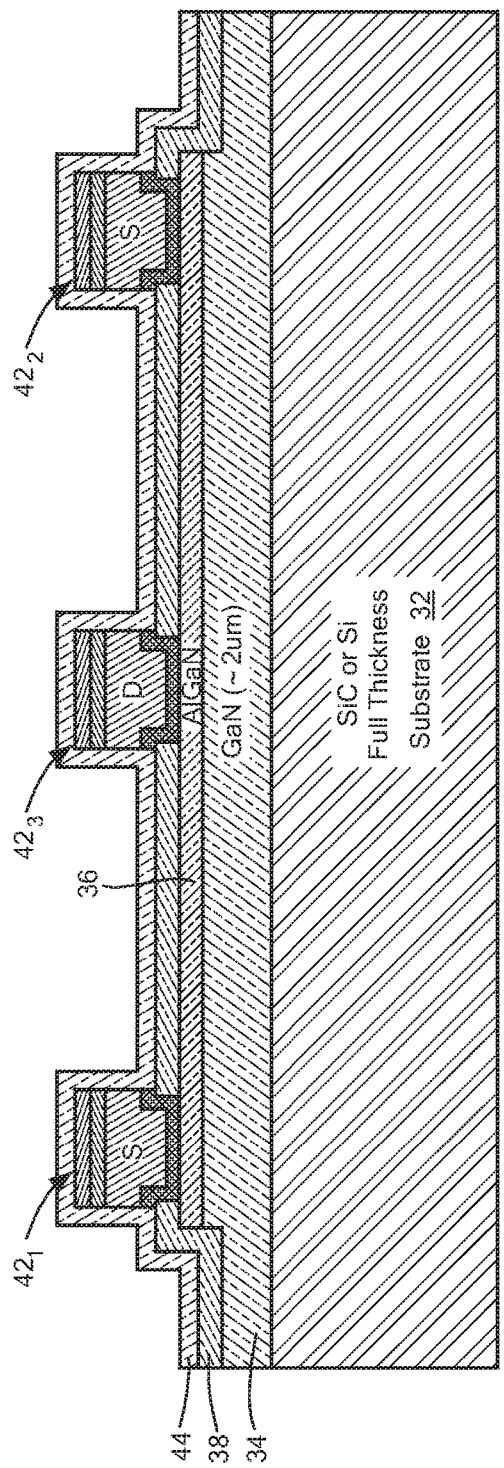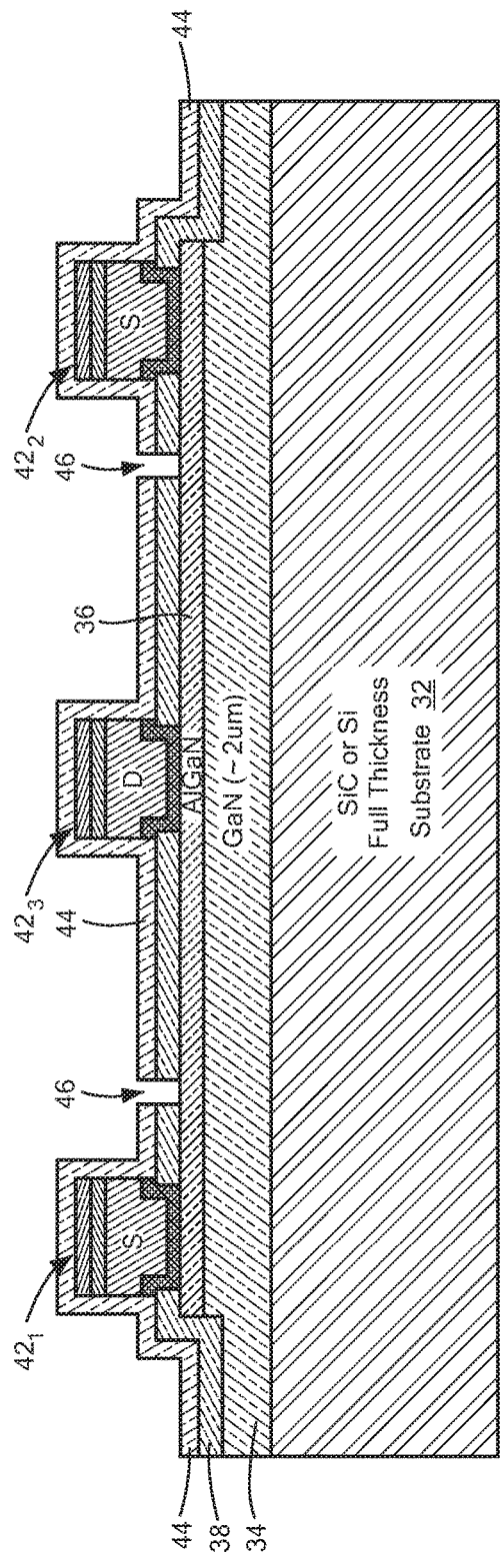

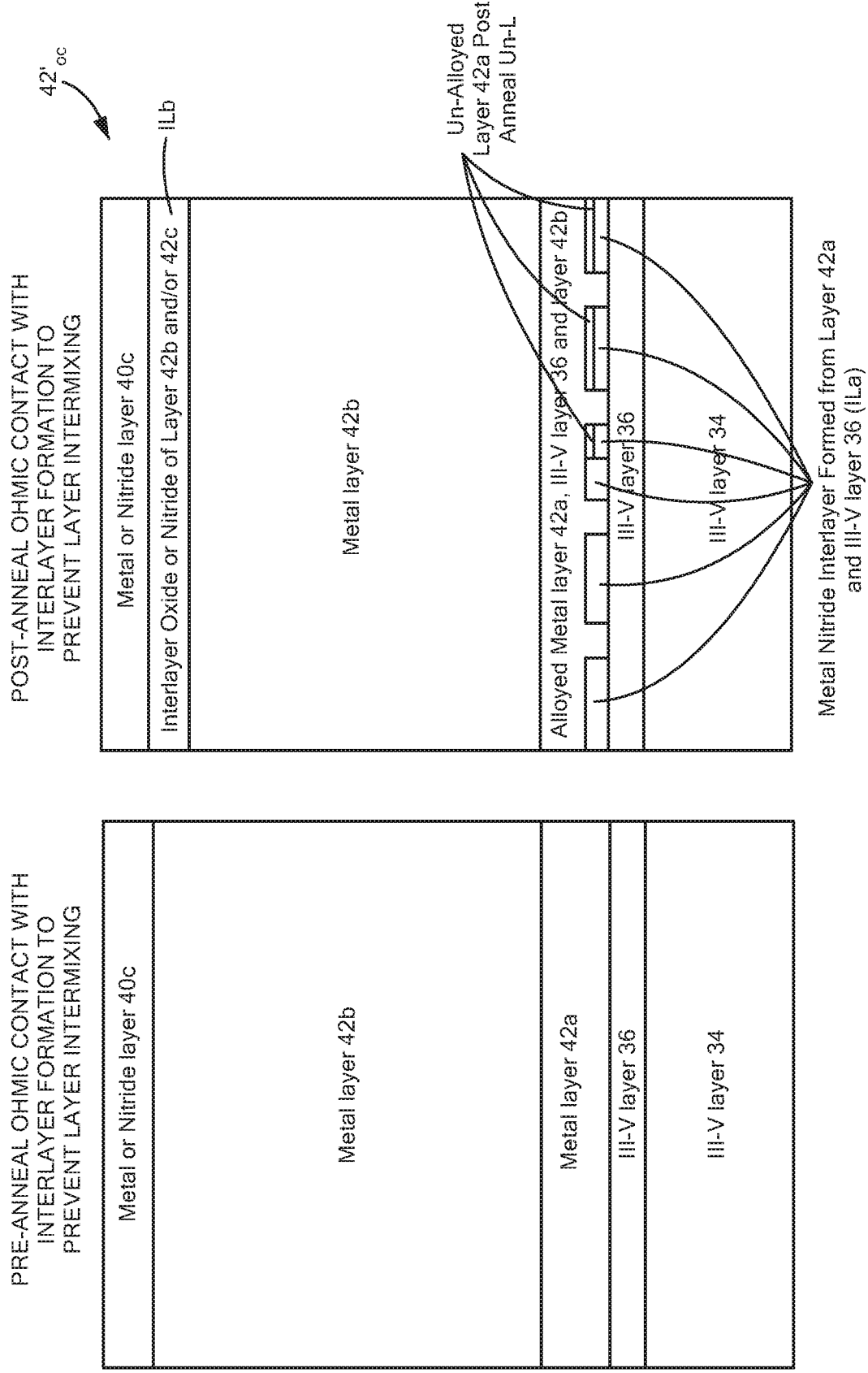

ELECTRODE STRUCTURE FOR FIELD EFFECT TRANSISTOR

CROSS REFERENCE TO RELATED APPLICATION

This is a Divisional Application of application Ser. No. 15/714,382 filed Sep. 25, 2017 which application is hereby incorporated herein by reference in its entirety.

TECHNICAL FIELD

This disclosure relates generally to Field Effect Transistors (FETs) and more particularly to electrode structures for such FETs.

BACKGROUND

As is known in the art, lateral field effect transistors (FETs) used for Radio Frequency (RF) or power electronics applications utilize field plates to lower the peak E-fields at the drain-edge of the gate electrode to enable higher breakdown capability and to mitigate against electric field-induced trapping thereby avoiding degraded high power performance. One such Group III-V (here AlGaN) FET having a field plate is described in FIG. 1A, see U.S. Pat. No. 7,893,500, Wu et al, issued Feb. 22, 2011. In III-V foundries with liftoff processing the field plate is deposited over a dielectric spacer layer deposited after gate top formation. Here, the source and drain are in Ohmic contact with the Group III-V AlGaN barrier layer and a gate electrode of the FET is in Schottky contact with the barrier layer and is used to control a flow of carriers through a channel between the source and drain. As described in the above-referenced U.S. Pat. No. 7,893,500, issued Feb. 22, 2011, Wu et al., a first insulating or dielectric passivation is deposited on the barrier layer and has a first portion extending between the source and the gate, while a second portion extends between the drain and the gate. A spacer layer is disposed over the passivation layer and over the gate. It is noted however, that the thickness of the spacer layer determines the distance of portions of the field plate from the top of the gate, and contributes, when combined with the thickness of the second portion of the passivation layer, to the distance between the field plate and the surface of the barrier layer in the region between the gate and the drain. Therefore, the field plate design and implementation is additionally constrained by the deposition/thickness of the spacer layers and by the overall three dimensional (3D) surface topology inherent in III-V foundry transistor gate processing which use lift-off processing to form the field plate after forming the second spacer layer. See also, U.S. Pat. No. 7,915,644, issued Mar. 29, 2011, Wu et al., where, as shown in FIG. 1B, a single spacer layer is used; however, here again, the field plate design is still constrained by the thickness of the deposited dielectric layer and the 3D structure of the gate. In addition to the field plate placement constraints posed by the approach of depositing spacer layers over 3D gate topology, it is noted that field plates processed by this method also may suffer from metal cracking and thinning where the field plate metal passes over the 3D gate topology.

Referring to FIG. 1C, other example of a source connected field plate is shown, see U.S. Pat. No. 9,306,014, issued Apr. 5, 2016, Kudymov et al; here subtractive processing, such as used in silicon foundries is used to form the source connected field plate during Back End Of Line (BEOL) processing as one or more metal layers disposed horizontally as metal layers fabricated subsequently to the gate process with the thickness of the interlayer dielectric material disposed between the field plate and the carrier channel and the length of the field plate interacting with the gate to determine the field profile at the edge of the gate. This approach takes advantage of high yield planar silicon (Si)-like processes, but is inherently constrained in design of its tailoring of the electric field profile of the gate by the thickness of the each deposited planar dielectric layer beneath it. Additionally, this approach inherently has more limited ability to tailor the field for optimal breakdown and performance for small source to drain distances typically used for high frequency RF HEMTs and integrated circuits at GHz frequencies.

SUMMARY

In accordance with the present disclosure, a transistor structure is provided having: a semiconductor; a first electrode structure; a second electrode structure; a third electrode structure for controlling a flow of carriers in the semiconductor between the first electrode structure and the second electrode structure; a dielectric structure disposed over the semiconductor and extending horizontally between first electrode structure, the second electrode structure and the third electrode structure; and a fourth electrode structure passing into the dielectric structure and terminating a predetermined, finite distance above the semiconductor.

In one embodiment, the fourth electrode structure is connected to the first electrode structure.

In one embodiment, the fourth electrode structure is a field plate structure.

In one embodiment, the first electrode structure and the field plate structure are at the same voltage potential.

In one embodiment, the first electrode structure, the second electrode structure, third electrode and the fourth electrode structure are separate electrode structures.

In one embodiment, the first electrode structure is a source electrode structure, the second electrode structure is a drain electrode structure and the fourth electrode structure is an electrode structure for controlling an electric field in a region of the semiconductor under the fourth electrode.

In one embodiment, the first electrode structure, the second electrode structure, third electrode structure and the fourth electrode structure are electrically isolated one from the other.

In one embodiment, the first electrode structure and the second electrode structure are in Ohmic contact with the semiconductor.

In one embodiment, a Field Effect Transistor (FET) structure is provided having: a semiconductor; a source electrode structure and a drain in Ohmic contact with the semiconductor; a gate electrode for controlling a flow of carriers in the semiconductor between the source electrode and the drain electrode, the gate electrode being in contact with the semiconductor; a dielectric structure disposed over the semiconductor and extending horizontally between gate electrode structure, the source electrode structure and the drain electrode structure; and a field plate electrically connected to the source electrode, the field plate passing vertically into the dielectric structure and terminating a predetermined, finite distance above the semiconductor.

In one embodiment, a Field Effect Transistor (FET) structure is provided having: a semiconductor; a source electrode structure and a drain electrode structure each having: an upper, electrical interconnect portion; and a lower Ohmic contact portion in Ohmic contact with the semiconductor, the upper, electrical interconnect portion passing vertically from an upper surface of the structure to the lower Ohmic contact portion; a gate electrode for controlling a flow of carriers in the semiconductor between the source electrode and the drain electrode, the gate electrode having: an upper, electrical interconnect portion; and a lower contact portion in contact with the semiconductor; the upper, electrical interconnect portion of the gate electrode passing vertically into the FET structure to the lower contact portion; a dielectric structure disposed over the semiconductor and extending horizontally between gate electrode structure and the drain electrode structure; and, a field plate electrically connected to the upper portion of the source electrode structure and passing vertically into the dielectric structure and terminating a predetermined, finite distance from the semiconductor.

In one embodiment, a Field Effect Transistor (FET) structure is provided having: a semiconductor; a first dielectric structure disposed over the semiconductor; a second dielectric structure disposed on the first dielectric structure; a source electrode and a drain electrode each having: an upper, electrical interconnect portion; and a lower Ohmic contact portion in Ohmic contact with the semiconductor, the lower Ohmic contact portion passing vertically through the first dielectric structure to the semiconductor, the upper, electrical interconnect portion passing vertically into the second dielectric structure to the lower Ohmic contact portion; a gate electrode for controlling a flow of carriers in the semiconductor between the source electrode and the drain electrode, the gate electrode having: an upper, electrical interconnect portion; and a lower portion in contact with the semiconductor; the upper, electrical interconnect portion passing vertically into the second dielectric structure to the lower portion; a portion of the first dielectric structure and a portion of the second dielectric structure extending horizontally between the gate electrode and the drain electrode; and a field plate parallel to: the upper, electrical interconnect portion of the source electrode and the drain electrode; and the upper, electrical interconnect portion of the gate electrode, the field plate being disposed between the upper, electrical interconnect portion of the drain electrode and the upper, electrical interconnect portion of the gate electrode, the field plate having: an upper, electrical interconnect portion electrically connected to the upper portion of the source electrode, the upper, electrical interconnect portion of the field plate passing vertically from the upper surface of the FET structure, into the second dielectric layer, and terminating at a lower portion of the field plate, the lower portion of the field plate being disposed a predetermined, finite distance from the semiconductor.

In one embodiment, the first dielectric structure comprises an etch stop layer and the lower portion of the field plate terminates at the etch stop layer.

In one embodiment, the first dielectric structure comprises an etch stop layer and the lower portion of the field plate terminates at the first dielectric structure.

In one embodiment, the first dielectric structure comprises an etch stop layer the lower portion of the field plate terminates within the second dielectric layer.

In one embodiment, the upper, electrical interconnect portion of the source electrode and the drain electrode and, the upper, electrical interconnect portion of the gate electrode are copper Damascene structures.

In one embodiment, the upper, electrical interconnect portion of the field plate is electrically connected to the upper portion of the source electrode though an interconnection structure and wherein the interconnection portion is a copper Damascene structure.

With such an arrangement, the field plate passing vertically into the dielectric structure and terminating a predetermined, finite, controllable distance above the semiconductor from the surface of the semiconductor of the FET and therefore its design is decoupled from the thickness of the deposited dielectric layer structures.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 12A and 12A' is a pair of diagrammatical cross sectional sketches useful in understanding a another low temperature anneal process used in forming the semiconductor structure according to the disclosure; FIGS. 13A'-13D', 13D", 13D''' and FIG. 13E' being cross sectional diagrams of plan view FIG. 13A-13E being taken along line 13A'-13D',13D", 13D''' and 13E' respectively, in FIGS. 13A-13E.

Like reference symbols in the various drawings indicate like elements.

DETAILED DESCRIPTION

Figure 1A:
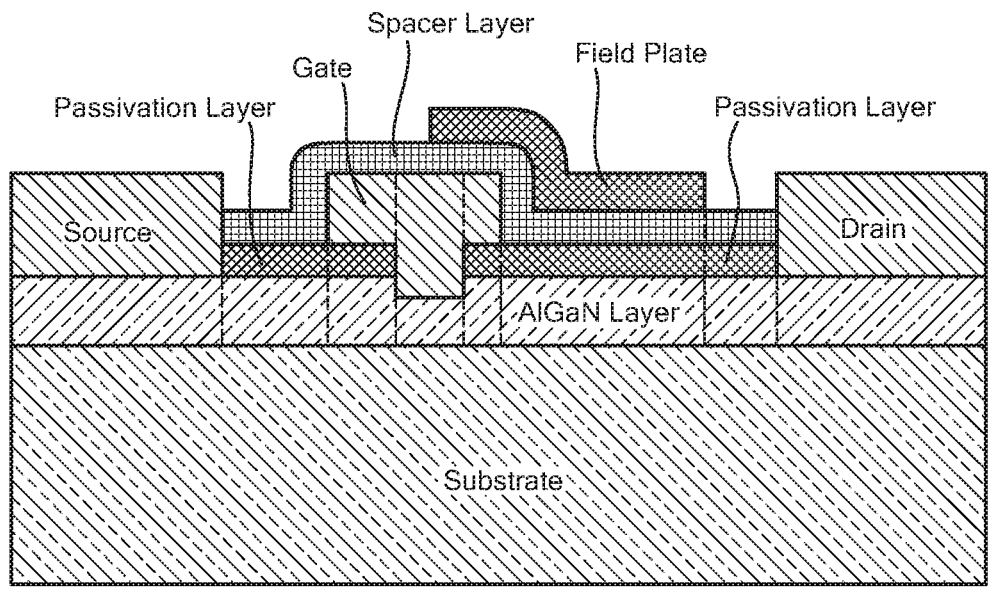
FIGS. 1A, 1B and 1C are diagrammatical cross-sectional views of FETs having field plate structures according to the PRIOR ART.
Figure 1B:
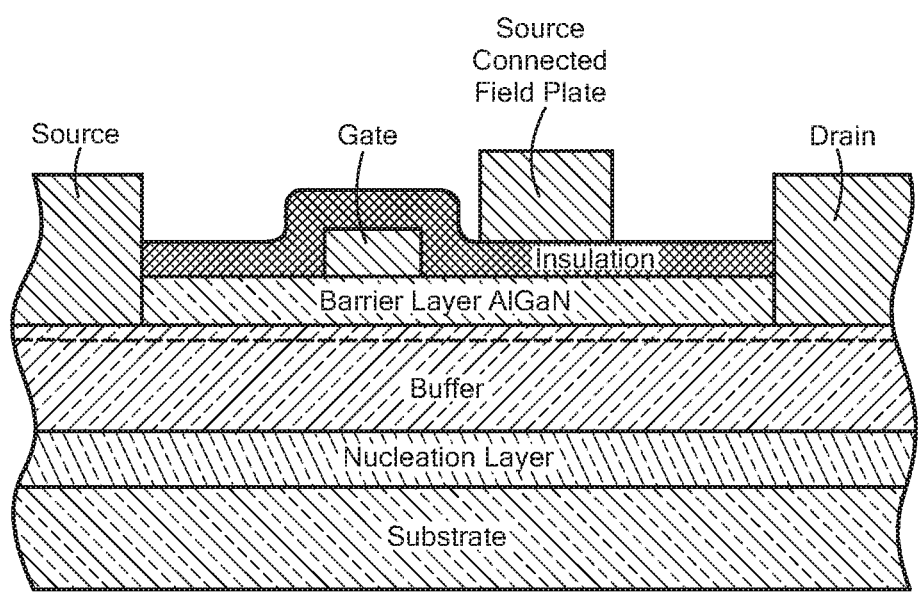
Figure 1C:
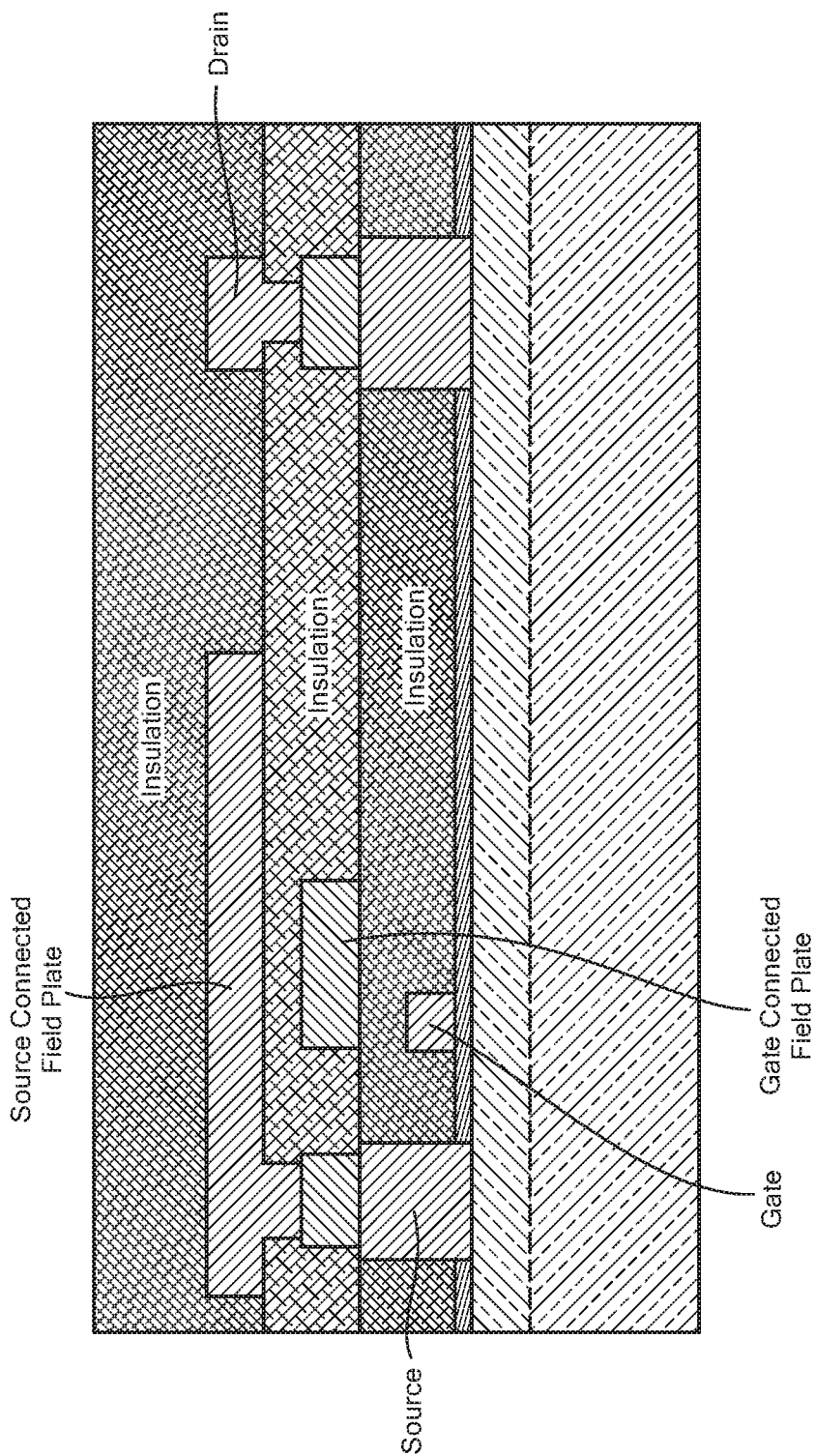
Figure 2A:
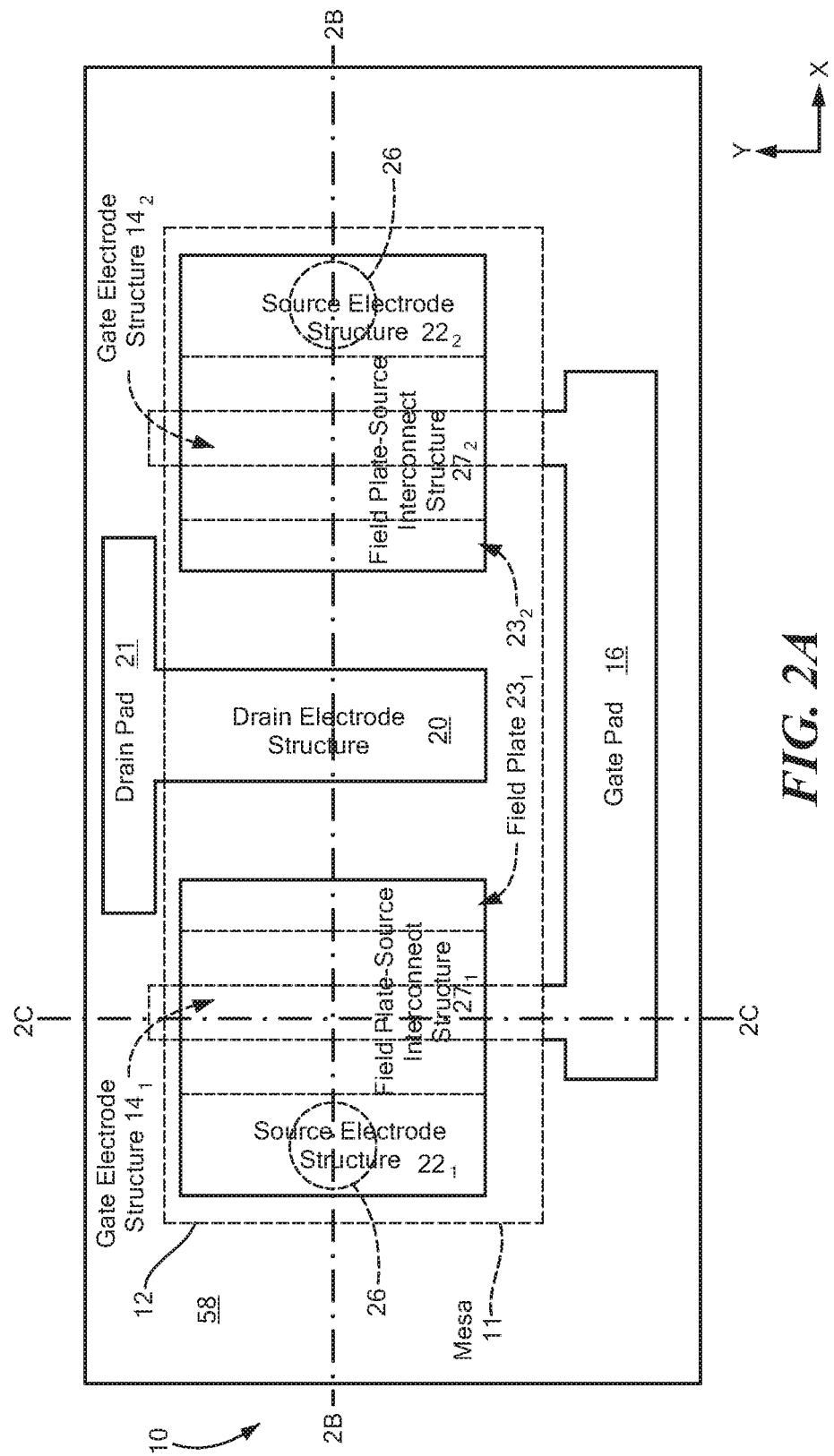
FIG. 2A is a diagrammatical plan view sketch of a FET having a source connected field plate according to the disclosure.
Figure 2B:
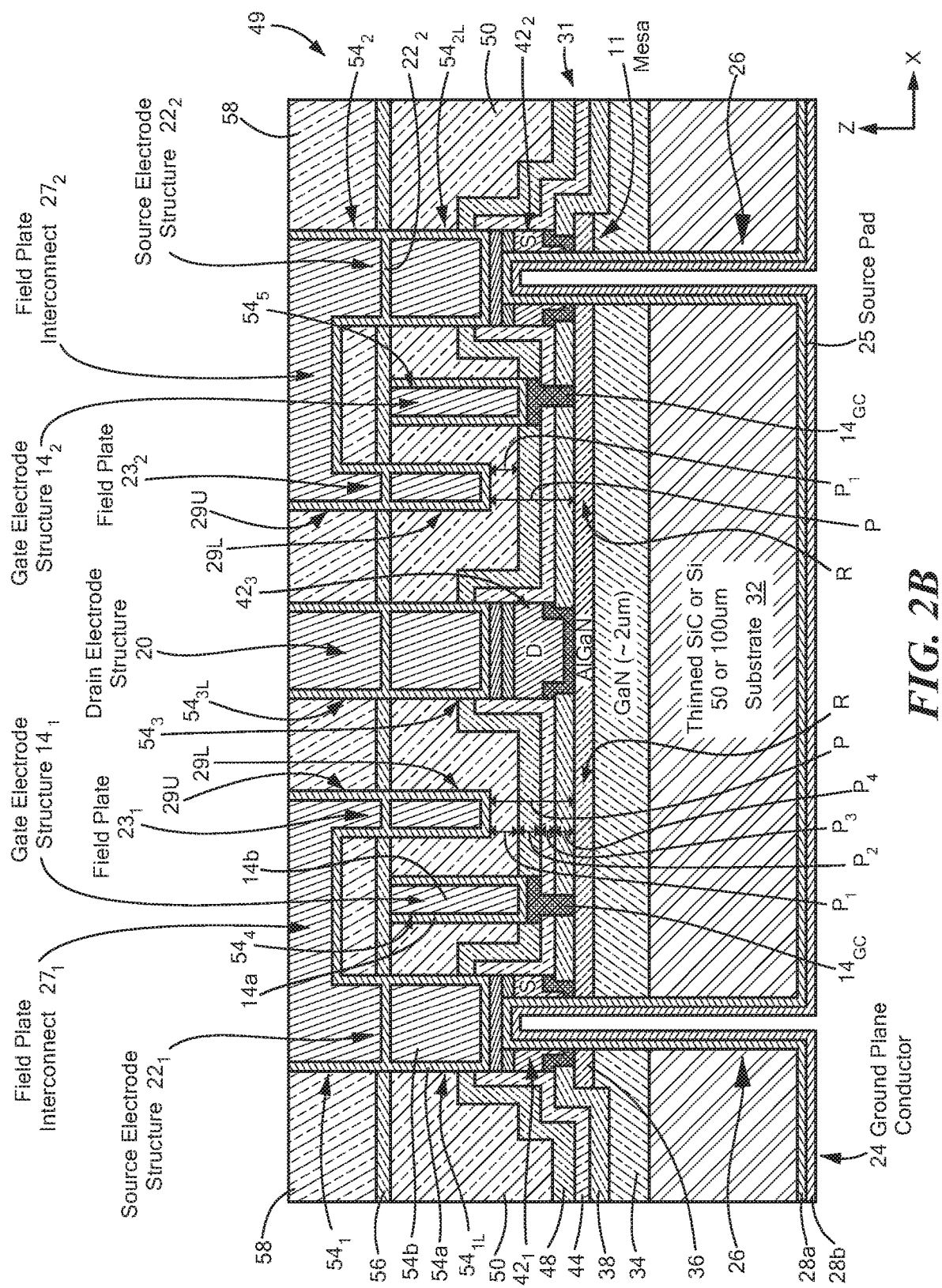
FIG. 2B is a diagrammatical cross-sectional view sketch of the FET of FIG. 2A, such cross-section being taken along line 2B-2B in FIG. 2A according to the disclosure.

Referring now to FIGS. 2A and 2B, a semiconductor structure 10 is shown having formed therein a multi-gate Field Effect Transistor (FET) 12, here a HEMT. The FET 12 includes a plurality of, here, for example two, gold-free, finger-like gate electrode structures $14_1$, $14_2$. The semiconductor structure 10 includes a dielectric substrate 32, to be described in detail below, having, in this example, a semiconductor mesa 11, such semiconductor mesa 11 having a semiconductor layer 36, to be described in detail below, on the semiconductor mesa 11. More particularly, the gate electrode structures $14_1$, $14_2$ are disposed on the semiconductor layer 36 of semiconductor mesa 11 and are electrically interconnected to a gold-free, gate pad 16 disposed of the semiconductor mesa 11 and on the substrate 32 through a gate-gate pad interconnect 17 (FIG. 2C); a gold-free, finger-like drain electrode structure 20 disposed on, and in Ohmic contact with, the semiconductor layer 36 on the semiconductor mesa 11 and connected to a drain pad 21 off of the semiconductor mesa 11 and on the substrate 32 as shown, and a plurality of, here for example two, gold-free, source electrode structures $22_1$, $22_2$ connected to a ground conductor plane conductor 24 (FIG. 2B) which serves as a source pad 25 for the FET 12, on the back side of a substrate 32 through electrically conductive vias 26; and a pair of field plates $23_1$, $23_2$, here, for example, source-connected field plates, disposed between the gate electrode structure $14_1$ and the drain electrode structure 20 and between the gate electrode structure $14_2$ and the drain electrode structure 20, respectively, as shown. It is noted while the gate electrode structure $14_1$,$14_2$ controls a flow of carriers between the source electrode structures $22_1$, $22_2$ and drain electrode structure 20 through the semiconductor mesa 11, the gate pad 16, drain pad 21 and source pad 25 are electrically isolated by the dielectric substrate 32. It should be noted that the electrical isolation provided by the etched mesa structure in FIG. 1A could also be provided by ion implantation (instead of etching), here for example nitrogen, of the same masked layer. This would result in a planar structure.

The field plates $23_1$, $23_2$ extend vertically down (along the Z-axis) from the upper surface of the structure 10 a predetermined depth into a first dielectric structure 49, having layers 50, 56, and 58, to be described. The field plates $23_1$, $23_2$ have: upper ends 29U connected to the upper portion of the source electrode structures $22_1$, $22_2$ through field plate-interconnects $27_1$, $27_2$, respectively, and lower ends 29L separated from the semiconductor layer 36 by a predetermined distance P; where P is the sum of: the predetermined distance ($P_1$) between the lower ends 29L from the upper surface of a dielectric structure 31, such structure 31 having: a dielectric layer 48, here Silicon nitride, SiNx, having a predetermined thickness ($P_2$); a dielectric layer 44, here SiNx, having a predetermined thickness ($P_3$); and, a dielectric layer 38, here SiNx, here having a predetermined thickness ($P_4$), as shown. Thus, $P=P_1+P_2+P_3+P_4$. The field plates $23_1$, $23_2$ control an electric field in a region, R, in the semiconductor layer 36 under the bottom of the field plates $23_1$, $23_2$ The dielectric structure 49 has: an upper dielectric layer 58, here, for example, silicon dioxide ($SiO_2$); a middle dielectric layer 56, here, for example, silicon nitride (SiNx); and a lower dielectric layer 50, here, for example, silicon dioxide ($SiO_2$). The field plates $23_1$, $23_2$ are laterally spaced along the X-axis in the X-Y plane, of the FET 12 structure 10, as shown. It is noted that the source electrode structures $22_1$, $22_2$, the drain electrode structure 20, the gate electrode structures $14_1$, $14_2$ and the field plates $23_1$, $23_2$, are mutually parallel with one another along the Y-axis and are elongated along the Z-axis, as shown. It should be understood that the number of gate electrodes, source electrodes and drain electrodes may be more or less that that shown; in any event, each one of the gate electrode structures $14_1$, $14_2$ is disposed between a corresponding one of the drain electrode structures 20 and a corresponding one of the source electrode structures $22_1$, $22_2$ to control a flow of carriers in the FET 12 between the corresponding one of the source electrode structures $22_1$, $22_2$ and the drain electrode structure 20. As will be described in more detail in connection with FIGS. 3A-3T, the front or top side of the structure 10 is processed in a silicon foundry to form the multi-gate FET 12.

More particularly, and continuing with reference to FIGS. 2A and 2B, the semiconductor structure 10 includes the substrate 32 here for example, silicon (Si), silicon carbide (SiC), or silicon on insulator (SOI). A layer of a Group III-N layer 34, here gallium nitride (GaN) on an upper portion of the substrate 32 having a thickness of approximately ~2-5 microns over the upper surface of the substrate 32 and by a Group III-N semiconductor layer 36, here aluminum gallium nitride ($Al_{(x)}Ga_{(1-x)}N$, where x is $0<x\leq1$) for example having thicknesses of approximately 50-300 angstroms, on the upper surface of the Group III-N layer 34 (FIG. 2B). It should be understood that the layer 34 (FIG. 2B) is here a GaN buffer structure, which also includes nucleation and strain relief layers, not shown. Conventional silicon (Si) foundry compatible (subtractive) lithographic-etching processing techniques are used to remove portions of the Group III-N semiconductor layer 34 and Group III-N semiconductor layer 36 to form the semiconductor mesa 11.

Figure 3A:
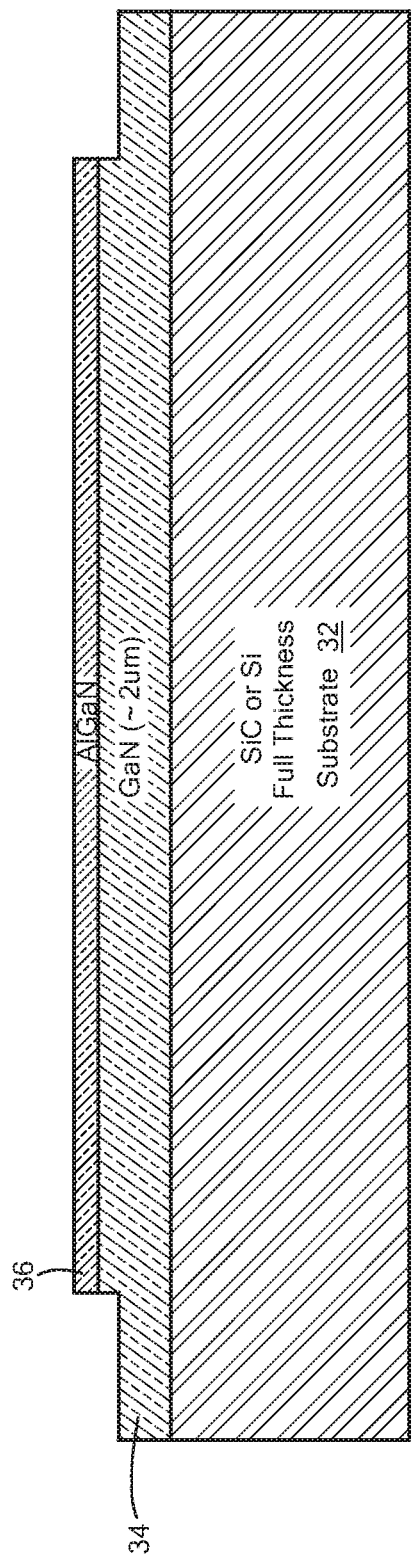
FIGS. 3A-3T are diagrammatical cross-sectional view sketches of the FET of FIGS. 2A and 2B at various stages in the fabrication thereof according to the disclosure.
Figure 3B:
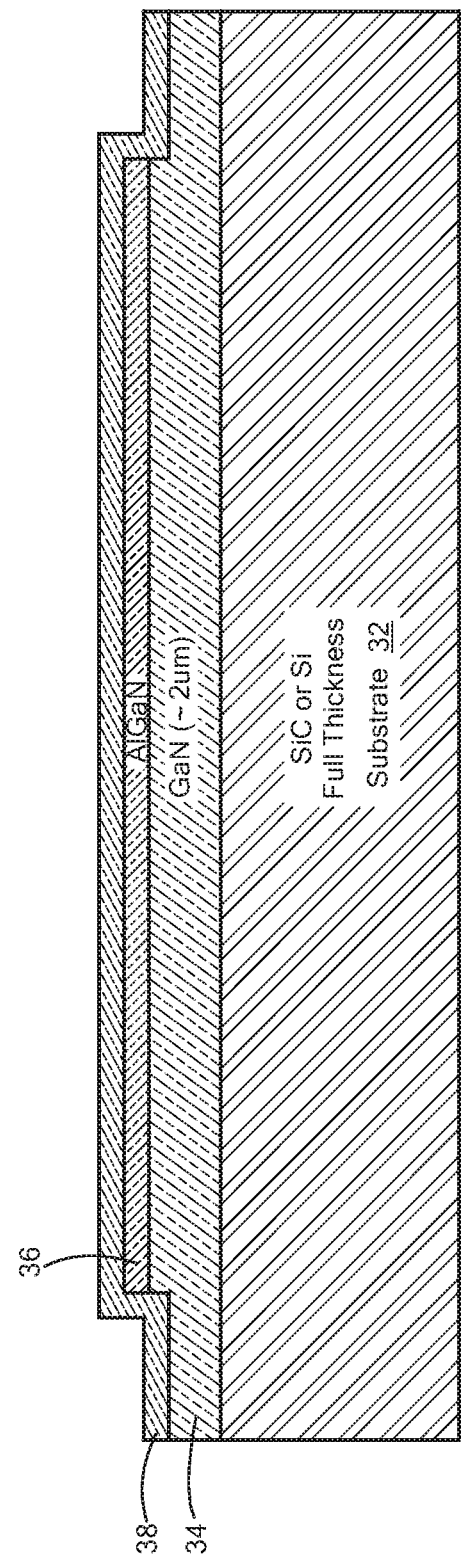
Figure 3C:
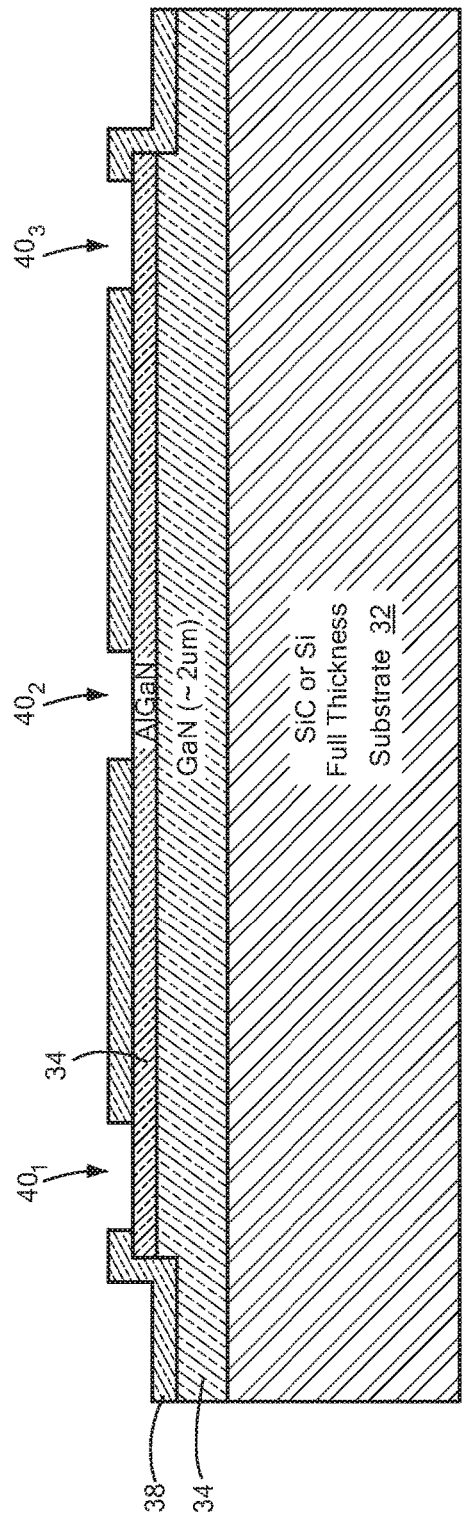
Figure 3D:
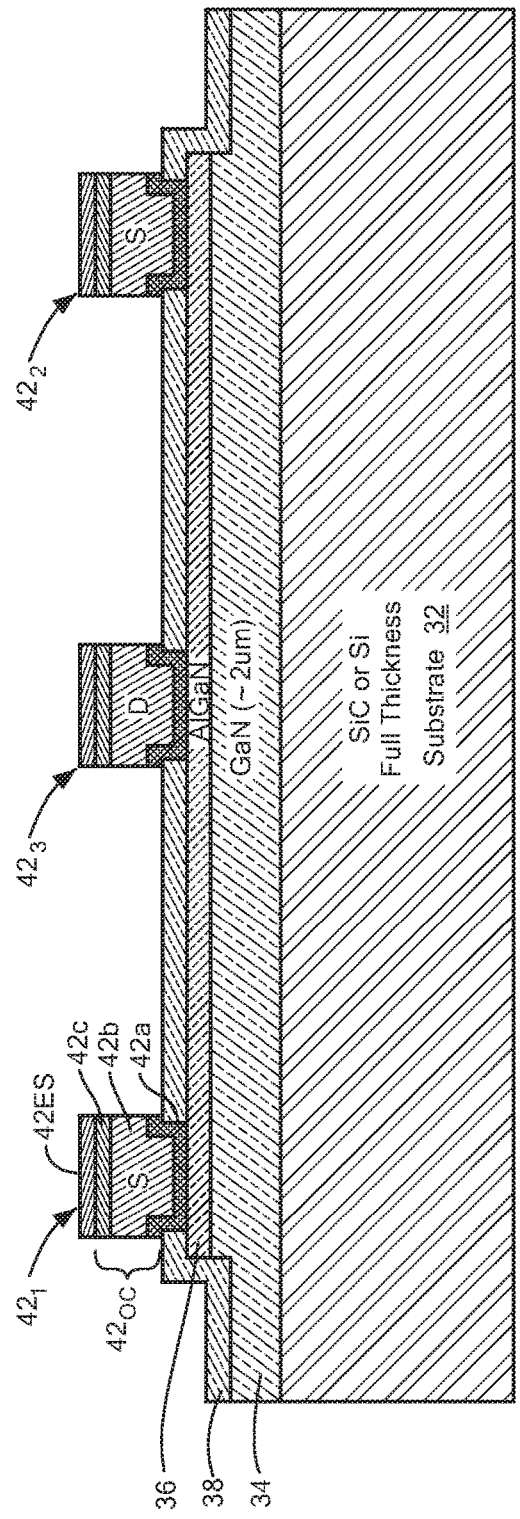

Still more particularly, the source electrode structure $22_1$, $22_2$ and drain electrode structure 20, have lower electrical contact structures $42_1$, $42_3$, and $42_2$, respectively, in Ohmic contact with the layer 36 and an upper electrode structures $54_1$, $54_3$, and $54_2$ respectively, here a copper Damascene structure having a copper layer 54b disposed within a diffusion barrier layer 54a, to be described in more detail below and shown for an exemplary one of the upper electrode structures $54_1$, $54_3$, and $54_2$; here upper electrode structures $54_1$ (FIG. 2B, 3D'). The gate electrode structures $14_1$, $14_2$ have a lower Schottky contact structure $14_{GC}$ in Schottky contact with the semiconductor layer 36 and an upper electrode structure $54_4$, $54_5$; here the upper electrode $54_4$, $54_5$ being the same copper Damascene structure used for the upper electrode structures $54_1$, $54_3$, $54_2$, respectively, of the source electrode structure $22_1$, drain electrode 20 structure, and the source electrode structure $22_2$. The field plates $23_1$, $23_2$ each here the same copper Damascene electrode structures $54_{1L}$, $54_{3L}$, $54_{2L}$, and $54_4$, $54_5$ used for the source electrode structures $22_1$, drain electrode structure 20, source electrode structures $22_2$, and gate electrode structures $14_1$, $14_2$. It is noted that the upper electrode structures $54_1$, $54_2$, $54_3$, and $54_4$, $54_5$ of the source electrodes $22_1$, $22_2$, drain electrode 20, and gate electrodes $14_1$, $14_2$ are electrically insulated one from another by the dielectric layers 38, 44, 48, 50, 56, and 58, to be described, as shown. It is further noted that the interconnecting members $27_1$, $27_2$ are also the same copper Damascene electrode structures as used for the source electrode structures $22_1$, $22_2$ drain electrode structure 20, and gate electrode structures $14_1$, $14_2$. It is also noted that each one of the field plates $23_1$, $23_2$ passes vertically (along the Z-axis as electrically conductive vias) through dielectric layer 58, 56, and partially into layer 50, terminating the predetermined distance $P_1$ from the upper surface of the dielectric layer 48 to thereby terminate the predetermined distance P from the upper surface of the Group III-N semiconductor layer 36, as described above; it being noted that the lower ends of the field plates 29L are: vertically separated from the semiconductor layer 36 by the thicknesses of the dielectric layers 38, 44 and 48 plus the remaining un-etched portions of the dielectric layer 50 located beneath openings 53 and above layer 48, as noted above, and are laterally spaced, and dielectrically insulated from, the gate electrode structures $14_1$, $14_2$ and drain electrode structure 20, as shown. The value of the predetermined distance P is typically is determined by a mixture of experimentation and testing and device level simulation to obtain optimum FET breakdown, dispersion, and gain characteristics.

Figure 3G:
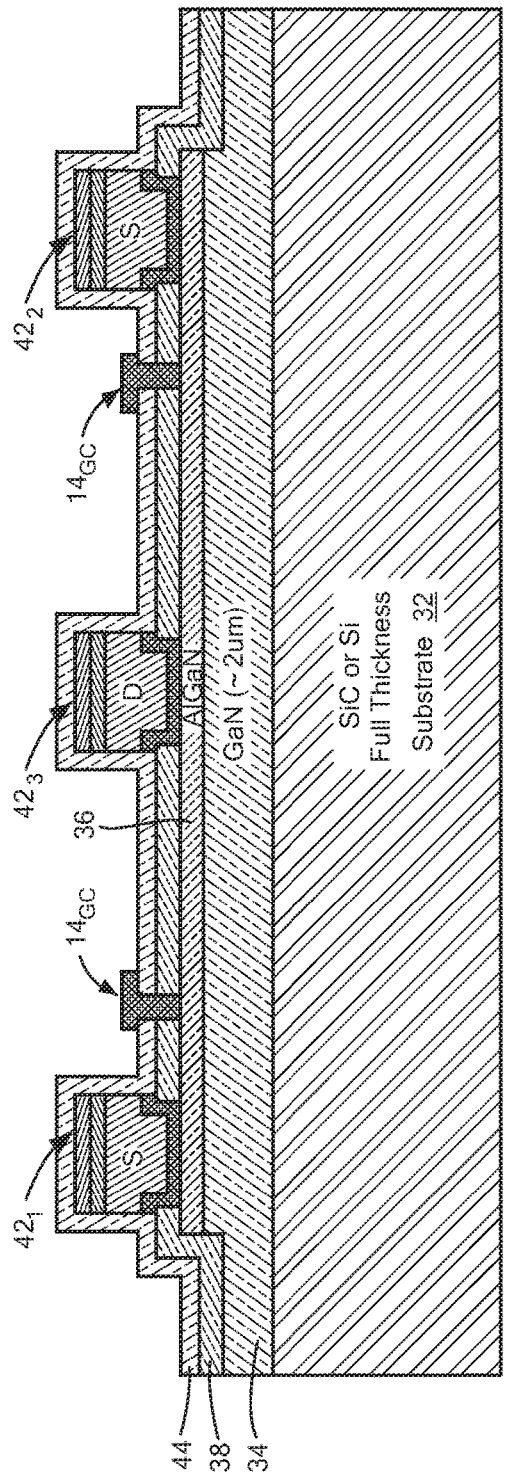
Figure 3H:
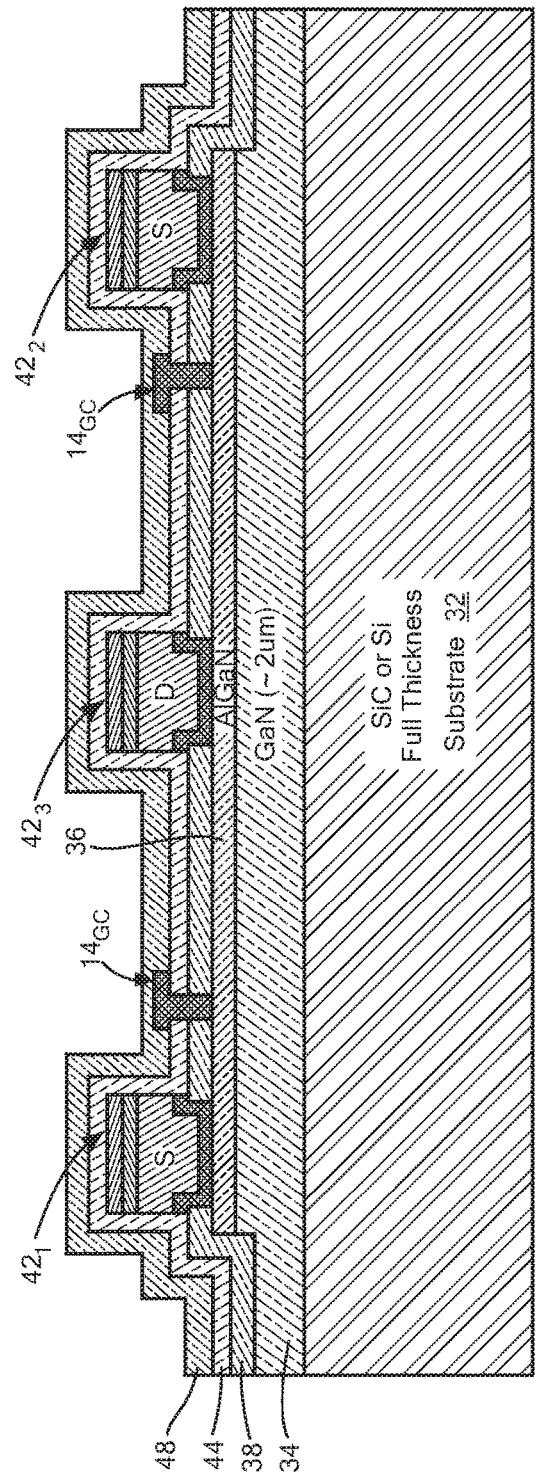
Figure 3I:
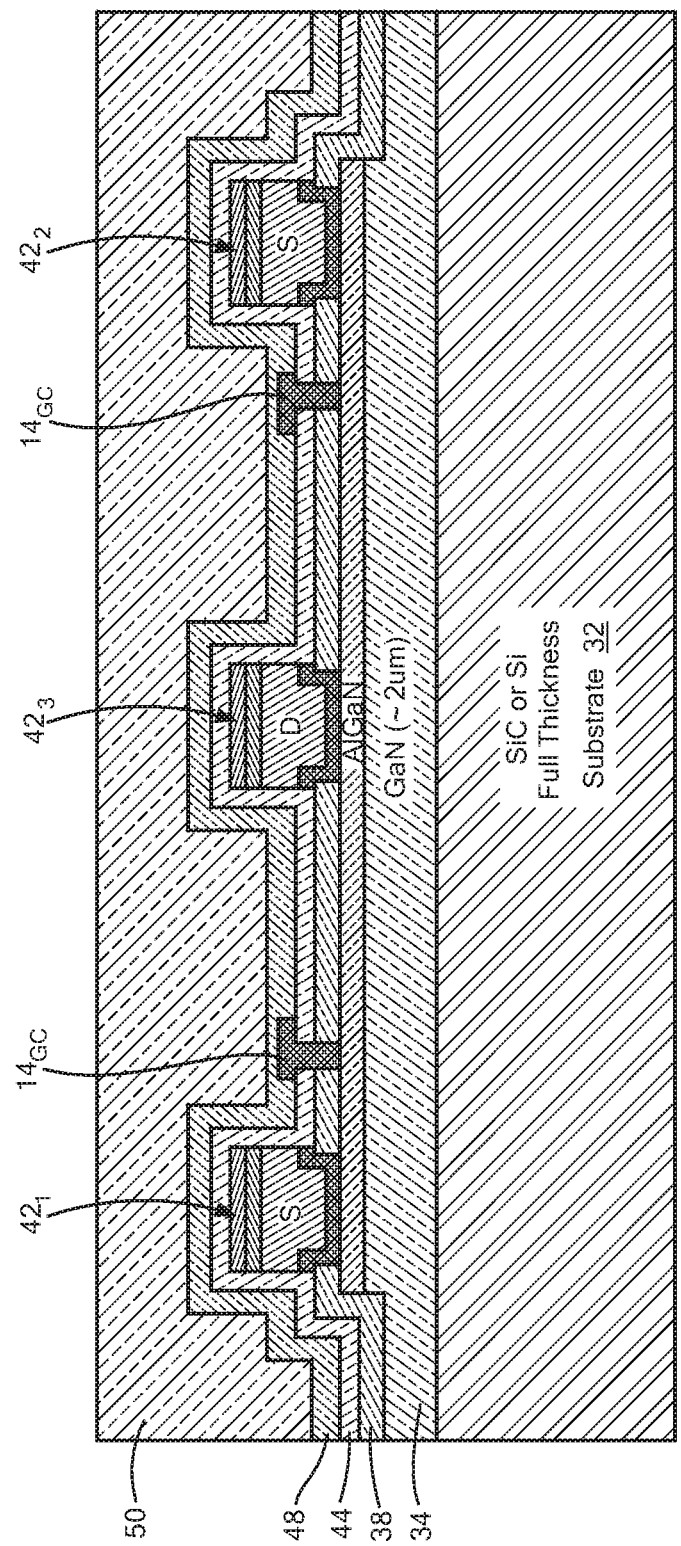
Figure 3J:
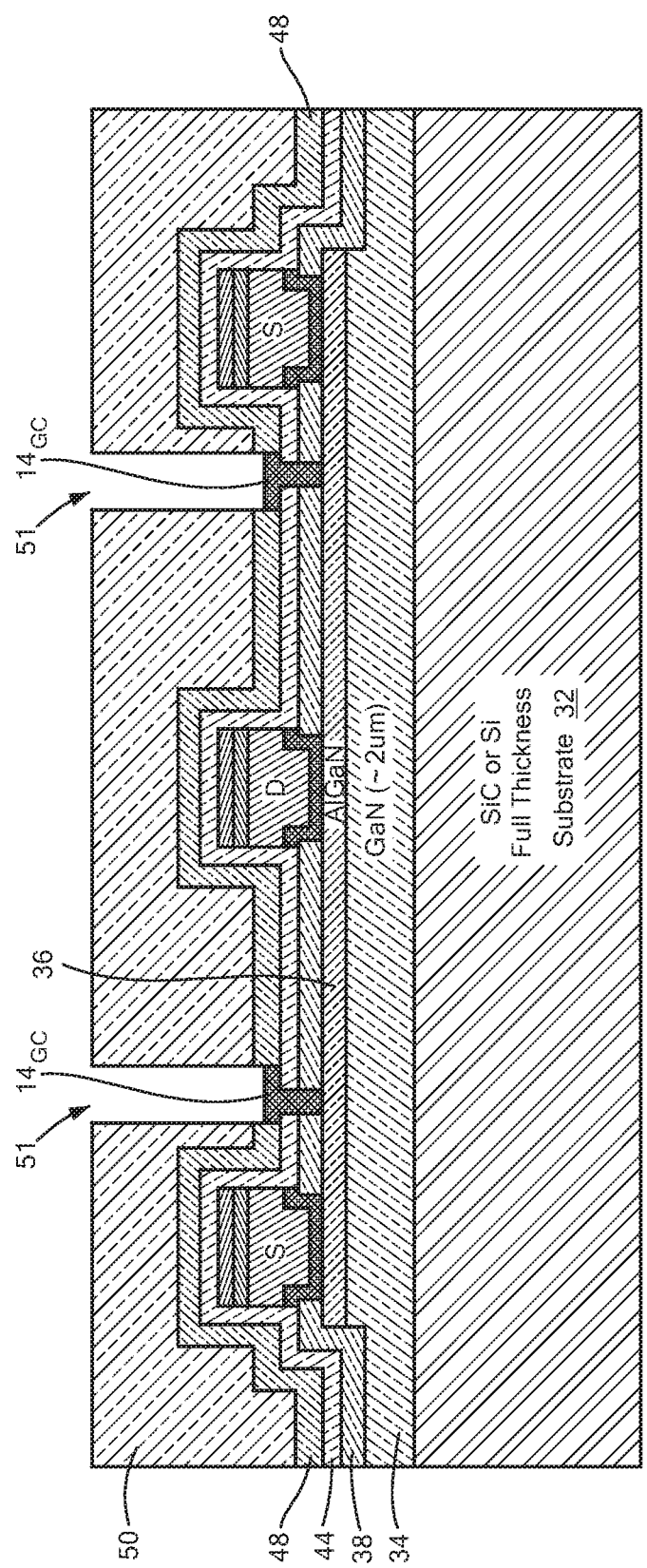
Figure 3K:
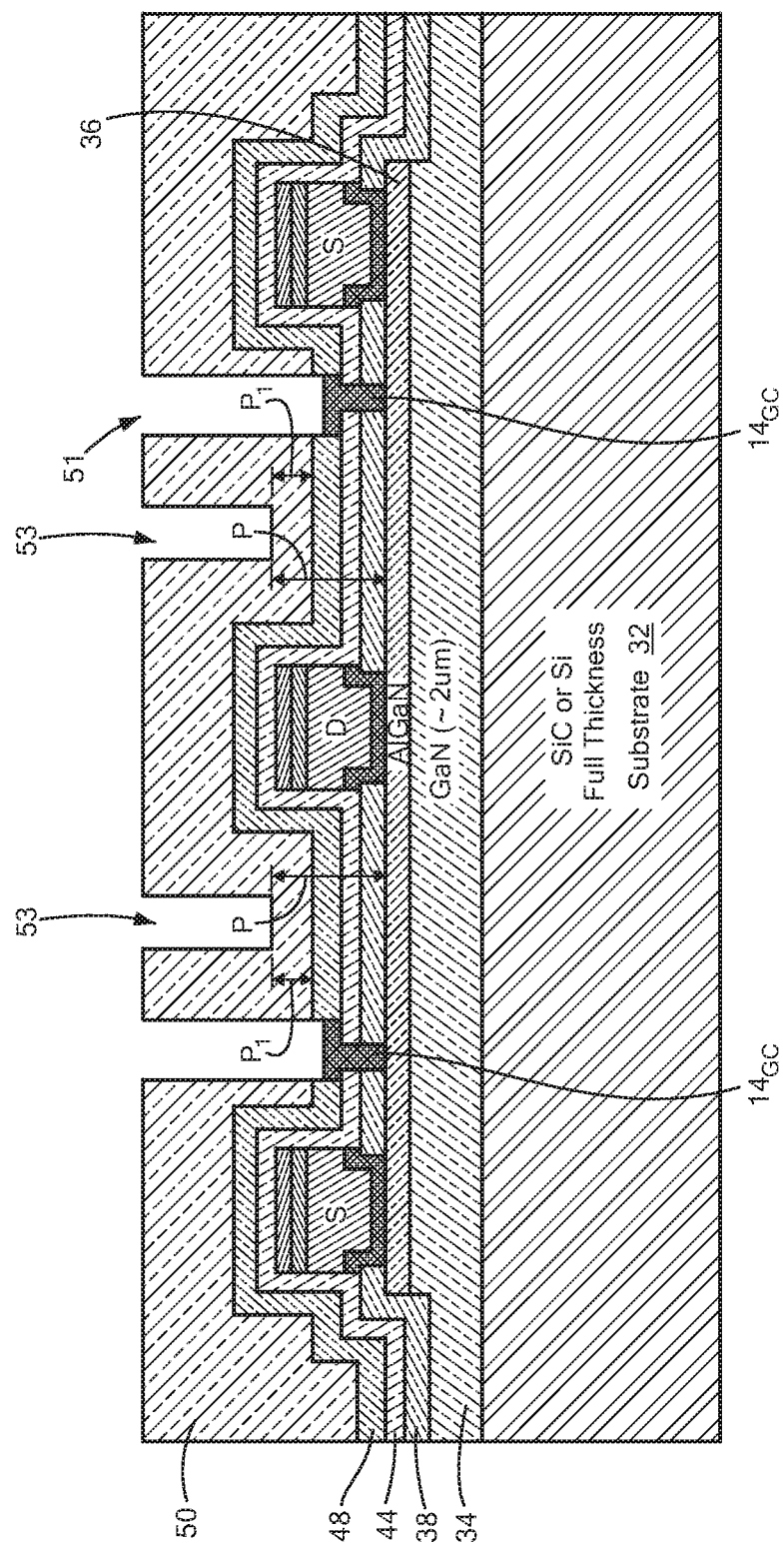
Figure 3L:
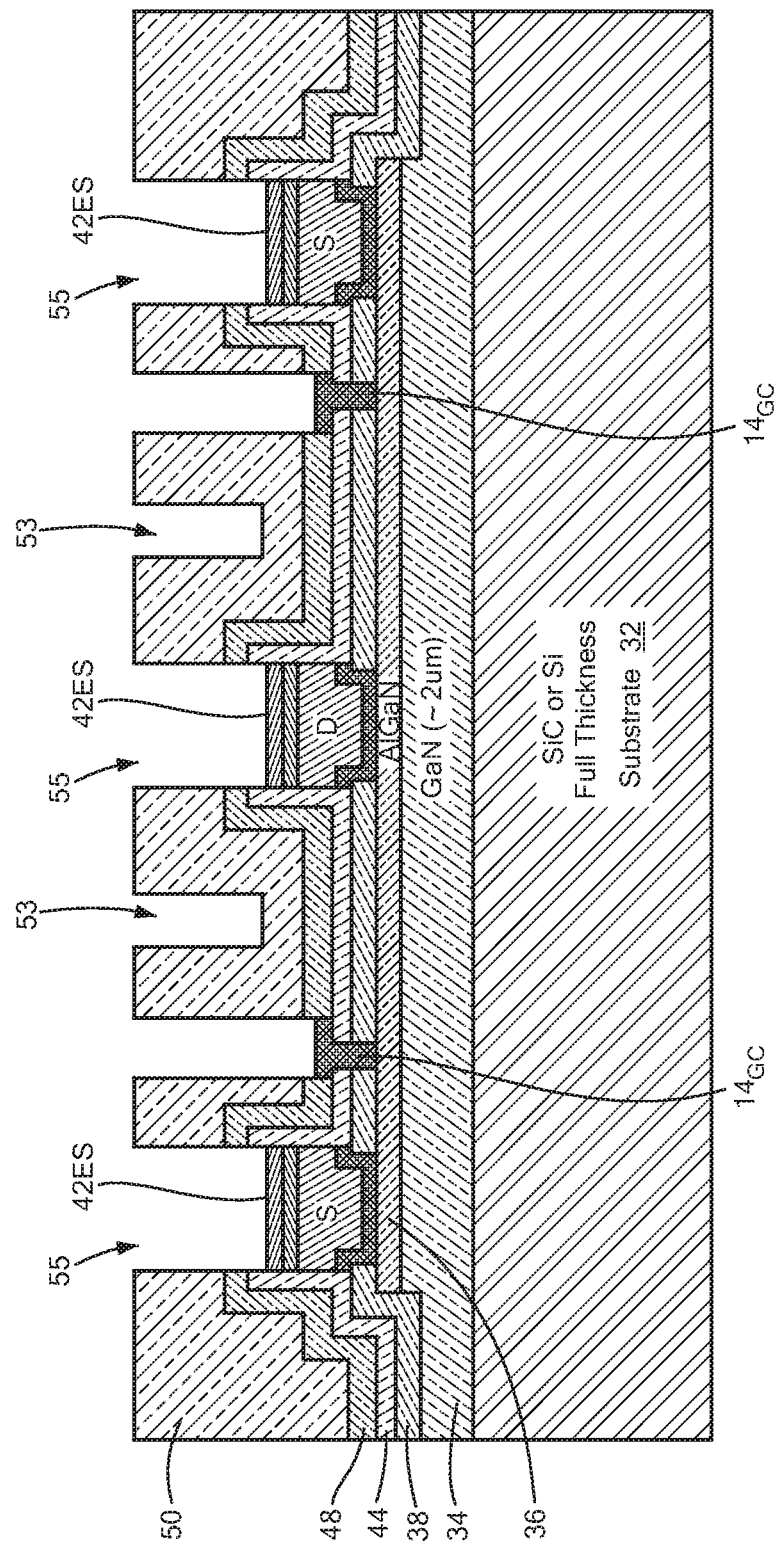
Figure 3M:
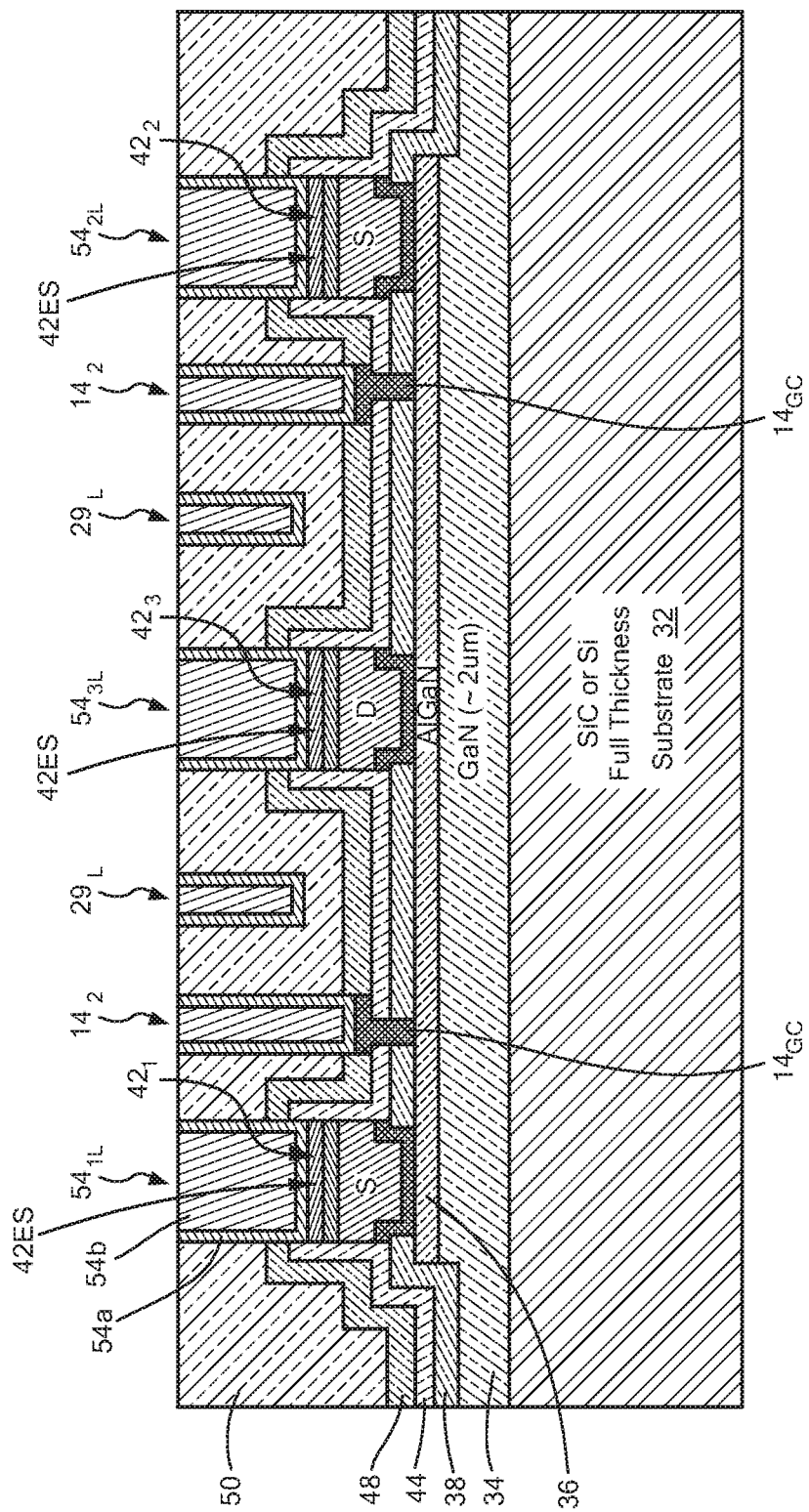
Figure 3N:
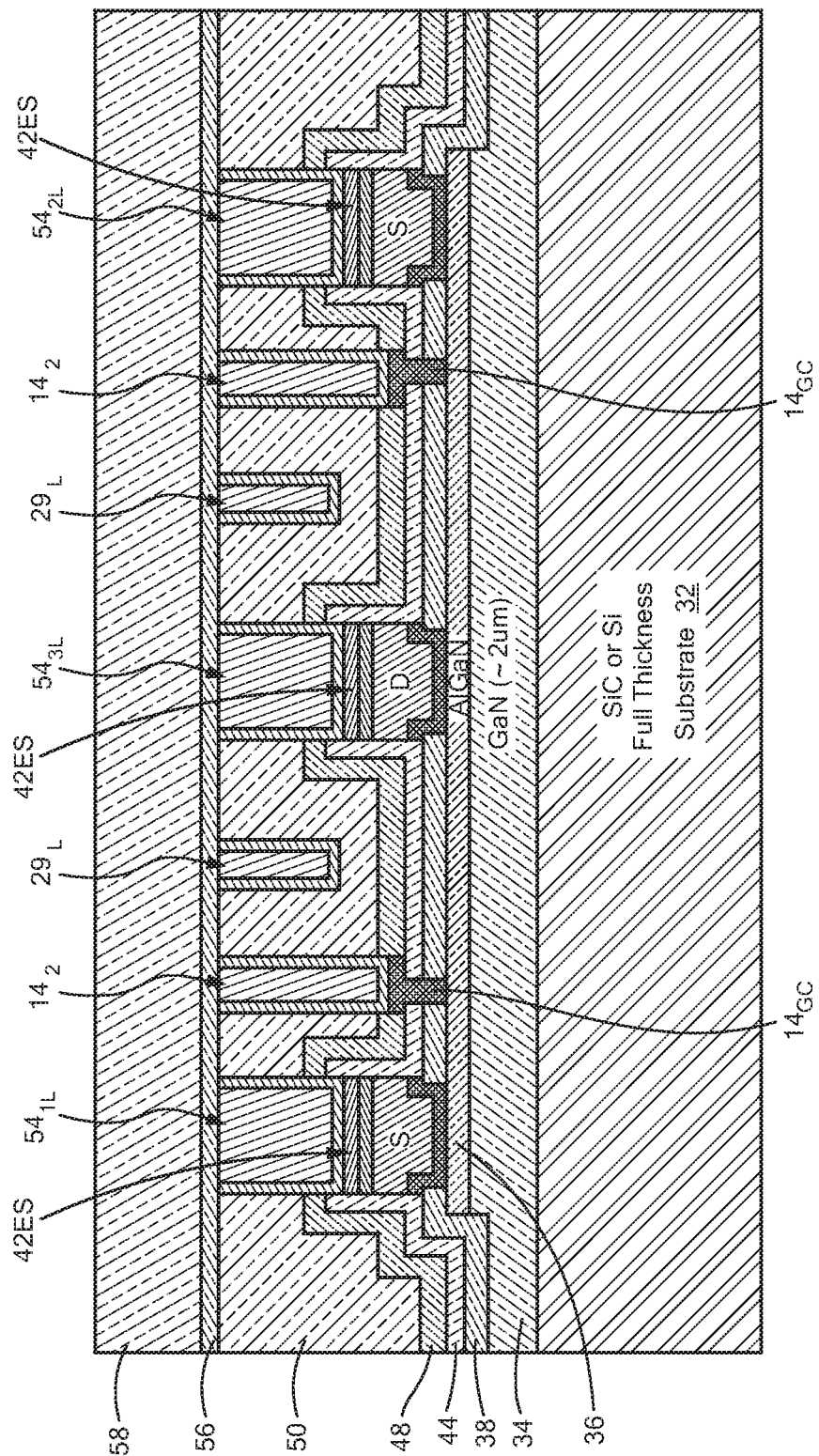
Figure 30:
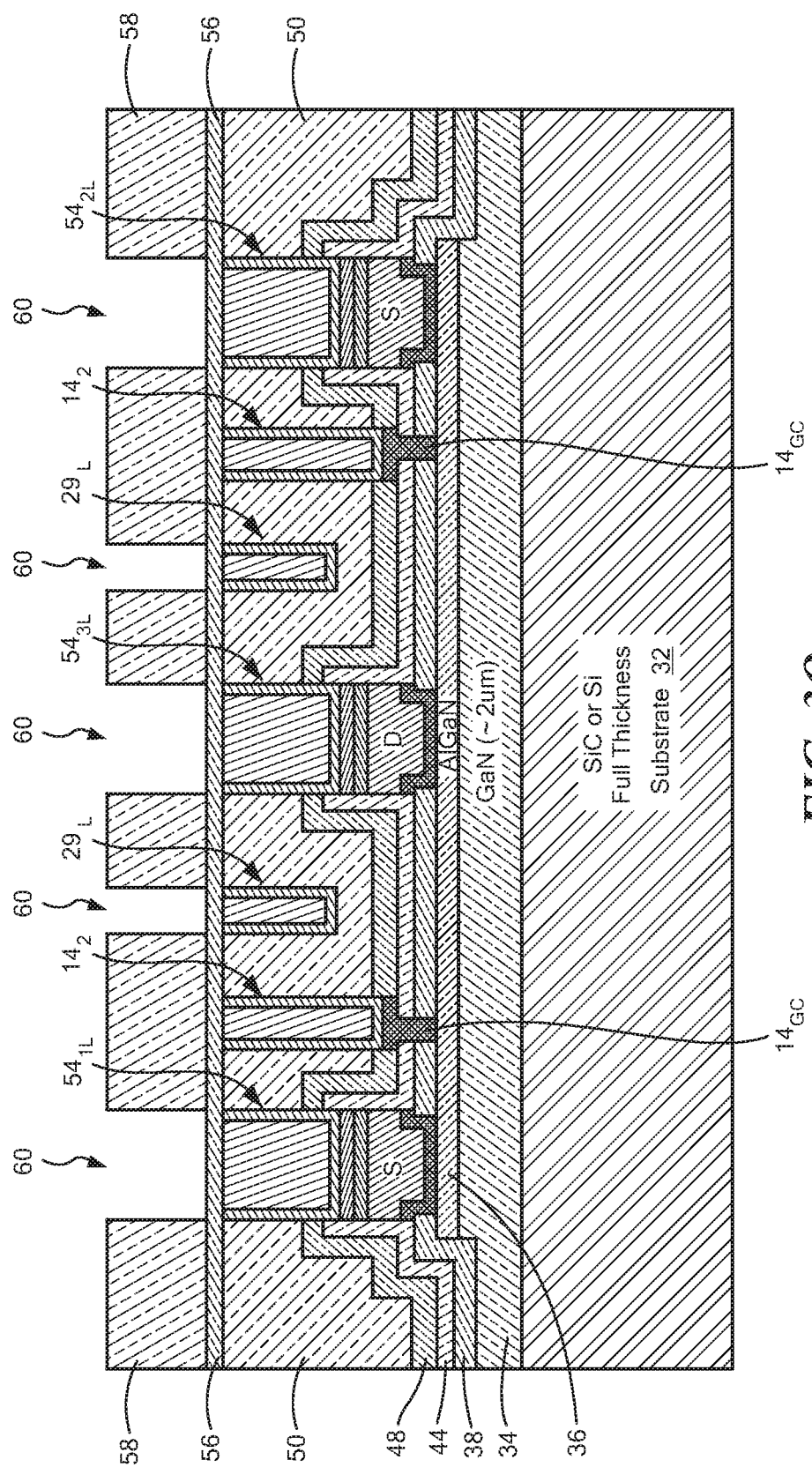
Figure 3P:
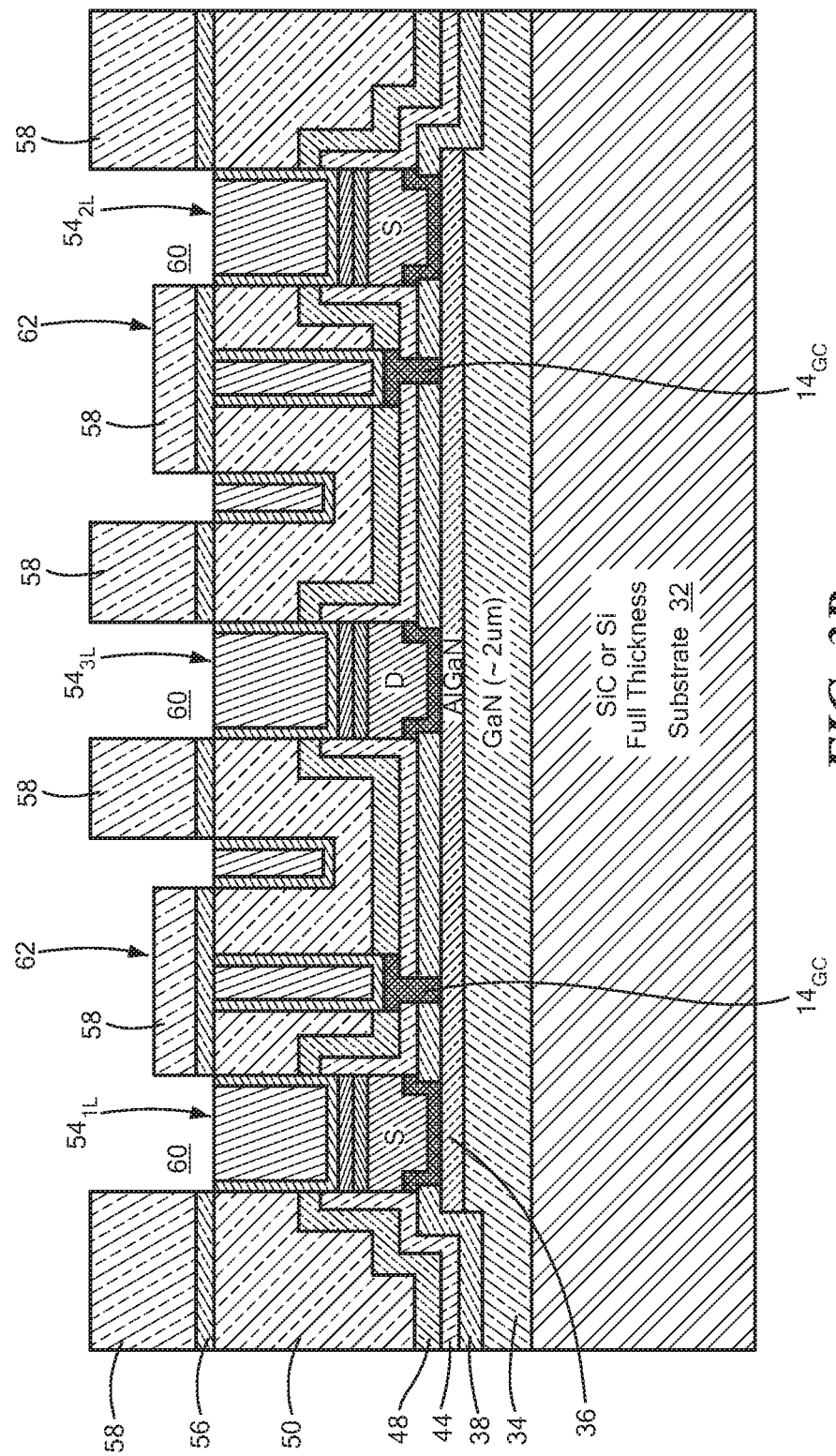
Figure 3Q:
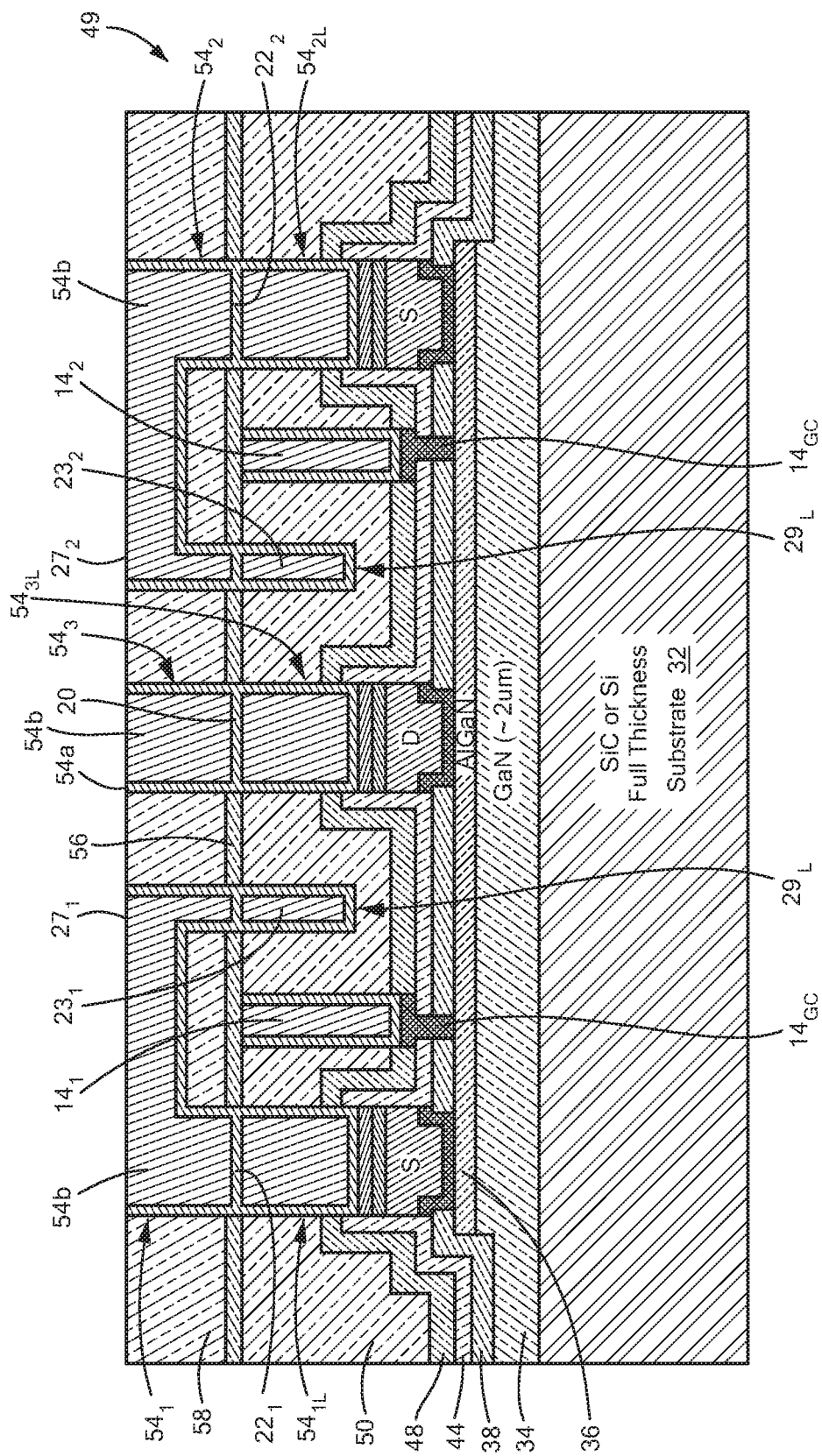
Figure 3R:
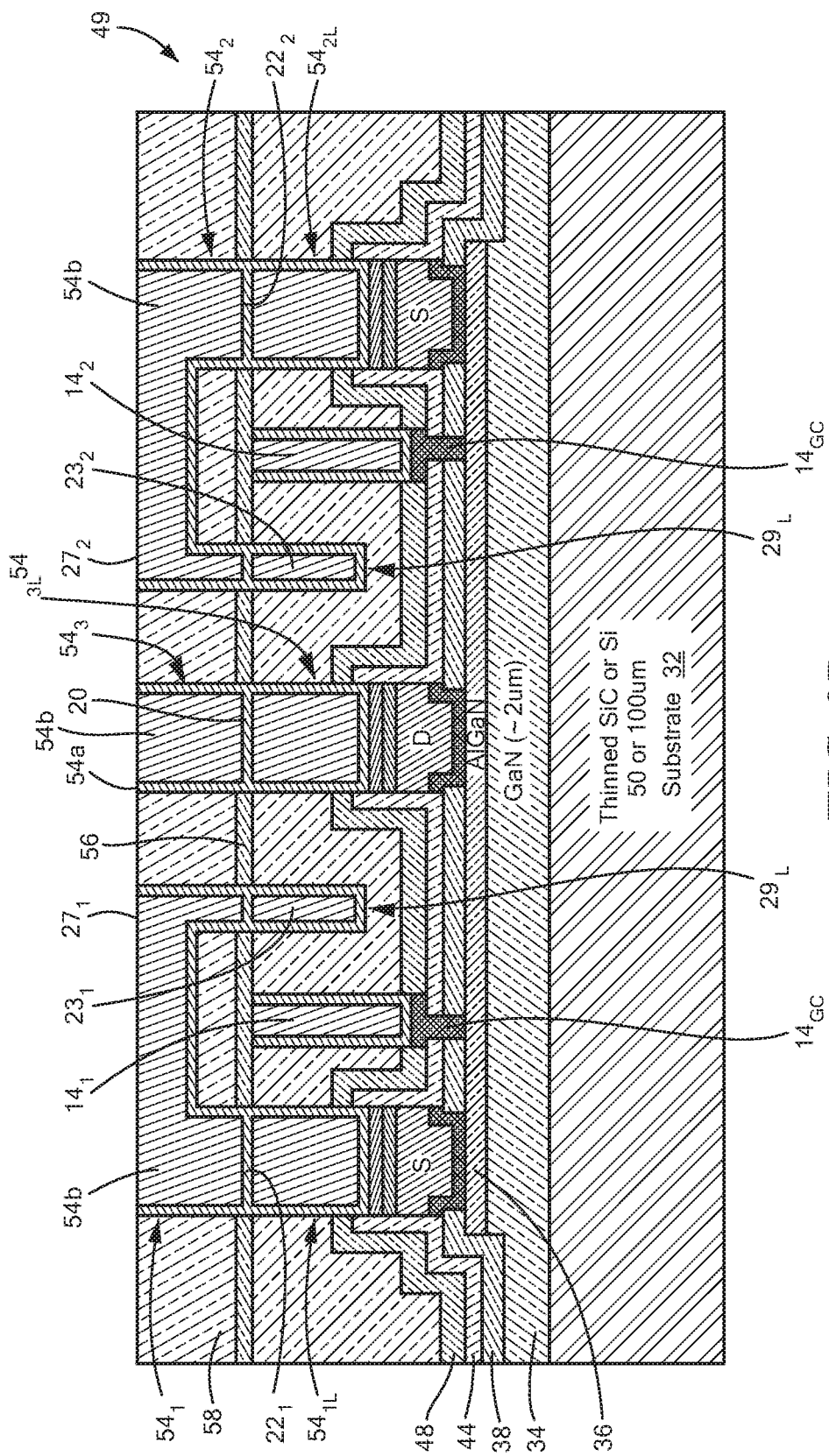
Figure 3S:
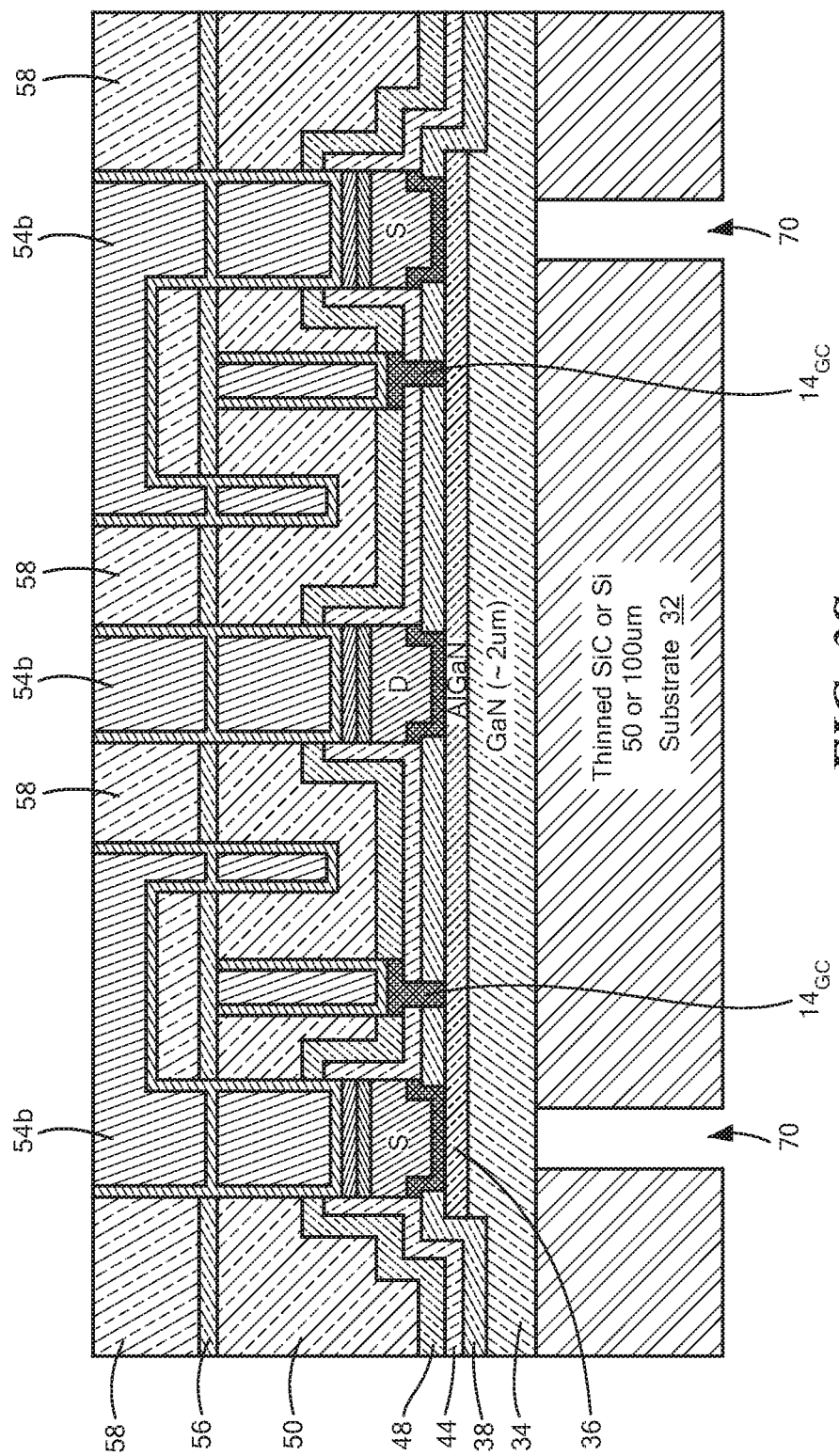
Figure 3T:
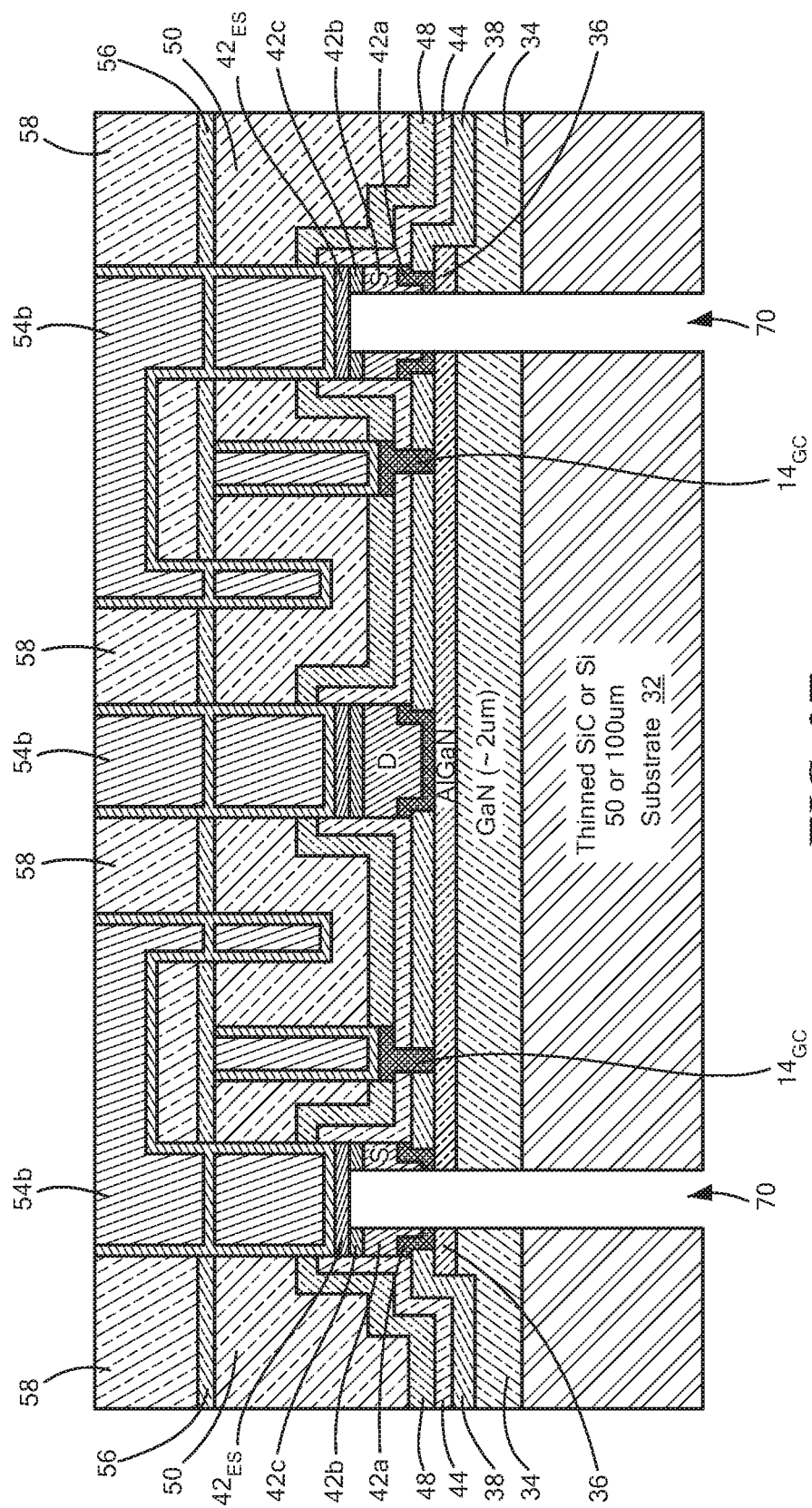

Referring now to FIG. 3A-3T, a process for forming the structure 10 will be described. Thus, referring first to FIG. 3A, the front or top side or surface (disposed in the X-Y plane (FIG. 2A) of the substrate 32 shown in FIG. 3A is coated with the passivation layer 38, here, for example, silicon nitride $SiN_x$ as shown in FIG. 3B, here, for example, having the predetermined thickness ($P_4$) is a range of 0 nm to 150 nm. Layer 38 is processed using conventional silicon (Si) foundry compatible (subtractive) lithographic-etching processing techniques to form windows or openings $40_1$-$40_3$ through selected portions of layer 38 exposing underlying portions of the AlGaN semiconductor layer 36, as shown in FIG. 3C, where electrical contact structures $42_1$-$42_3$, (FIG. 2B) are to be formed, as shown in FIG. 3D.

Figures 4A, 4B:
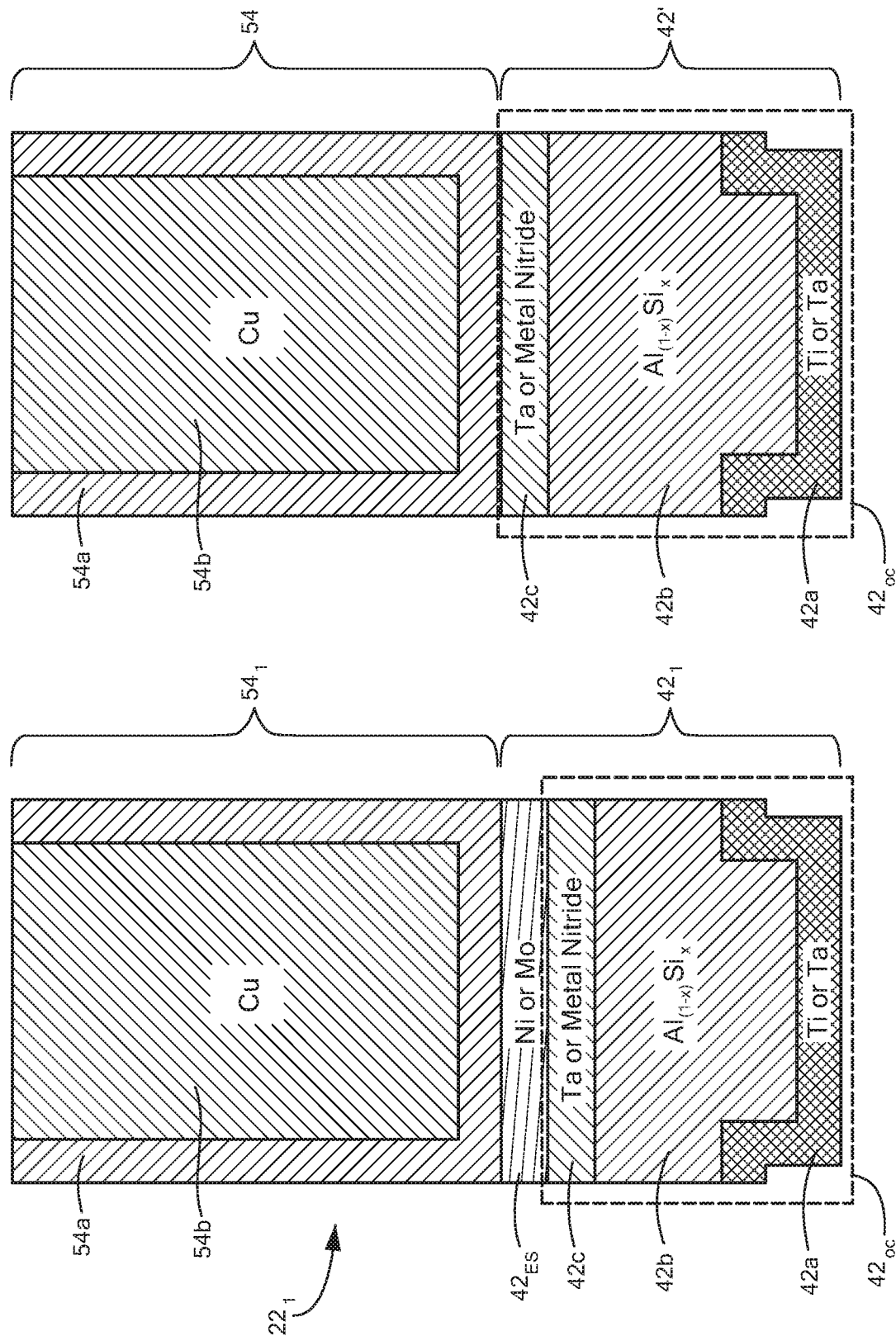
FIG. 4A is a diagrammatical cross-sectional view sketch of an exemplary of a plurality of source and drain electrode structures used in the FET of FIGS. 2A and 2B according to the disclosure.
FIG. 4B is a diagrammatical cross-sectional view sketch of an exemplary of a plurality of source and drain electrode structures used in the FET of FIGS. 2A and 2B according to another embodiment of the disclosure.

More particularly, as shown in FIG. 3D, the electrical contact structures $42_1$-$42_3$ (FIG. 2B) are identical in construction, an exemplary one thereof, here electrical contact structure $42_1$, is shown in more detail in FIG. 4A to include: (A) a gold-free Ohmic contact structure $42_{OC}$ having: a bottom layer 42a of titanium (Ti) or tantalum (Ta); a layer 42b for example, aluminum or Si doped aluminum ($Al_{1-x}Si_x$), where the Si doping, x, is typically ≤0.05) on the layer 42a; and a layer 42c, for example tantalum (Ta) or a metal nitride, here for example titanium nitride (TiN); (B) a gold-free, electrically conductive etch stop layer $42_{ES}$, here for example, nickel or molybdenum or platinum, disposed on the Ohmic contact structure $42_{OC}$. It is noted that an etch stop layer etches at a rate at less than one half (≤½) the rate of a particular etchant than the rate such etchant etches through material being etched prior to reaching the etch stop layer. The layers 42a, 42b, 42c and $42_{ES}$ are disposed over the surface of the structure shown in FIG. 3D and through the openings $40_1$-$40_3$. After deposition the layers 42a, 42b, and 42c of the Ohmic contact structures $42_{OC}$ are formed using conventional silicon (Si) foundry compatible subtractive patterning (lithography and etching) techniques (specifically the Ohmic contact structures $42_{OC}$ are dry etched using a chlorine-based dry etch chemistry). The electrical contact structures $42_1$ through $42_3$ are then formed in Ohmic contact with the Group III-N semiconductor layer 36, here the AlGaN layer during an anneal process to be described.

Here, for example, the electrical contact structures $42_1$ through $42_3$, is greater than 60 nm thick.

More particularly, each one of the Ohmic contact structures $42_{OC}$ is a tri-metal stack and includes: (a) the bottom layer 42a of Ti or Ta (which may be recessed into the upper surface portions of the Group III-N semiconductor layer 36 for structures $42_1$-$42_3$ by chlorine plasma-based dry etching into layer 36 prior to depositing layer 42a); (b) the aluminum-based layer 42b, here for example, aluminum or Si doped aluminum $Al_{1-x}Si_x$ layer 42b (where x is less than 1; here, x is typically ≤0.05); and (c) the top metal layer 42c, for example tantalum or a metal nitride layer 42c, here for example titanium nitride (TiN) on the aluminum-based layer 42b layer. A typical thickness for layer 42a and layer 42c is 5-30 nm, while the layer 42b can range from 50-350 nm depending on the metal layers chosen for the Ohmic contact three-layer structure $42_{OC}$ stack.

More particularly, in order to maintain optimum contact morphology and for contamination control, the anneal of the Ohmic contact structure $42_{OC}$ to form a semiconductor Ohmic contact is kept below the melting point of aluminum (≤660° C.). Such low temperature anneals typically take longer than five (≥5) minutes in a nitrogen ambient at a steady state temperature. More particularly, a first metal element of the metal to semiconductor Ohmic contact structure $42_{OC}$, here for example Ti or Ta layer 42a, is deposited directly on or disposed in contact with the Group III-N surface here for example $Al_xGa_{1-x}N$ layer 36 and forms a metal nitride by reacting with the Group V element nitrogen in the Group III-N material interface layer 36 during the temperature ramp from ambient temperature to a steady state anneal temperature during the Ohmic contact formation anneal (also herein referred to as Ohmic anneal) of the Ohmic contact structure $42_{OC}$. It is noted that the temperature ramp is typically ≤15° ° C./sec when a linear temperature ramp is used, however stepped temperature ramp profiles, and mixed step and linear ramp profiles all may be used in order to optimize first metal layer 42a interaction with the Group III-N surface layer 36 in the formation of the metal nitride. Next, a second lower resistance metal, here for example aluminum layer 42b, diffuses into the first metal (here layer 42a), the formed metal nitride, and into the surface of the Group III-N material (here layer 36) during the steady state anneal process of ≤660° C. for ≥5 minutes to provide the lowest resistance Ohmic contact. Finally, in order to maximize the amount of interaction between the first and second metals, here layers 42a and 42b of the metal to semiconductor Ohmic contact structure $42_{OC}$ that forms the Ohmic contact, and the Group III-N material layer 36 at ≤660° C. temperatures, it is necessary to prevent intermixing with any third metal layer (a metal nitride or metal, here layer 42c) disposed above the two layers (here layers 42a and 42b) and in contact with the upper layer of the two (here layer 42b).

Figures 10A, 10B:
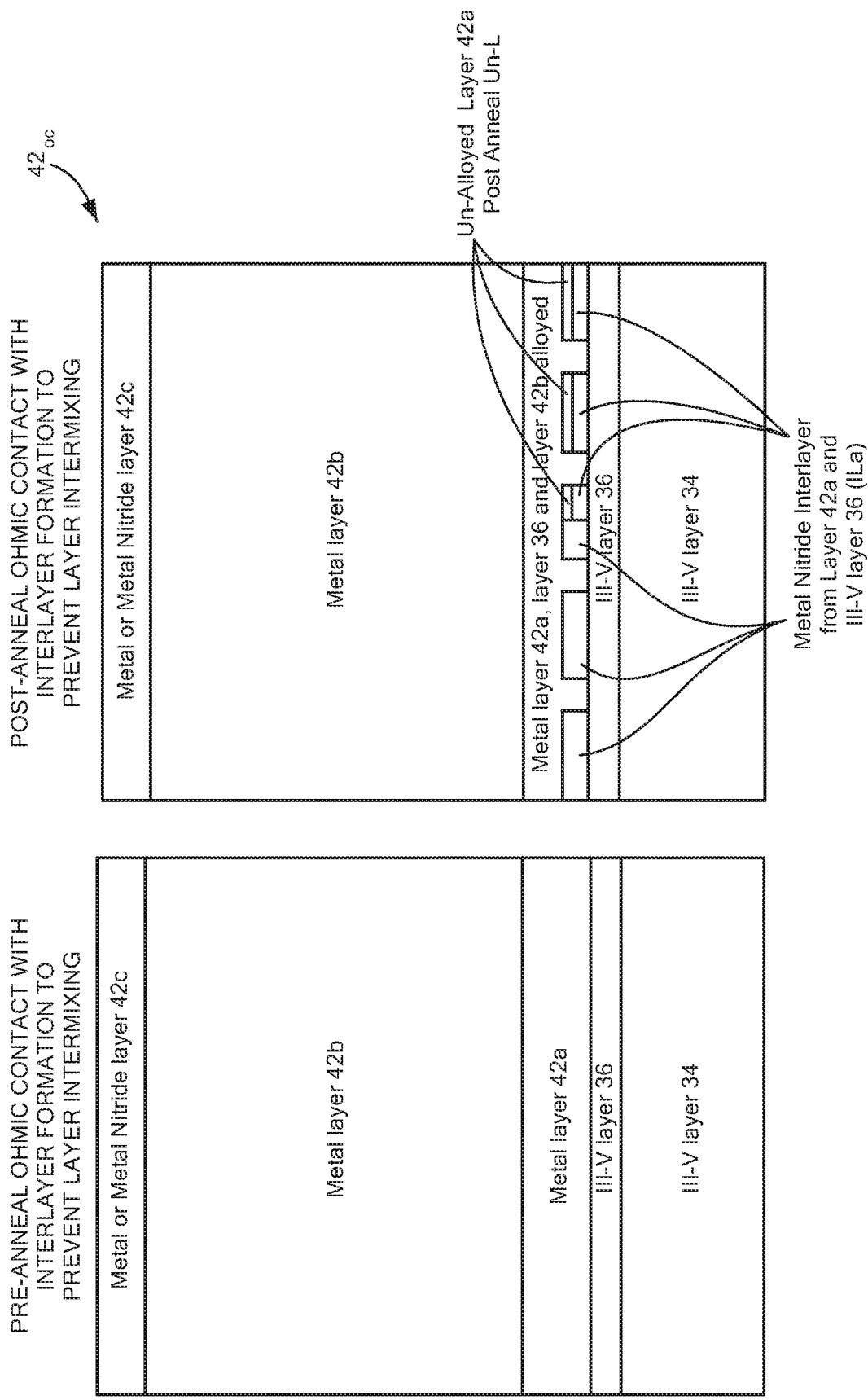
FIGS. 10A and 10B are diagrams useful in understanding forming a Ohmic contact structure for FET of FIGS. 2A and 2B at various stages in the fabrication thereof.

The prevention of intermixing of the first two layers of the Ohmic contact structure $42_{OC}$ (here layers 42a and 42b) with the third (here layer 42c) can be accomplished in several ways: It may be accomplished by depositing the Ohmic contact structure $42_{OC}$ and annealing the Ohmic contact structure $42_{OC}$ as a two-layer stack of the first and second metals (layers 42a and 42b) with a subsequent removal of any oxidized interface (by dry etching, wet etching, or in-situ dry sputter removal of the oxidized interface) prior to third metal deposition (here layer 42c); Alternately, when all three metals layers 42a, 42b and 42c of the Ohmic contact structure $42_{OC}$ are deposited prior to Ohmic anneal of the Ohmic contact structure $42_{OC}$, one of the following two methods may be used to form a low temperature (≤660° C.) Ohmic contact between the Ohmic contact structure $42_{OC}$ and the Group III-N semiconductor layer 36: In the first method (as shown in FIGS. 10A and 10B respectively for the pre and post anneal Ohmic contact structures), a metal nitride layer (such as TiN, or TaN, here layer 42c) of the Ohmic contact structure $42_{OC}$ is disposed in contact with the second aluminum layer (42b) and resists intermixing with layer 42b during the anneal at ≤660° C., and metal layer 42a is alloyed with Group III-N layer 36 and metal layer 42b with a metal nitride interlayer being formed between layer 42a and Group III-N layer 36 (it is noted that there may be some Un-alloyed portions of layer 42a after the anneal and that the metal nitride interlayer may be discontinuous) forming a post-anneal Ohmic contact structure $42_{OC}$; In the second method (not shown) a thin (~1-10 nm thick) partially oxidized second metal (here Aluminum layer 42b) or third metal (here Ta, TiN, or TaN layer 42c) or combination thereof, an is formed by reaction with oxygen that is either present in the gases used in, or intentionally introduced into, the deposition and/or anneal apparatus during the Ohmic contact structure $42_{OC}$ deposition process or Ohmic anneal of the Ohmic contact structure $42_{OC}$. This partially oxidized metal interlayer is formed between the second metal layer (here aluminum layer 42b) and the third metal or metal nitride layer (here Ta, TiN, or TaN layer 42c) or in contact with the second aluminum layer (42b) which resists intermixing during the anneal at ≤660° C. forming post anneal Ohmic contact structure $42_{OC}$. To put it another way, in the second method, the third metal layer 42c (a metal nitride or metal) is prevented from intermixing with layer 42b during annealing by the formation of an oxide interlayer during the metal deposition and/or the anneal process, and the oxide interlayer layer is formed between layer 42b and layer 42c, and metal layer 42a is alloyed with Group III-N Layer 36 and metal layer 42b, and metal nitride interlayer is formed between layer 42a and Group III—N layer 36 (it is noted that there may be some un-alloyed portions of layer 42a after the anneal). Thus, in one embodiment (FIGS. 12A and 12A') the intermixing is prevented by forming a partially oxidized interlayer ILb between the second and third metals of the Ohmic contact structure $42_{OC}$ during the electrical contact structure metal deposition and/or Ohmic anneal process. In the first method (FIGS. 10A and 10B), the intermixing is prevented by forming a metal or metal nitride layer as layer 42c.

Further optimization of the metal to semiconductor Ohmic contact resistance may also be achieved by adding a small amount of Silicon dopant to the Ohmic contact structure as noted above. Silicon may be deposited by multiple methods such as electron beam deposition and sputtering. Silicon can be deposited as a separate layer within the Ohmic contact structure $42_{OC}$ (by sputtering of a Silicon sputtering target or by electron beam deposition) or by mixing Silicon into another layer by co-sputtering pure targets (here for example silicon and aluminum) or by sputtering a Si doped target (here for example Si doped aluminum $Al_{1-x}Si_x$ layer 42b where the Si doping, x, is typically ≤0.05).

Thus, the Ohmic contact formation anneal at the low temperature may be summarized as follows: forming a metal nitride with a first metal of the Ohmic contact structure $42_{OC}$, here layer 42a, during a temperature ramping phase of an anneal process from ambient temperature to a steady state temperature; wherein a second metal of the electrical contact structure here layer 42b diffuses into the first metal and to an upper surface of the Group III-N semiconductor layer here layer 36 to reduce resistance of the Ohmic contact formed at the interface of Group III-N layer 36 and Ohmic contact structure $42_{OC}$; and wherein the first metal, in contact with the Group III-N semiconductor layer 36, and the second metal of the Ohmic contact layer 42b are prevented from intermixing with a third metal (or metal nitride) of the Ohmic contact layer 42c during the Ohmic anneal process; and wherein the first metal and the second metal and third metal (metal nitride or metal) are maintained below their melting points during the Ohmic contact formation anneal process. The prevention of intermixing of the first two metals (layers 42a and 42b) with the third metal (layer 42c) indirectly enhances the interaction of the first two metals with the Group II-N interface at low temperatures, thereby facilitating lower contact resistance. After the anneal process described above, the electrically conductive etch stop layer $42_{ES}$, here for example, nickel, molybdenum or platinum is disposed on layer 42c, as shown in FIG. 3B.

Referring now to FIG. 3E, the surface of the structure shown in FIG. 3D is coated with the dielectric layer 44, here also $SiN_x$, as shown, having the predetermined thickness ($P_3$), here, for example, a thickness in a range of 0 nm to 150 nm.

Referring now to FIG. 3F, openings or windows 46 are formed in layers 44 and 38, as shown using any conventional silicon (Si) foundry compatible (subtractive) lithography and etch processing techniques to expose portion of the Group III-N semiconductor layer 36 where the finger-like, gamma-shaped, gate electrodes $14_1$, $14_2$ are to be formed in Schottky contact with the Group III-N semiconductor layer 36, here the AlGaN layer.

Figures 5A, 5B:
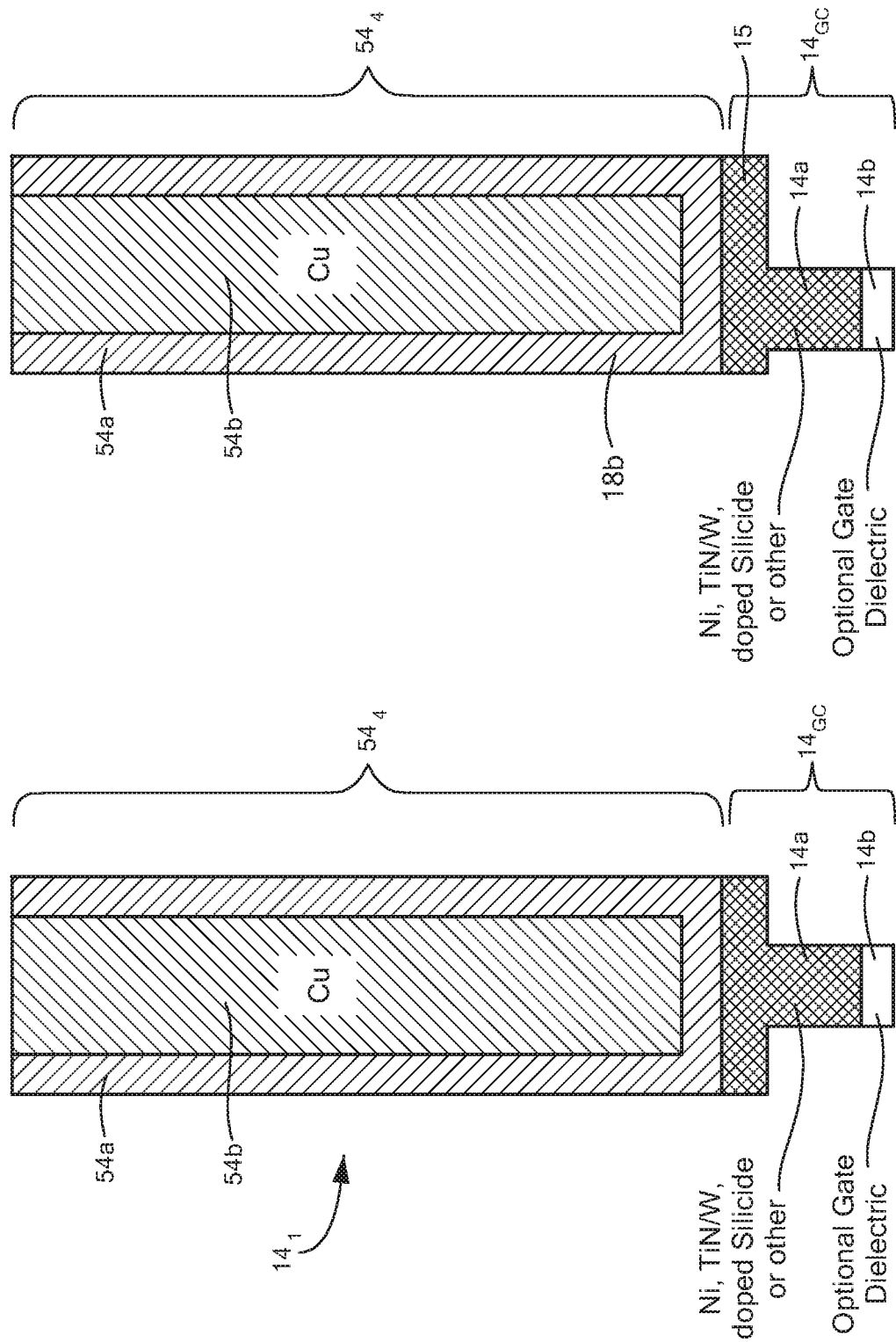
FIG. 5A is a diagrammatical cross-sectional view sketch of an exemplary of a plurality of gate electrode structures used in the FET of FIGS. 2A and 2B according to the disclosure.
FIG. 5B is a diagrammatical cross-sectional view sketch of an exemplary of a plurality of gate electrode structures used in the FET of FIGS. 2A and 2B according to another embodiment of the disclosure.

Referring now to FIG. 3G, the Schottky contact structure $14_{GC}$ portions of the finger-like gate electrode structures $14_1$-$14_2$ (FIGS. 2A and 2B), are formed through the openings or windows 46 using silicon (Si) foundry compatible lithography and etch processes, as shown. More particularly, and each one of the gate electrode structures $14_1$-$14_2$ is identical in construction, an exemplary one thereof, here gate electrode structures $14_1$, is shown in detail in FIG. 5A to include: (A) gate electrical contact structure $14_{GC}$ having a gate metal layer 14a, here a single material or plurality of materials for example nickel (Ni), titanium nitride (TiN), nickel/tantalum nitride (Ni/TaN), nickel/tantalum (Ni/Ta), nickel/tantalum/tantalum nitride (Ni/Ta/TaN), nickel/molybdenum, (Ni/Mo), titanium nitride/tungsten (TiN/W), or doped silicide in Schottky contact with the AlGaN semiconductor layer 36; and (B) gold-free electrode contact, here a copper Damascene electrode contact, to be described in connection with FIGS. 3J-3M. The gate metal layer 14a, formed using conventional silicon (Si) foundry compatible, subtractive patterning techniques, here is a Schottky contact metal that forms the Schottky contact with the Group III-N semiconductor layer 36; it is noted that the gate electrical contact structure 14c may have a thin (typically ~2-10 nm) dielectric layer 14b, for example aluminum oxide ($Al_2O_3$), disposed between the gate metal layer 14a and the Group III-N semiconductor layer 36, as indicated in FIG. 5A to form an metal insulated gate HEMT (MISHEMT). It should be noted that the gate metal layer 14a may be T-shaped, as shown, or gamma-shaped (Γ-shaped), as shown in FIG. 5B to form a gate connected field plate structure having an overhang portion 15 pointing in the direction of the adjacent drain electrode structure.

It is noted that the dry etches for the metals or metal nitrides comprising Schottky gate metal layer 14a will typically be chlorine-based (to etch, for example, Ni and TiN) or fluorine-based (to etch, for example, Mo, TiN, W, Ta, and TaN) or a combination thereof (to etch for example for TiN, W, Ta, and TaN). However, when Ni is used in Schottky gate metal layer 14a it can be quite difficult to dry etch due to lack of volatile etch byproducts. Therefore, nickel dry etches, here for example chlorine ($Cl_2$) and argon (Ar) gas mixtures, are primarily physical etches (sputtering) and not chemical-based etches. Since, predominately physical dry etches have poor etch selectivity to underlying layers, dry etching a Ni including Schottky layer 14a may result in unacceptable over etch into passivation layer 38 in some circumstances here for example when the thickness of the Ni in Schottky gate metal layer 14a and the dielectric in passivation layer 38 are about the same. In such cases a sacrificial dielectric layer (not shown) here for example silicon dioxide ($SiO_2$) may need to be deposited between passivation layer 38 and the overhang portion 15 of the Schottky gate metal layer 14a.

An alternative method of etching a Schottky gate metal layer 14a comprised of Ni is to employ a dry etch for a top metal (here for example TaN, Ta, Mo or a combination thereof), if present, and a wet etch (here for example HF, $H_3PO_4$, $HNO_3$, or $H_2SO_4$-based or a combination thereof) for the Ni layer. It is important to choose the Ni wet etchant of Schottky metal layer 14a such that it is highly selective to the top metal layer (if used the bottom Schottky metal layer becomes 14a' and the top Schottky layer becomes 14a" as in the description of FIGS. 9A-9G below). Additionally, the unintended removal of the nickel underneath the masked Schottky gate metal layer 14a features (herein also referred to as undercut) should be minimized so that the gate dimensions resulting from the process are repeatable and that the gate functions as intended. As a result, as the total width of the feature size masked by Schottky metal layer 14a shrinks, the thickness of the nickel layer in Schottky gate metal layer 14a will shrink as well to minimize undercut. For feature sizes less than one micron ($\leq 1$ µm) as defined by Schottky gate metal 14a the thickness of the deposited Ni of Schottky contact gate metal layer 14a is here for example likely to be $\leq 100$ nm.

Figure 9A:
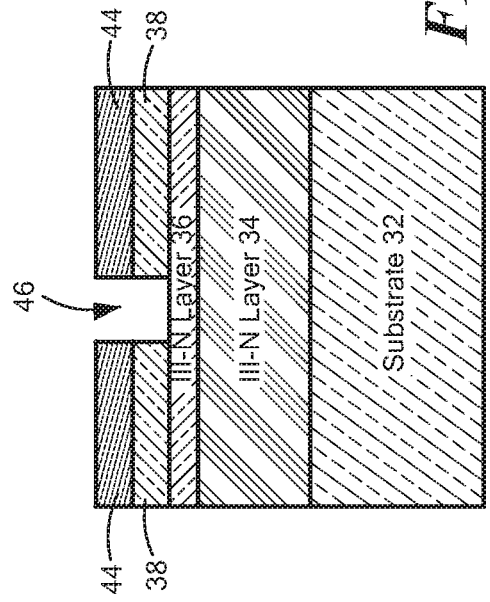
FIGS. 9A-9G are diagrammatical cross-sectional view sketches of a method of forming a Schottky gate metal layer for the FET of FIGS. 2A and 2B at various stages in the fabrication thereof.
Figure 9B:
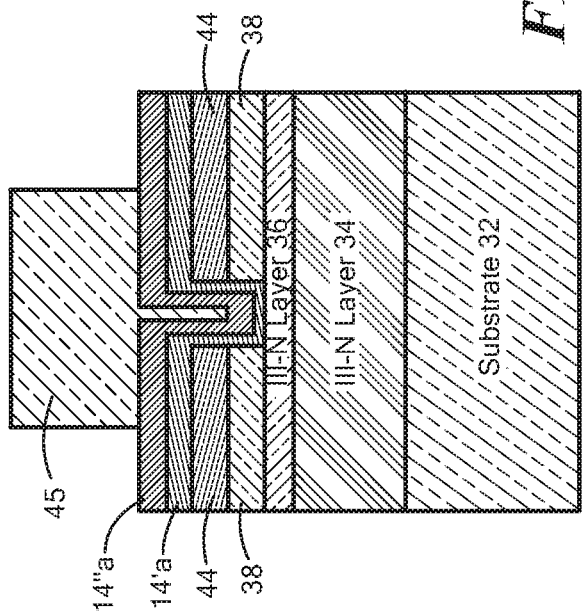
Figure 9C:
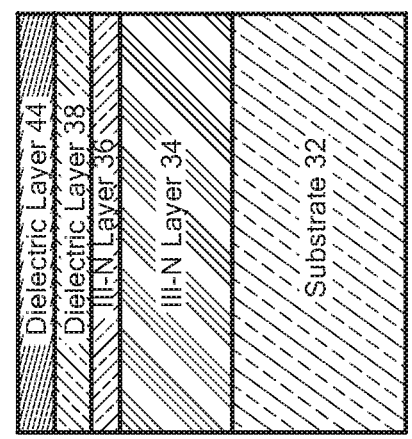

The formation of the gate electrode structures $14_1$ and $14_2$ are shown in more detail in connection with FIGS. 9A-9H. Thus, after forming dielectric layer 44, here also $SiN_x$, as shown in FIG. 9A and the openings or windows 46 in layers 44 and 38, as shown in FIG. 9B, as described above in connection with FIGS. 3E and 3F, a first gate metal or Schottky contact metal layer 14'a, here for example Ni or TiN is deposited over the dielectric layer 44 and through the window 46 onto the exposed portion of the AlGaN layer 36 as shown in FIG. 9C. Next, a second gate metal layer 14"a is deposited over the first gate metal or Schottky contact layer, here TaN, Ta, Mo, or W, for example, as shown in FIG. 9C.

Figure 9D:
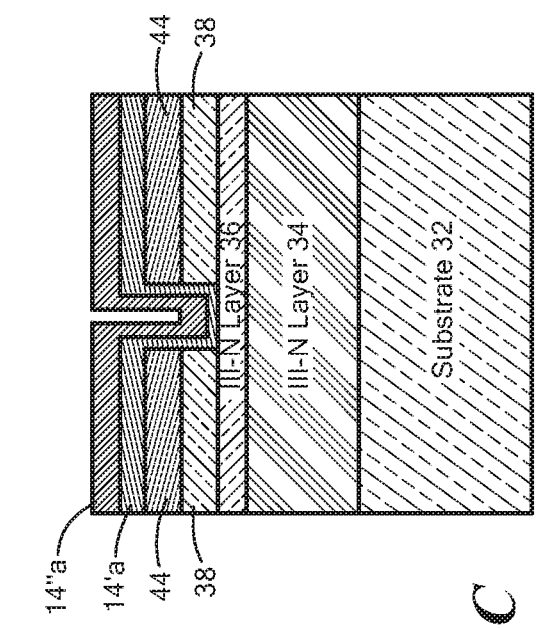
Figure 9E:
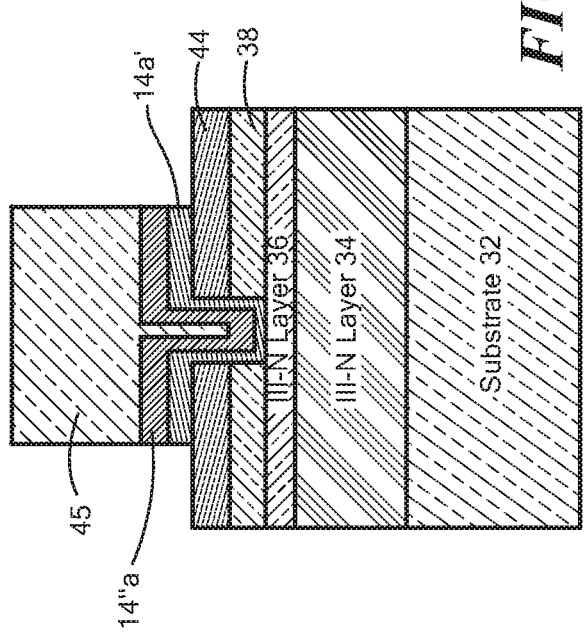
Figure 9F:
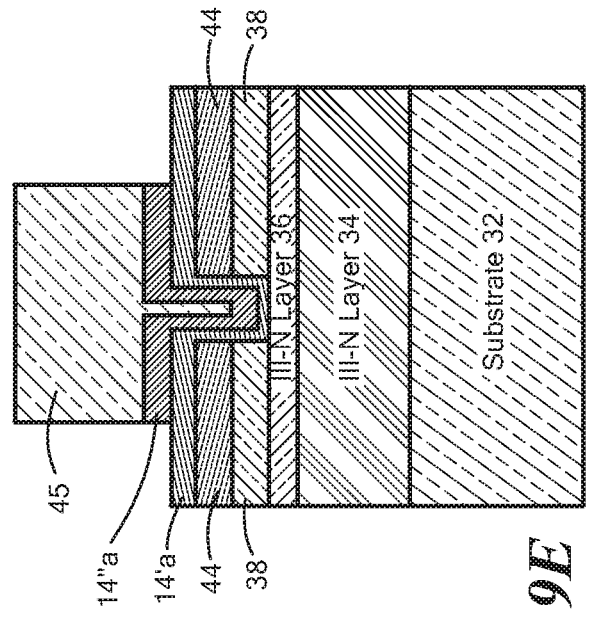
Figure 9G:
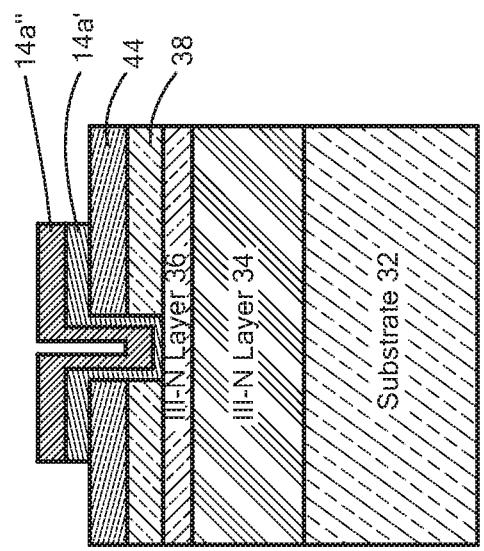

Next, either a photoresist or hard mask 45 is formed over a portion of the surface of the second gate contact metal 14"a in registration with the window 46, as shown in FIG. 9D. The portion of the second gate contact metal 14"a exposed by the mask is removed using a dry etch, as shown in FIG. 9E. Next, using the same mask 45, a dry or wet etch is used to remove the exposed portions of the first gate contact or Schottky contact metal 14'a, as shown in FIG. 9G. The mask 45 is then removed as shown in FIG. 9H.

After forming the Schottky contact structure $14_{GC}$ of the gate electrodes $14_1$-$14_2$ the dielectric layer 48, here SiNx, having the predetermined thickness ($P_2$), here, for example, a thickness in a range of 2 nm to 150 nm, is formed over the structure shown in FIG. 3H followed by dielectric layer 50, here $SiO_2$ as shown in FIG. 3I. The upper surface of layer 50 is masked and processed to form openings 51 (FIG. 3J) through the layers 50 and into the upper portion of layer 48 to expose the upper surface of the Schottky contact structure $14_{GC}$. Here the etchant is a fluorine based dry etch stops at or in the upper surface of layer 14a (FIG. 5A) of the Schottky contact structure $14_{GC}$ depending on metals and/or metal nitrides used for the Schottky contact structure $14_{GC}$.

The upper surface of layer 50 is masked and processed again to form openings 53 (FIG. 3K) through the upper portion of layer 50. More particularly, here the etchant is a fluorine based dry etch and is timed to stop at a predetermined distance Pt from the upper surface of the dielectric layer 48 to thereby terminate the predetermined distance P from the upper surface of the Group III-N semiconductor layer 36, as shown in FIG. 3K.

The upper surface of layer 50 is masked and processed still again to form openings vias 55 (FIG. 3L) through the layer 50. More particularly, here the etchant a fluorine based dry etch and stops at the etch stop layer 42ES, as shown in FIG. 3L.

Next, lower copper Damascene electrical interconnect structures section $54_{1L}$, $54_{2L}$, $54_{3L}$ (FIGS. 2B, 3M) of Damascene electrical interconnect structures section $54_1$, $54_2$, and $54_3$ are formed along with the gate electrode structures $14_1$ and $14_2$, and along with the lower sections $29_L$ of the field plates $23_1$ and $23_2$ are formed simultaneously in the vias 51, 53 and 55, as shown in FIG. 3M. Each one of the Damascene structures is identical in construction and includes an upper layer 54b of copper having the bottom and sides lined with an adhesion and copper diffusion barrier layer 54a, here for example, tantalum or tantalum nitride or a combination thereof, as shown in FIG. 3M.

The Damascene structures are formed by first sputtering a thin metal seed layer, not shown (typically Ta/Cu, Ta/TaN, or TaN/Cu and $\leq 1{,}000$ Angstroms), following by using that layer to facilitate copper plating into trenches (vias 51, 53 and 55) formed in the dielectric layer 50 (FIG. 3L). It is noted that the seed layer also functions as a copper diffusion barrier and as an adhesion layer to the dielectric layer 50. The excess copper overfill of the trenches is then removed with chemical mechanical polishing (CMP), which defines the metal interconnects by leaving only metal disposed in the trenches behind and forming a planarized surface as shown in FIG. 3M.

Next, a dielectric layer 56, here SiNx, followed by a dielectric layer 58, here $SiO_2$, are formed over the planarized surface as shown in FIG. 3N.

Next, openings 60 are formed through selected portions of the dielectric layer 58 disposed over the Damascene electrical interconnect structures section $54_{1L}$, $54_{2L}$, $54_{3L}$ and the Damascene, lower sections $29_L$ of the field plates $23_1$ and $23_2$ using lithographic etch processing, here using a fluorine based dry etch. It is noted that the etching stops at the dielectric layer 56 which serves as an etch stop layer, as shown in FIG. 3O.

Next upper, selected portions, of the dielectric layer 58 are removed using a lithographic, timed etching processing, here using a fluorine based dry etch to form recesses 62 in such selected portions of the dielectric layer 58, as shown in FIG. 3P.

Next, Damascene structures are formed in like manner to those formed as described in connection with FIG. 3M in openings 60 and recesses 62, as shown in FIG. 3Q. One of these structures is the field plate-source interconnect $27_1$, (FIG. 2B) that electrically interconnects source electrode $22_1$ (FIG. 2B) to the field plates $23_1$; another one of these structures is the field plate-source interconnect $27_2$, (FIG.

Figure 2C:
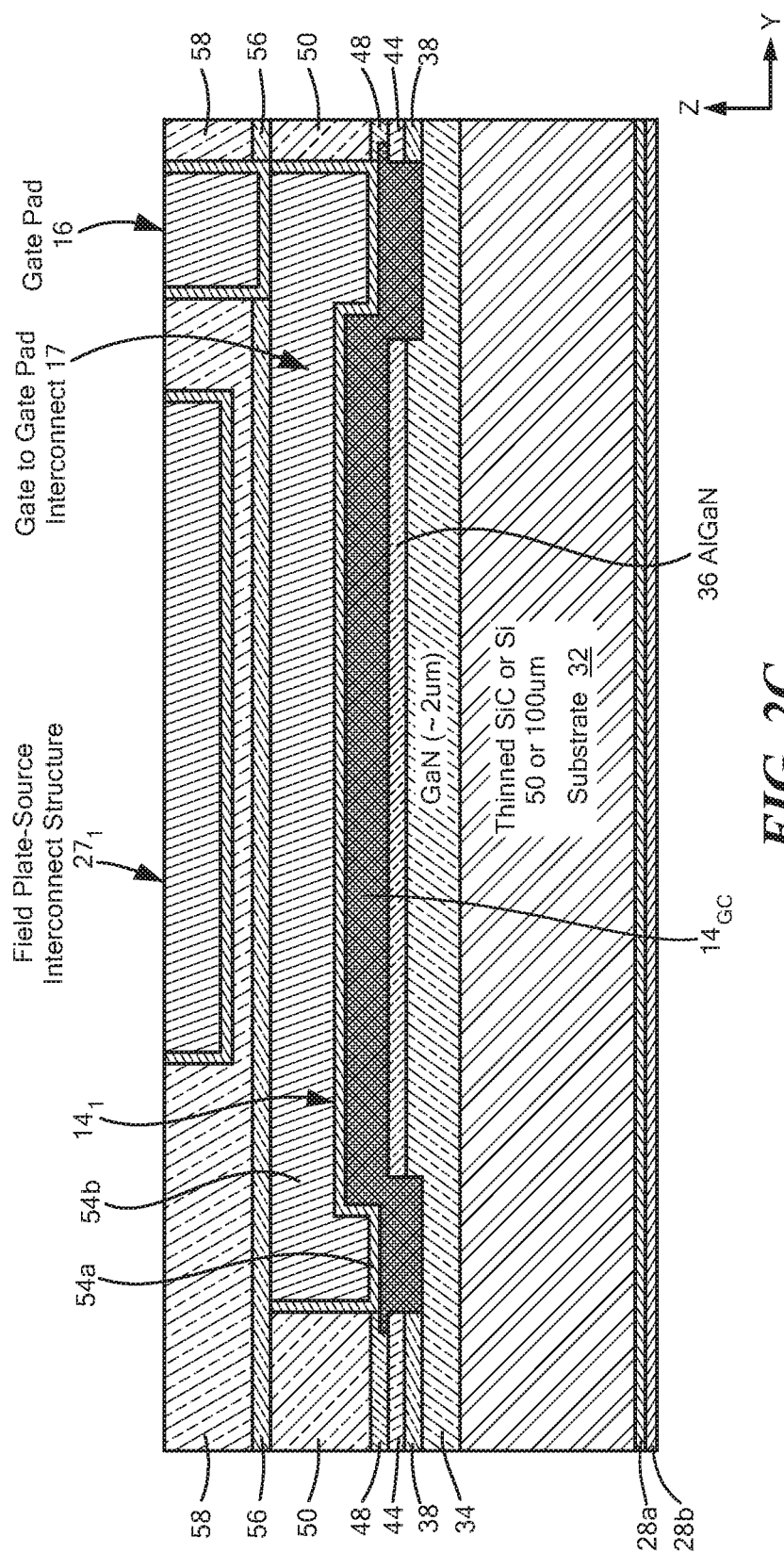
FIG. 2C is a diagrammatical cross-sectional view sketch of the FET of FIG. 2A, such cross-section being taken along line 2C-2C in FIG. 2A according to the disclosure.

2B) that electrically interconnects source electrode $22_2$ (FIG. 2B) to the field plate $23_2$; another one of these structures is the electrical interconnect structure section $54_{3L}$ for the drain electrode structure 20 shown in FIG. 2B; and still another one of the structures is the gate-gate pad interconnect 17 (FIG. 2C).

After the completion of front-side processing, and referring now to FIG. 3R, the back-side processing begins. More particularly the wafer is mounted face down on a temporary carrier, not shown, the wafer is then thinned, here for example to 50 or 100 microns. The exposed bottom surface of such structure is masked to expose portions of the bottom of the substrate 32 under the electrode contacts $54_1$ and $54_2$. Next, via holes 70 are formed in the exposed portions by etching from the bottom of the SiC or Si substrate 32 using a dry fluorine-based etch, here, for example sulfur hexafluoride ($SF_6$).

Next vias 70 are etched through the back surface of the thinned substrate 32 using lithographic-etching, here a fluorine based dry etch which etching stops at the GaN layer 34; GaN layer 34 serving as an etch stop layer, as shown in FIG. 3S.

Next the vias 70 are extended through the III-N layers 34 and 36, the Ohmic contact structure $42_{OC}$ (42a, 42b, 42c) of the electrical contact structures $42_1$ and $42_2$ (FIG. 4A) to the etch stop layer $42_{ES}$ of the electrical contact structures $42_1$ and $42_2$ (FIG. 4A) using lithographic-etch processing, where the etchant is a chlorine based dry etch, here for example a combination of boron tri-chloride ($BCl_3$) and chlorine ($Cl_2$), as shown in FIG. 3T.

Next, referring to FIG. 2B, the bottom of the structure of FIG. 3T has the ground plane conductor 26 and electrically conductive vias 26 bottom of substrate 32 and into via holes 70, here comprising copper as shown. Here, for example, the layer 28b is copper with an adhesion and copper diffusion barrier layer 28a, here for example, tantalum or tantalum nitride or a combination thereof (as shown in FIG. 2B). It should be understood that the conductive vias 26 and ground plane 24 can have alternate metals here, for example a gold (Au) layer 28b, and a titanium (Ti) or titanium/platinum (Ti/Pt) layer 28a. In this case, the back-side processing would be performed in an area where gold would not present any contamination problems.

Thus, here, in the embodiment described above in connection with FIGS. 3R through 3T and FIG. 2B, after front-side processing and back-side wafer thinning, a back-side via hole 70 is formed using chemical dry etching with a two-step etch process that terminates on the electrically conductive etch stop layer $42_{ES}$. In the first step of the via hole etch process, via holes are formed in exposed portions of the bottom of the SiC or Si substrate layer 32 using a dry fluorine-based etch for example, sulfur hexafluoride ($SF_6$). This fluorine-based etch stops selectively on Group III-N layer 34 such as gallium nitride (GaN) and aluminum nitride (AlN). In the second step, the bottom surface of the exposed Group III-N layer in the via hole 70 is exposed to a dry chlorine-based etch, for example a combination of boron tri-chloride ($BCl_3$) and chlorine ($Cl_2$). As previously discussed, the chlorine based etch connects the vias 70 to the electrical contact structures $42_1$ and $42_2$ (FIG. 4A).

Figure 6A:
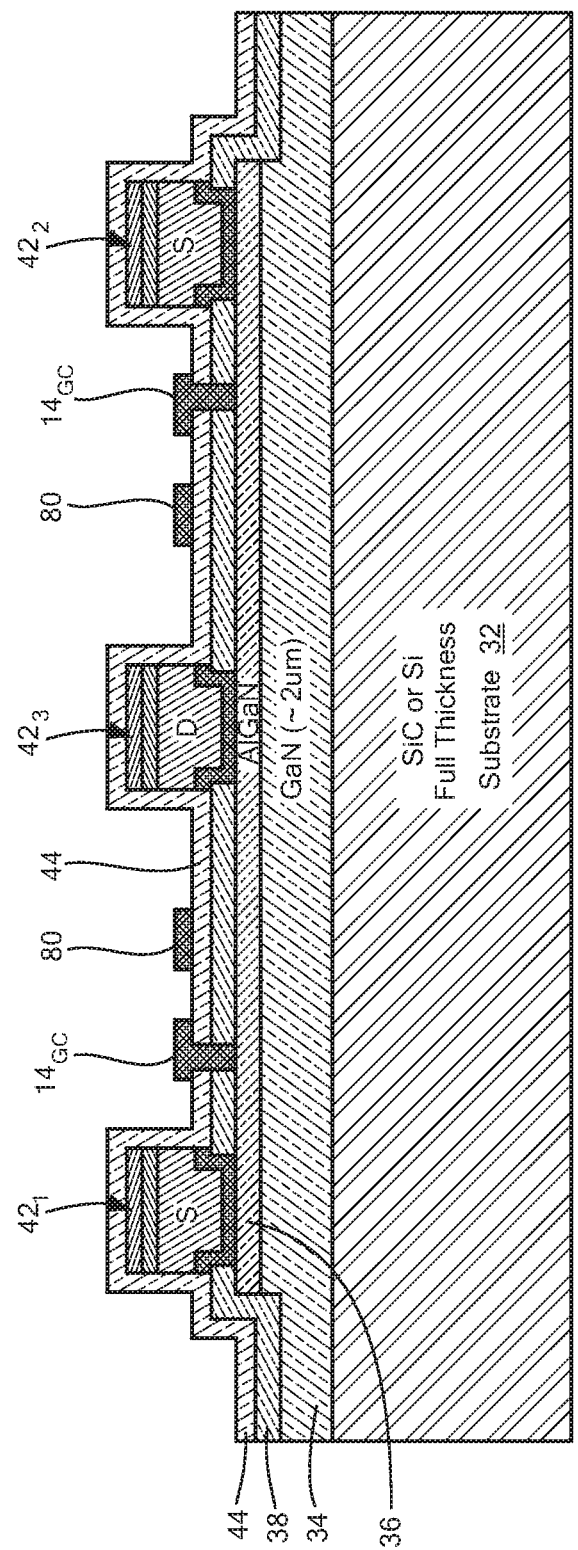
FIGS. 6A-6G are diagrammatical cross-sectional view sketches of a FET at various stages in the fabrication thereof according to another embodiment of the disclosure.
Figure 6B:
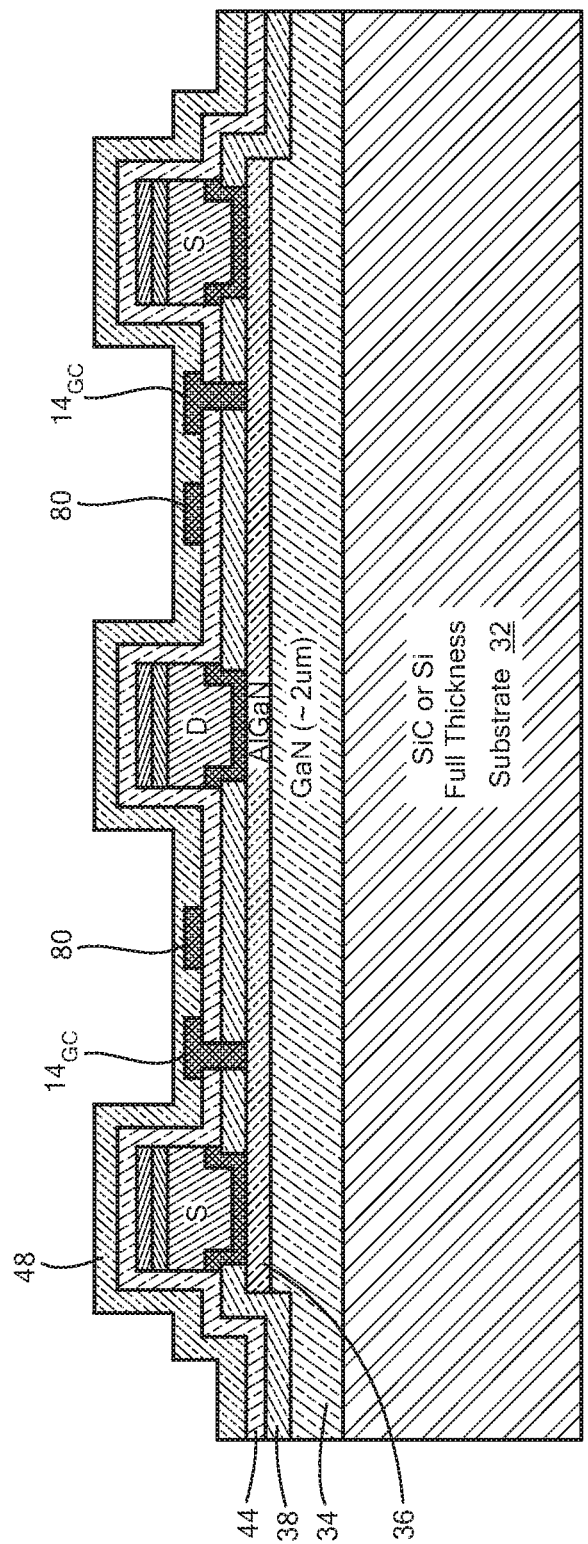

Referring now to FIGS. 6A-6G, a process for forming another embodiment is shown. Here, after completing the structure shown in FIG. 3F, instead of forming only the gate contacts $14_{GC}$ as in FIG. 4A, metal layers 80 are also formed on portions of the surface of dielectric layer 44 simultaneously with the formation of the gate contacts $14_{GC}$, as shown in FIG. 6A. The metal layers 80 are here the same material as used for the gate contacts $14_{GC}$ and are formed at a position of layer 44 where the field plates $23_1$ and $23_2$ are to be located.

Figure 6C:
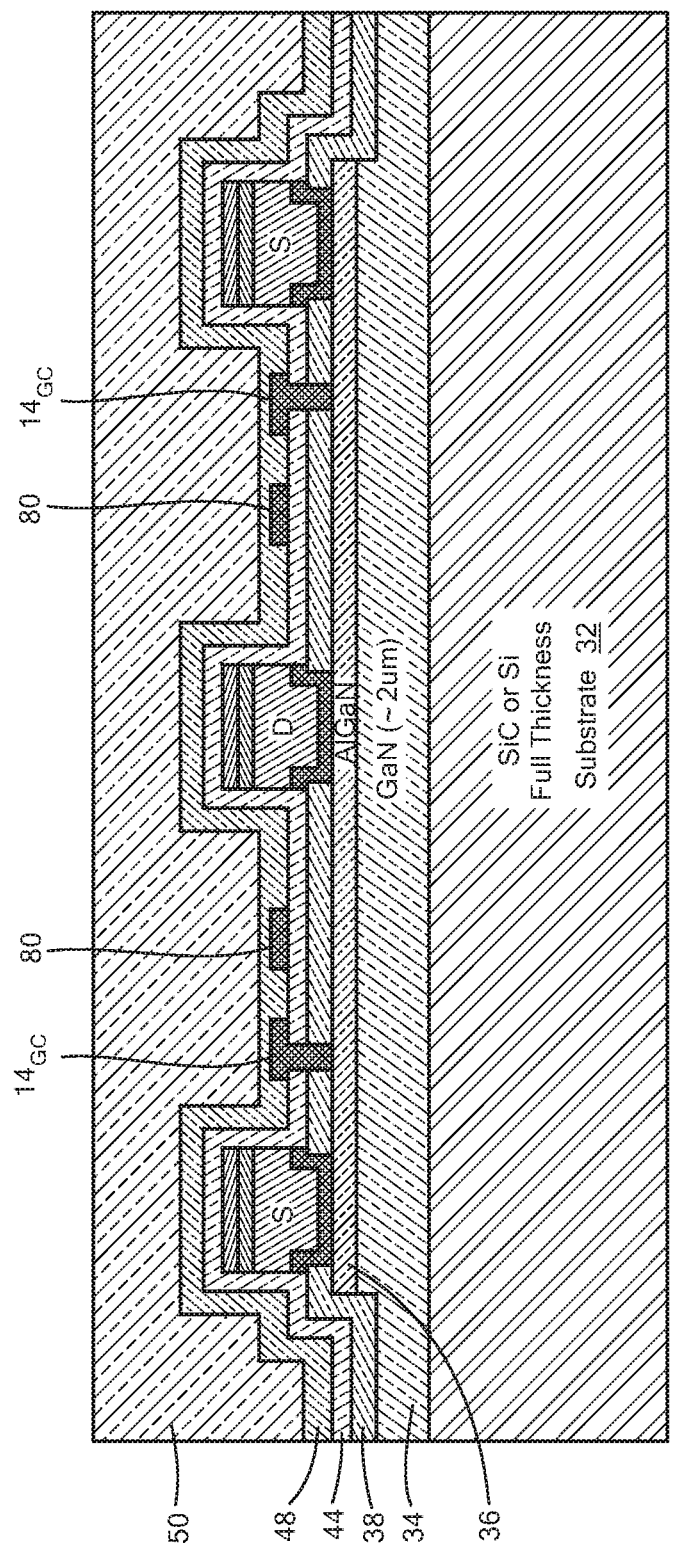

Next, the surface of the structure is cover with dielectric layer 48 (FIG. 6B) followed by dielectric layer 50, as described above in connection with FIG. 3F and shown in FIG. 6C. Layer 50 is then planarized, as shown in FIG. 6C.

Figure 6D:
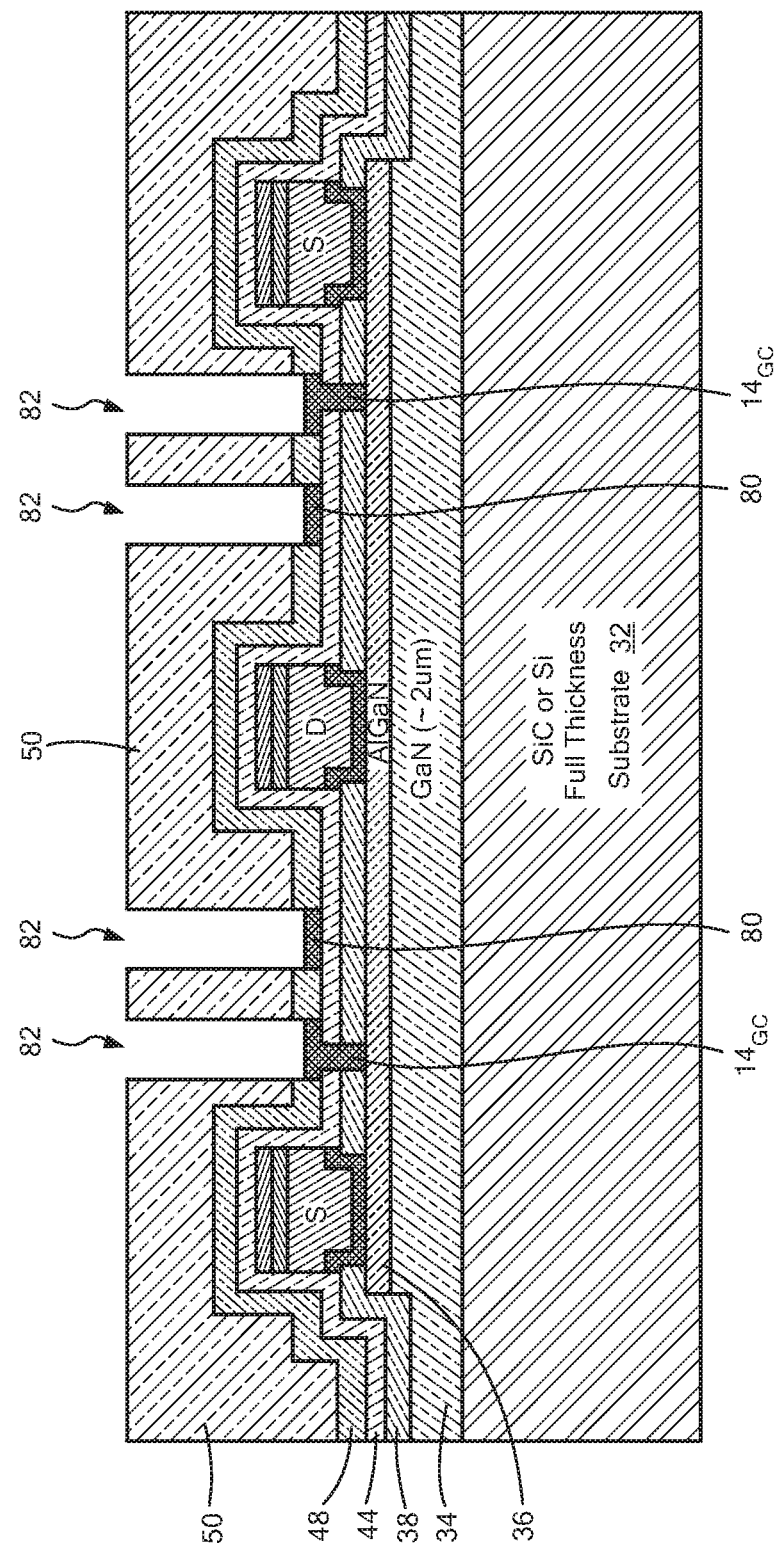

Next, openings 82 are formed through planarized layer 50 over the over the gate contacts $14_{GC}$ and over the metal layers 80 using a lithographic-etching process, here the etchant is a fluorine based dry etch and the dielectric layer 48, here for example SiNx, act as an etch stop layer. Dielectric layer 48 is then subsequently removed in a fluorine based dry etch process thereby exposing metal layers 80 and gate contacts $14_{GC}$ as shown in FIG. 6D. One or more layers of metal layers 80 and gate contacts $14_{GC}$ may also serve as etch stop layers.

Figure 6E:
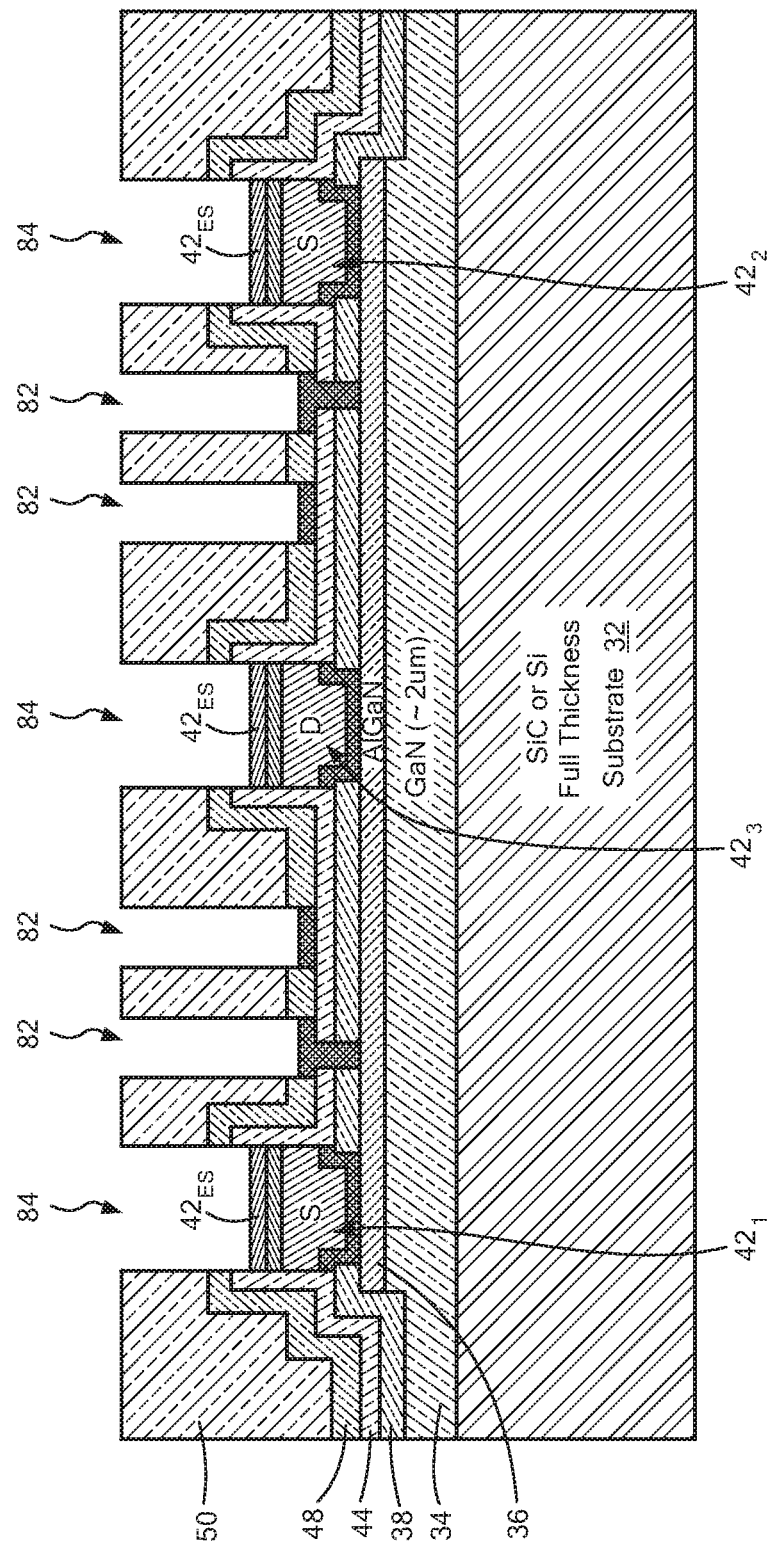

Next, openings 84 are formed through planarized layer 50 over the over the lower electrical contact structures $42_1$, $42_3$, and $42_2$ using a lithographic-etching process, here the etchant is a fluorine based dry etch and dielectric layer 48, here for example SiNx, act as an etch stop layer. Dielectric layer 48 is then subsequently removed in a fluorine based dry etch process thereby exposing electrical contact structures $42_1$ through $42_3$ as shown in FIG. 6E. One or more metal layers of electrical contact structures $42_1$ through $42_3$ may also serve as etch stop layers.

Figure 6F:
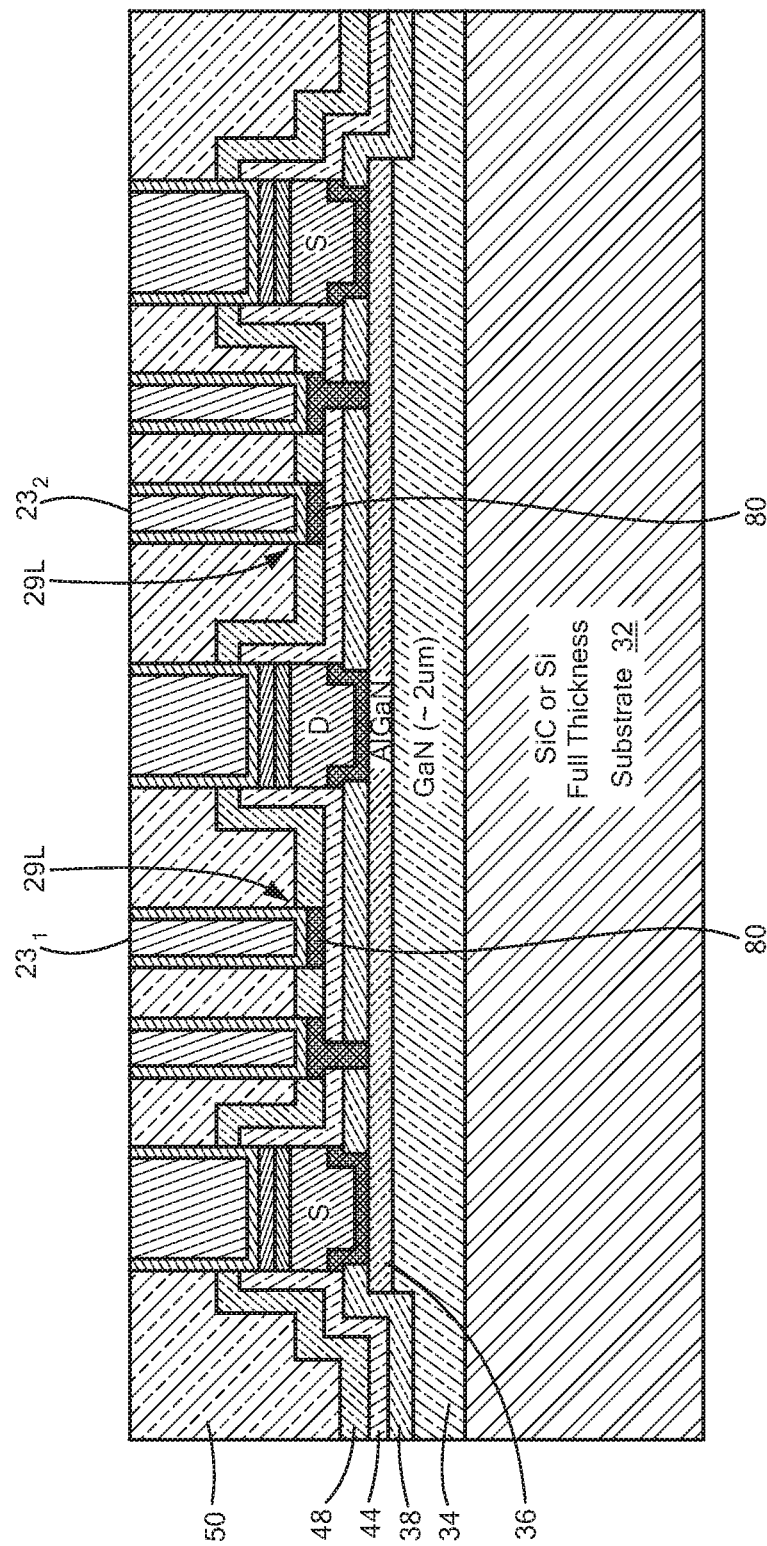
Figure 6G:
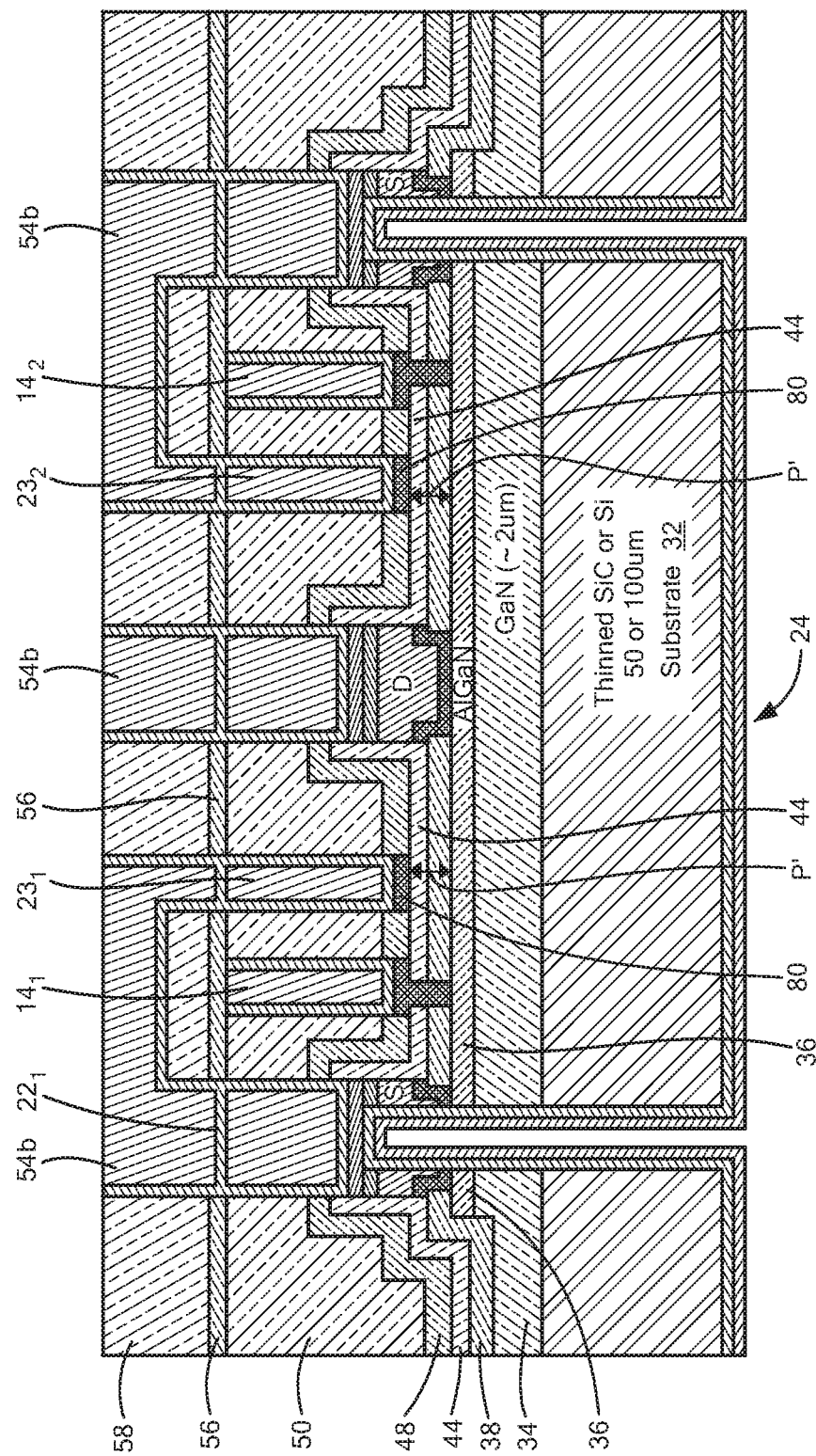

The process continues as described above in connection with FIGS. 3M through 3T followed by formation of the ground plane conductor 24 to form the structure shown in FIG. 6F. It is noted that here the field plates $23_1$, $23_2$ extend vertically down (along the Z-axis) from the upper surface of the structure 10 through the dielectric layer 50 and have lower ends 29L provided by metal layers 80 which are separated from the semiconductor layer 36 by a predetermined distance P'; where P' is the sum of the thickness ($P_3$) of the dielectric layer 44, here SiNx, and the thickness ($P_4$) of the dielectric layer 38, here SiNx, as shown in FIG. 6G.

Figure 7:
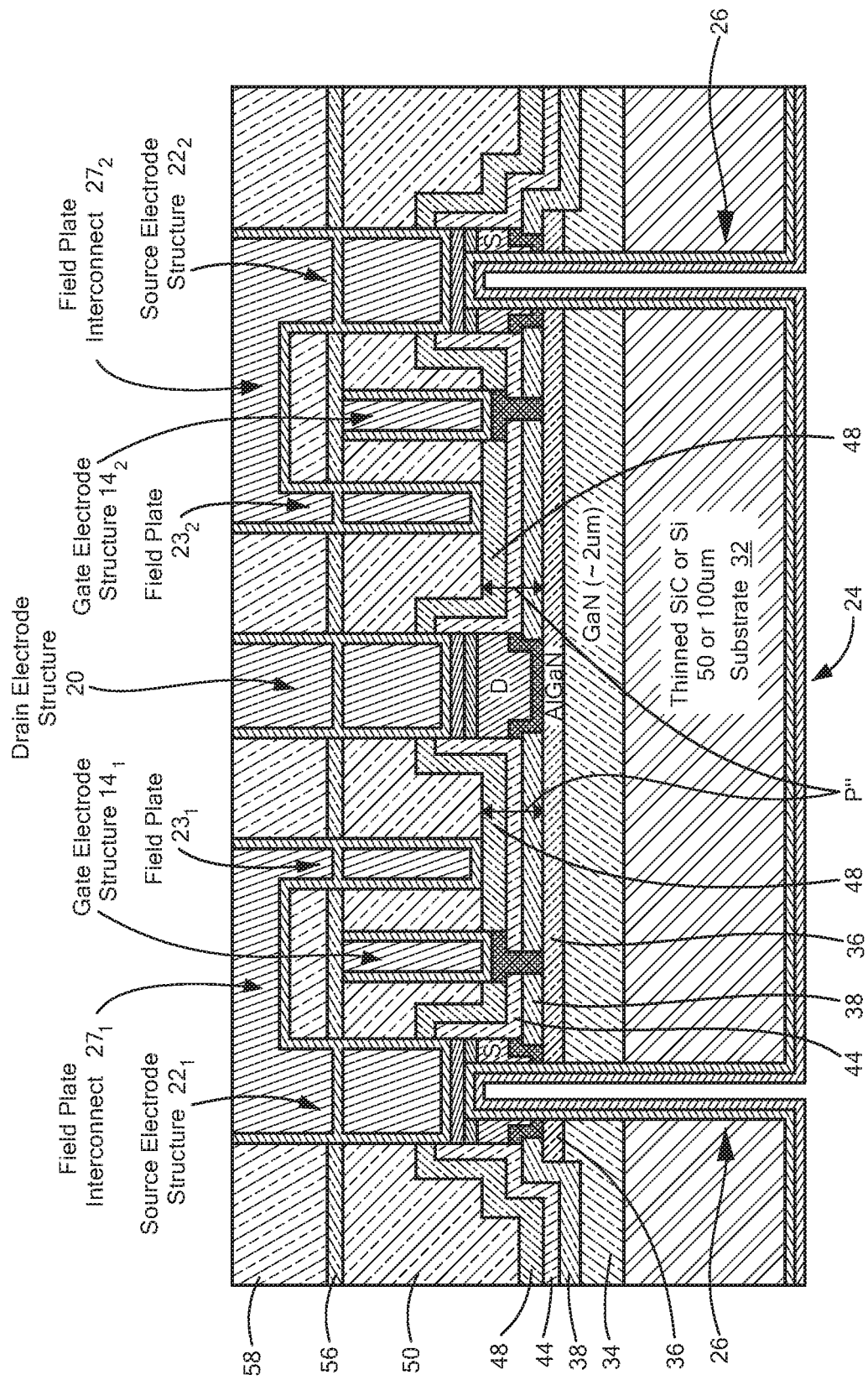
FIG. 7 is a diagrammatical cross-sectional view sketch of the FET according to another embodiment of the disclosure.

Referring now to FIG. 7, another embodiment is shown. Here, instead of using a timed etch as described above in connection with FIG. 3K, here the etchant is allowed to go to the SiNx layer 48 which acts as an etch stop layer. It is noted that here the field plates $23_1$, $23_2$ extend vertically down (along the Z-axis) from the upper surface of the structure 10 through the dielectric layer 50 and have lower ends which are separated from the semiconductor layer 36 by a predetermined distance P'''; where P''' is the sum of the thickness ($P_2$) of the dielectric layer 48, here SiNx, and the thickness ($P_3$) of the dielectric layer 44, here SiNx, as shown, and the thickness ($P_4$) of the dielectric layer 38, here SiNx, as shown.

Figure 8:
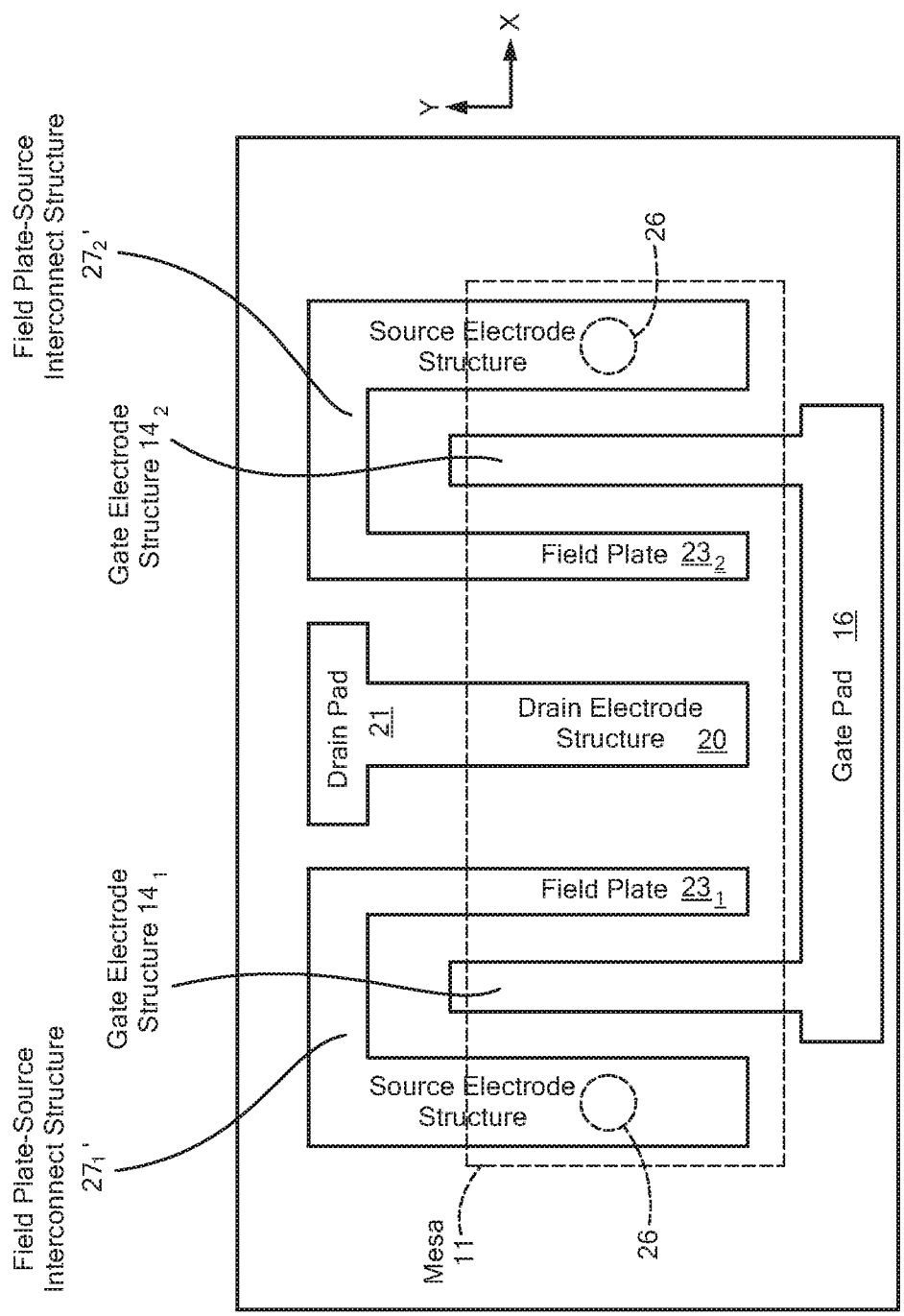
FIG. 8 is a diagrammatical plan view sketch of the FET according to another embodiment of the disclosure.

Referring now to FIG. 8, here, the field plate-source interconnects $27_1$' and $27_2$' are off the semiconductor mesa 11 as shown which may be formed using either: the timed etch process as described above in connection with FIGS. 2A, 2B and 3A-3U, or the use of the metal layer 80 as described in FIGS. 6A-6G; or the use of the SiNx layer 48 in FIG. 7.

More particularly, FIG. 8 is a diagrammatical plan view sketch of the FET according to another embodiment of the disclosure. Here the field plate interconnects $27_1$' and $27_2$' to the source electrode structures $22_1$ and $22_2$ are formed off of the semiconductor mesa 11; the cross sectional view being the same as one shown in FIG. 3M, 6F, or 11F.

Figure 11A:
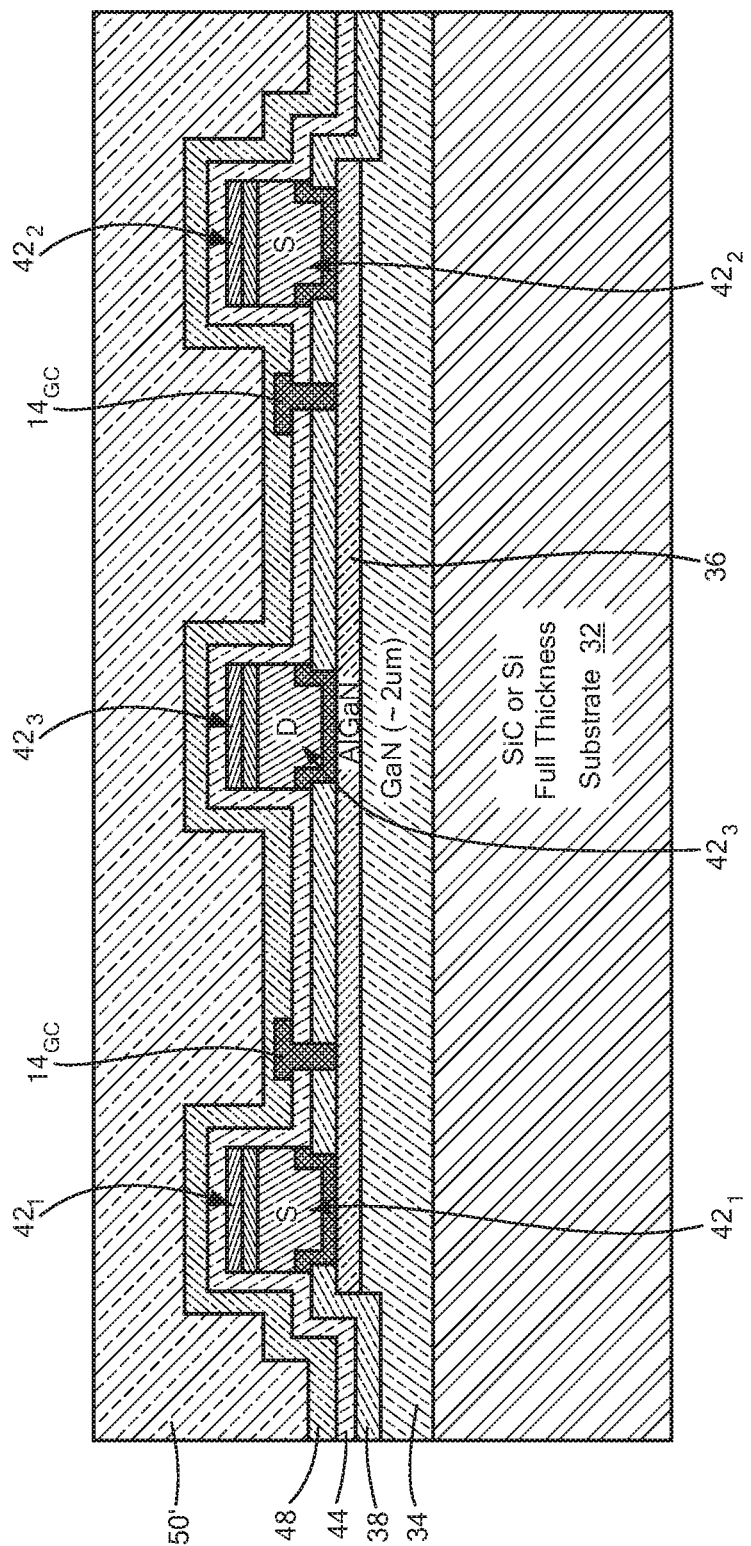
FIGS. 11A-11G are diagrammatical cross-sectional view sketches of a FET at various stages in the fabrication thereof according to another embodiment of the disclosure.
Figure 11B:
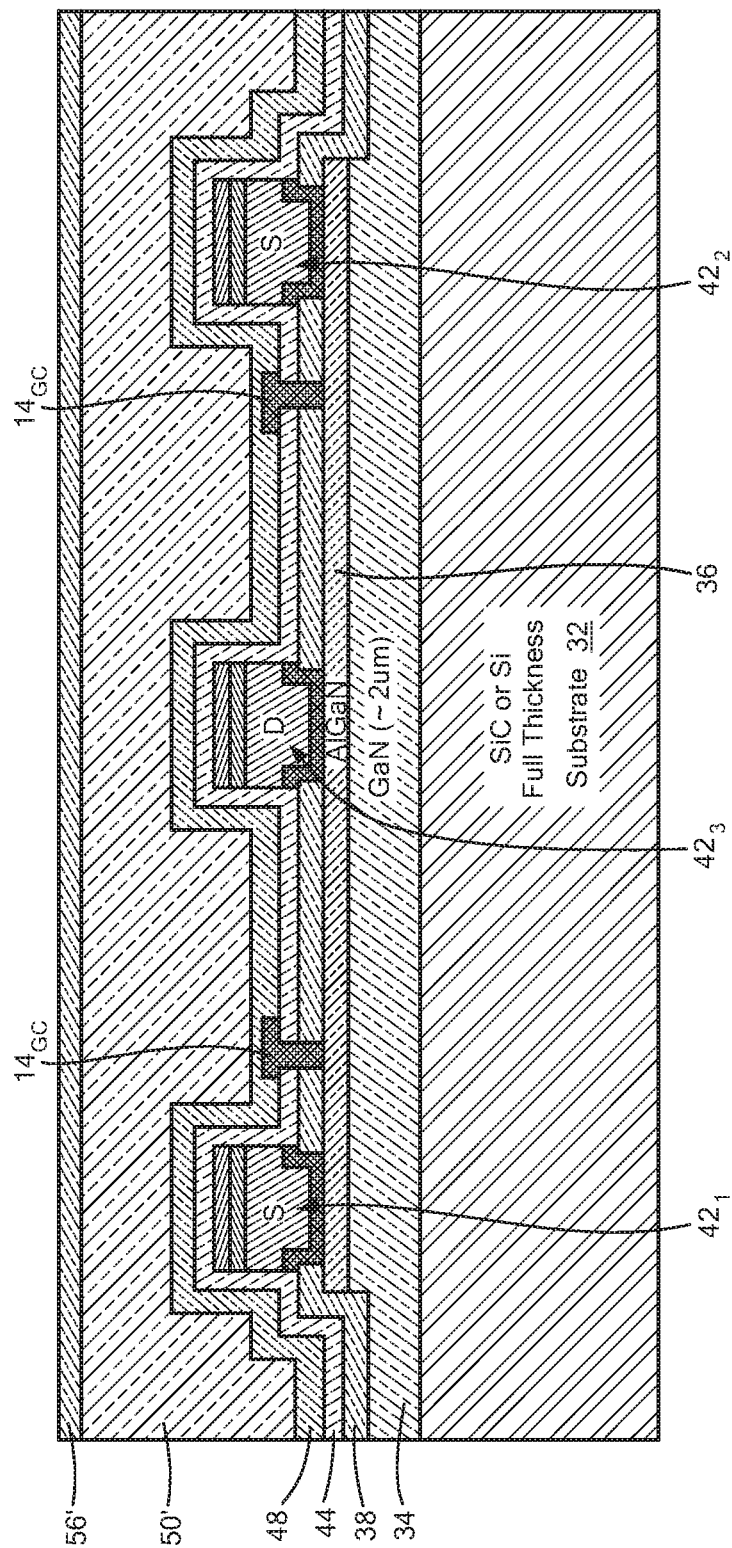
Figure 11C:
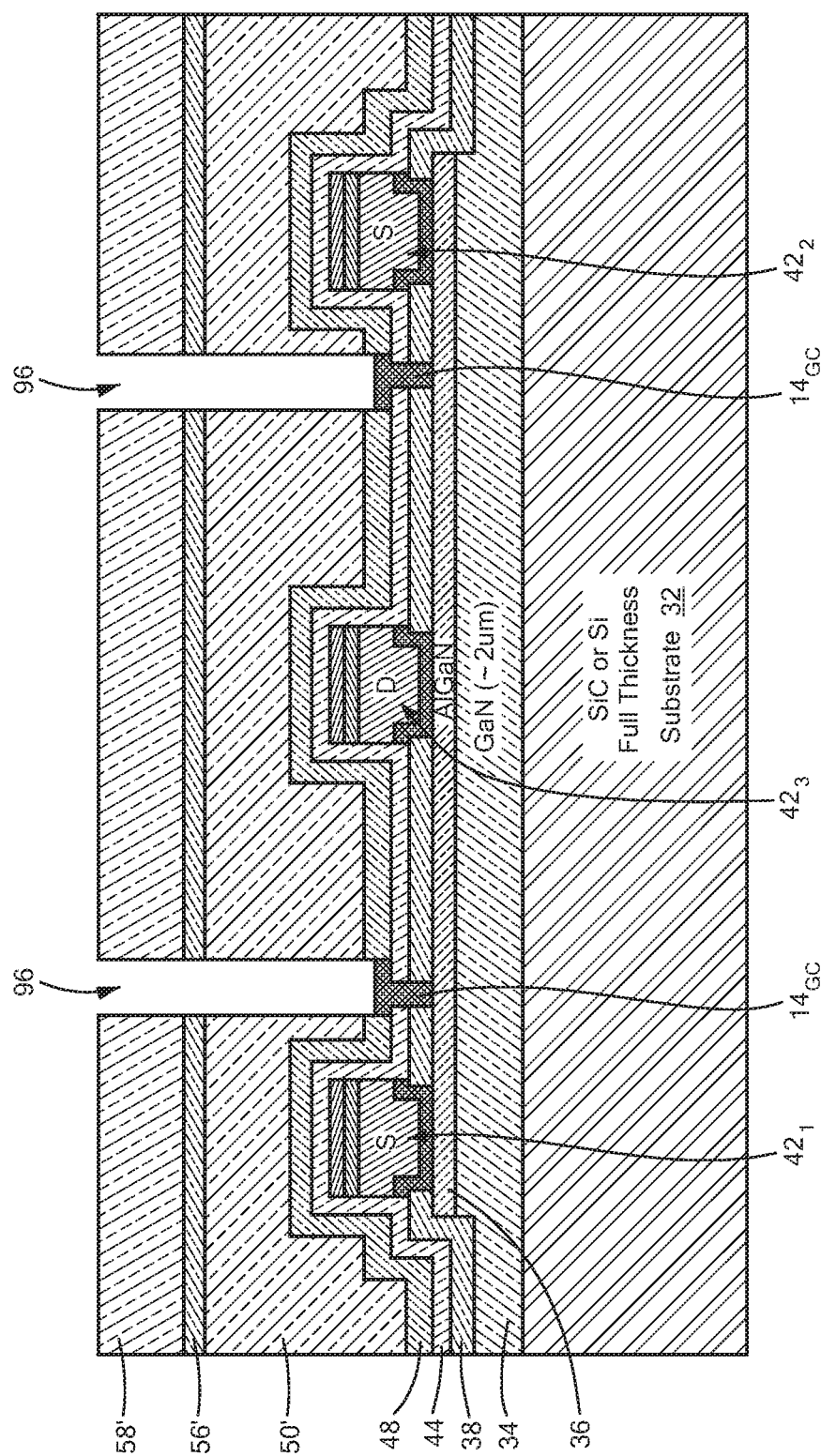
Figure 11D:
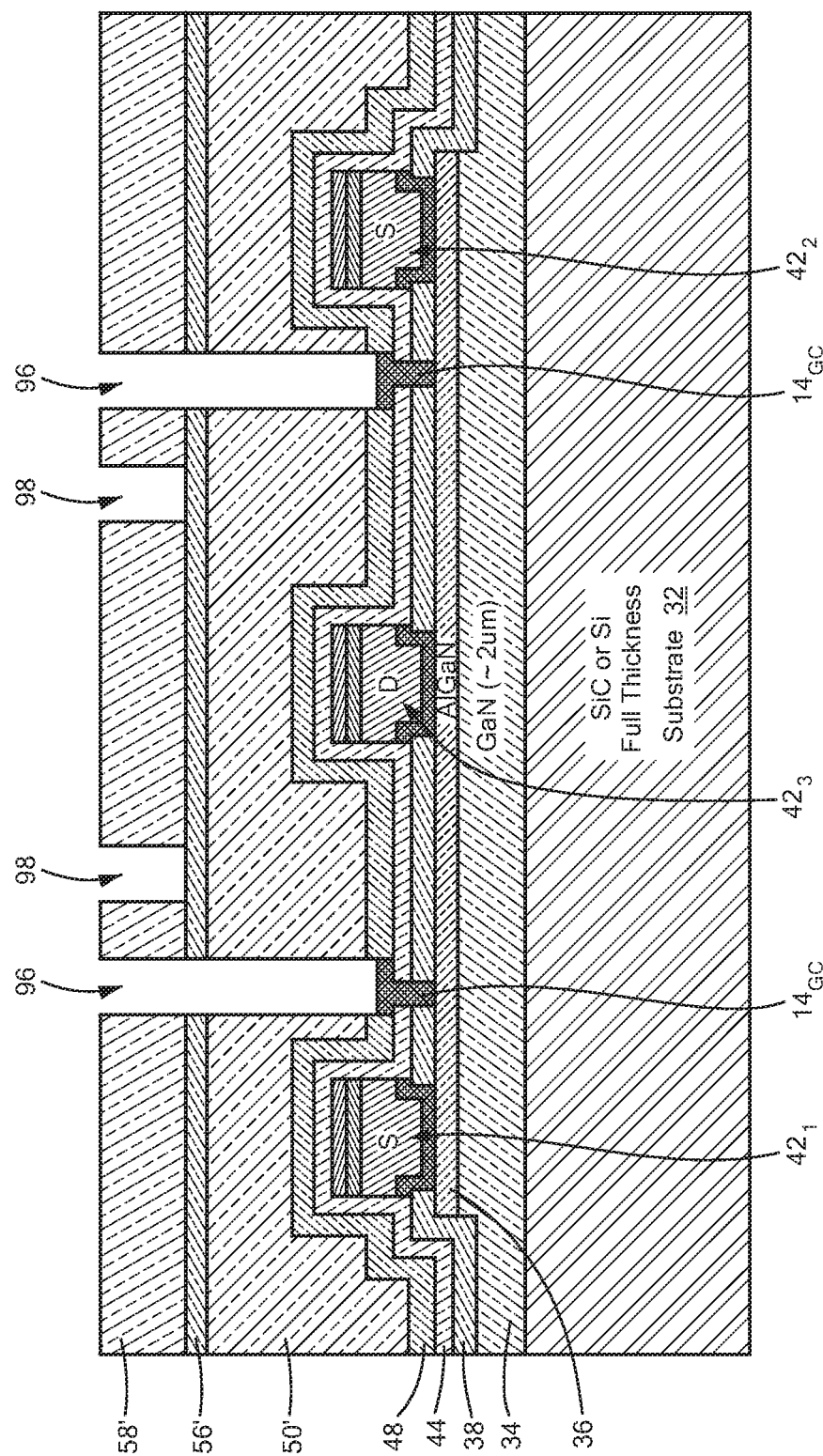
Figure 11E:
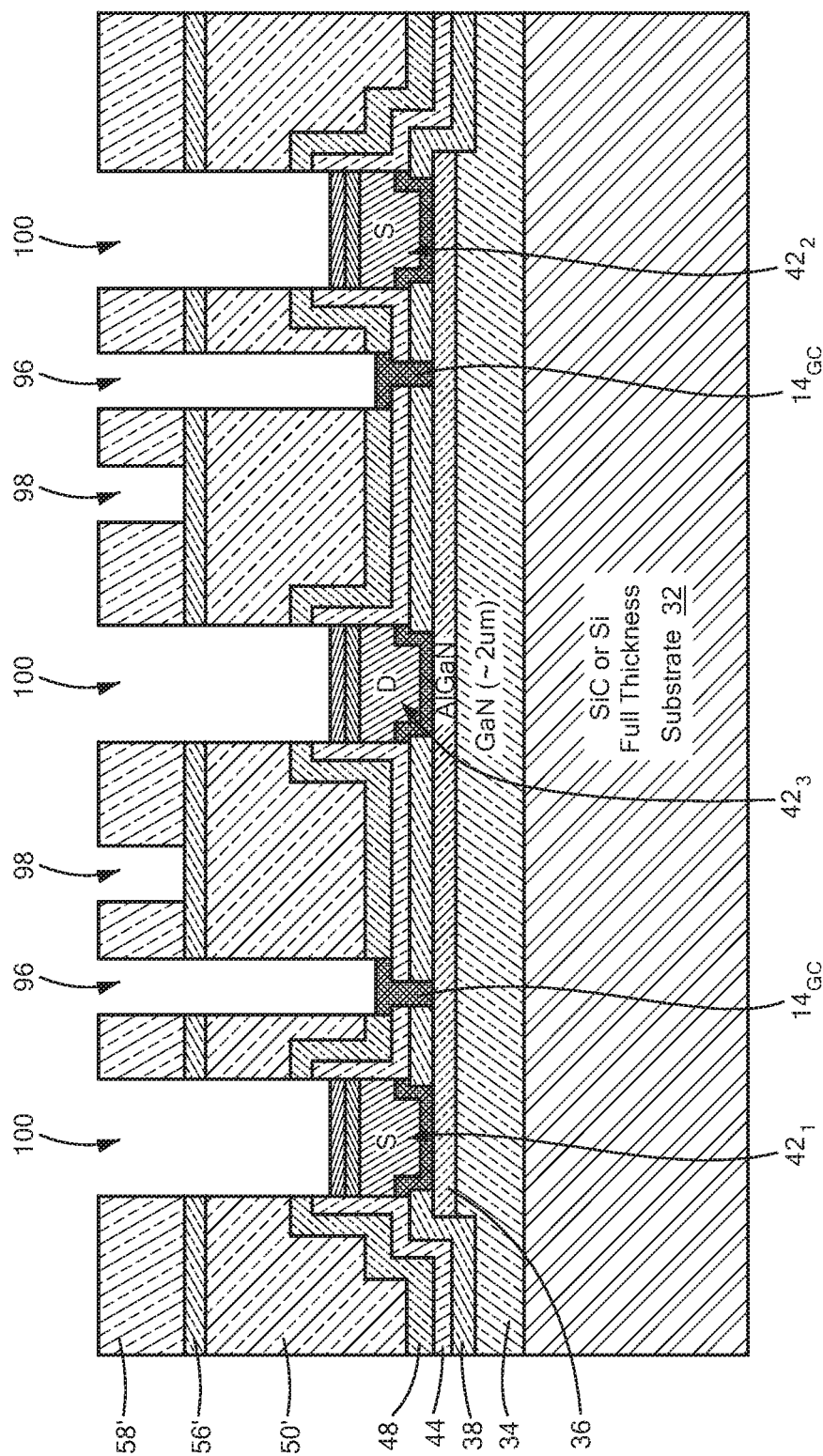
Figure 11F:
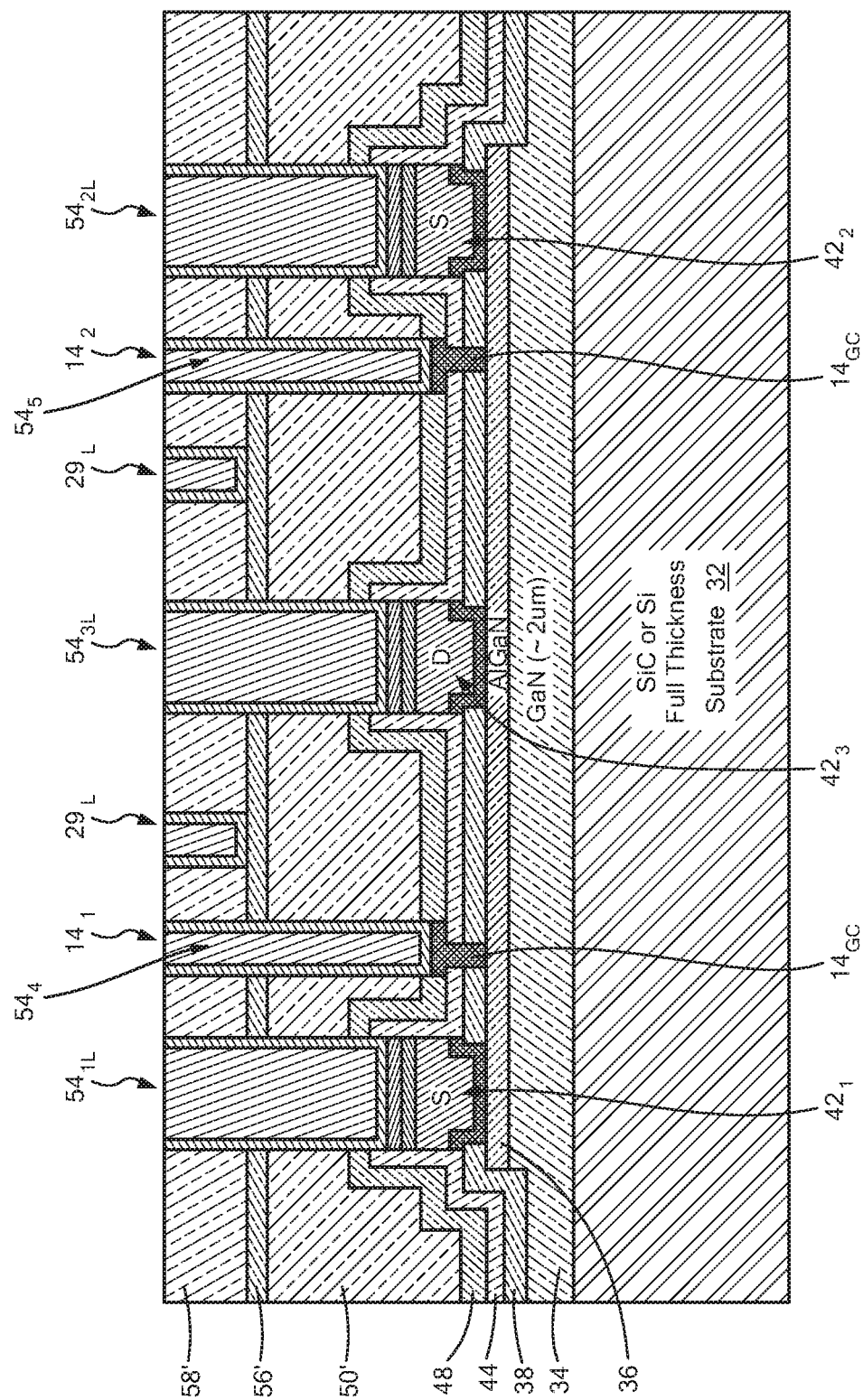
Figure 11G:
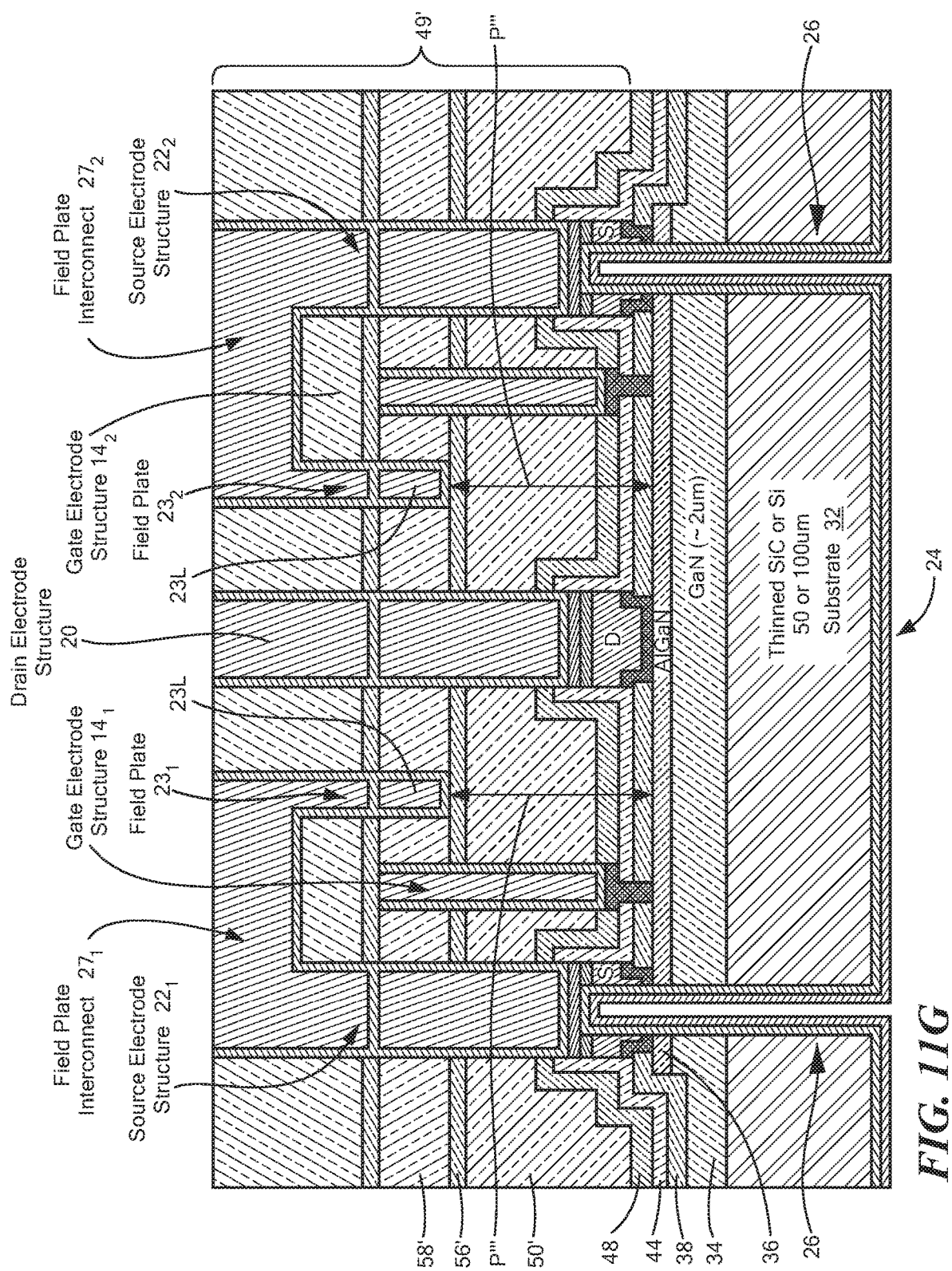

Referring now to FIG. 11A-11G, diagrammatical cross-sectional view sketches of a FET at various stages in the fabrication thereof according to another embodiment of the disclosure is shown. Here, as shown in FIG. 11G, the lower ends 23L of the field plates 23i, $23_2$ are formed in a silicon dioxide layer 58' of a dielectric structure 49', as shown. The position of the lower ends 23L of the field plates $23_1$, $23_2$ is to place the depth of the field plates $23_1$, $23_2$ a predetermined distance P''' from the Group III-N semiconductor layer 36, as shown in FIG. 11G.

Thus, after forming the structure shown in FIG. 3H, a layer 50' of silicon dioxide, here, for example, having thickness of 5 nm-700 nm is deposited over such structure, as shown in FIG. 11A. Next, an silicon nitride (SiNx) etch stop layer 56' is formed over the deposited layer 50' here having a thickness in accordance with the selected predetermined distance P''' (FIG. 11G), as shown in FIG. 11B.

Next, a layer 58' of silicon dioxide is deposited over layer 56', as shown in FIG. 11C. Next openings 96 are formed through silicon dioxide layers 58', silicon nitride etch stop layer 56', silicon dioxide layer 50' to expose the gate contact $14_{OG}$, as shown using lithographic-etch processing; here a fluorine based dry etch is used for etching through the silicon dioxide layers 50' and 58' and a fluorine based dry etch is used for etching through the SiNx etch stop layer 56' exposing the gate contacts $14_{GC}$ as described above in connection with FIG. 3J, producing the structure shown in FIG. 11C.

Next, openings 98 are formed through silicon dioxide layer 58' to the SiNx etch stop layer 56' where the field plates $23_1$, $23_2$ are to be formed (more particularly here the using lithographic-etching techniques, here using a fluorine based dry etch, as shown in FIG. 11D.

Next, openings 100 are formed through the silicon dioxide layer 58', SiNx etch stop layer 56', and silicon dioxide layer 50' using lithographic-etching processing; here fluorine based dry etch is used for etching through the silicon dioxide layers 50' and 58' and a fluorine based dry etch is used for etching through the SiNx etch stop layer 56' exposing the source and drain electrical contact structures $42_1$, $42_2$ and $42_3$ as described above in connection with FIG. 3M, as shown in FIG. 11E followed by the formation of the copper Damascene electrical interconnect structures $54_{1L}$-$54_{3L}$, $54_4$, $54_5$, and $29_L$ as shown in FIG. 11F.

Next, the source electrode structures $22_1$ and $22_2$, drain electrode structure 20, field plates structures $23_1$, $23_2$, and field plate interconnects $27_1$, $27_2$ are processed as described above in connection with FIGS. 3M to 3T to form the structure shown in FIG. 11G.

Figure 13A:
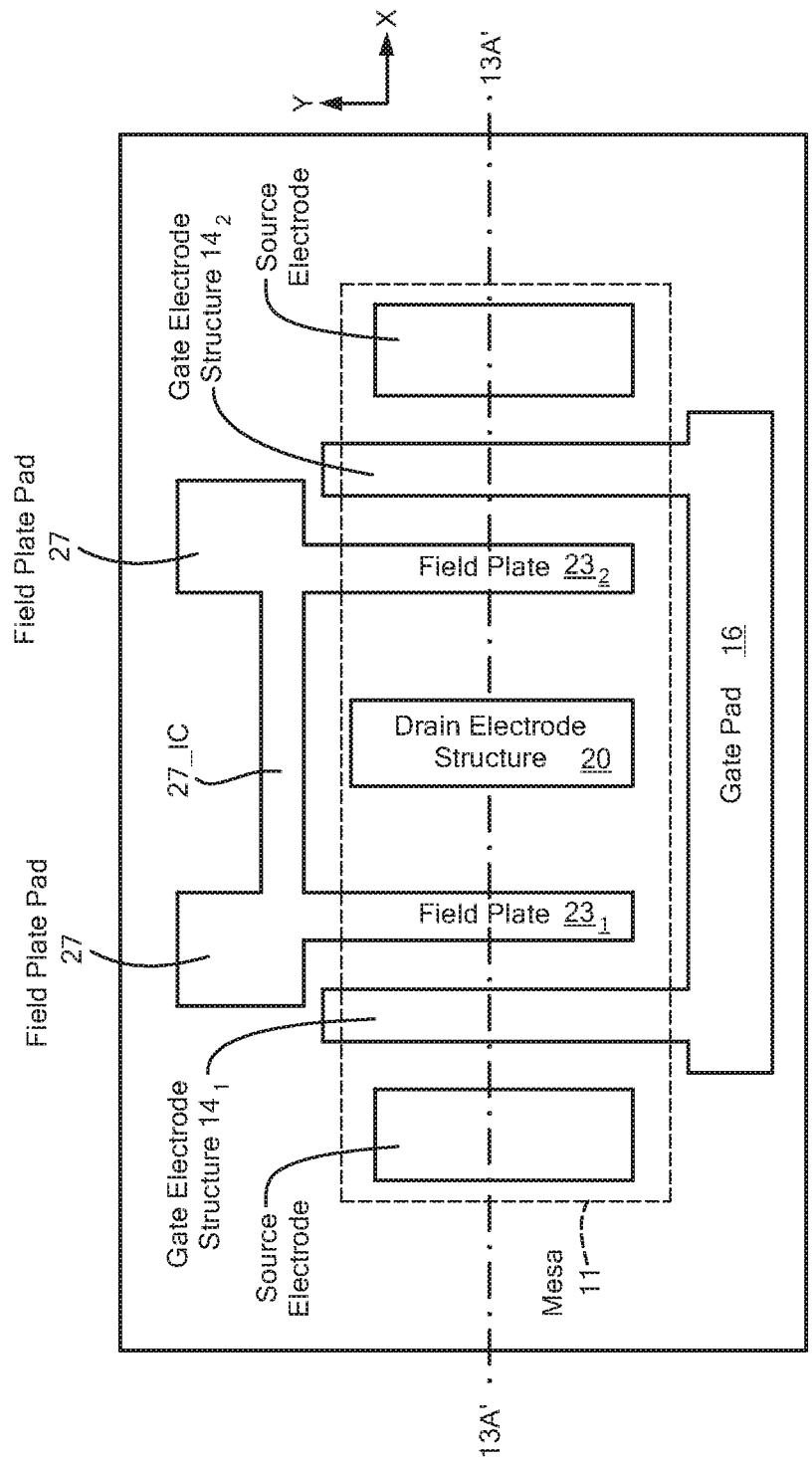
FIGS. 13A-13E' are diagrammatical plan and cross sectional views of a FET according to another embodiment of the disclosure at various stages in the fabrication thereof.
Figure 13A:
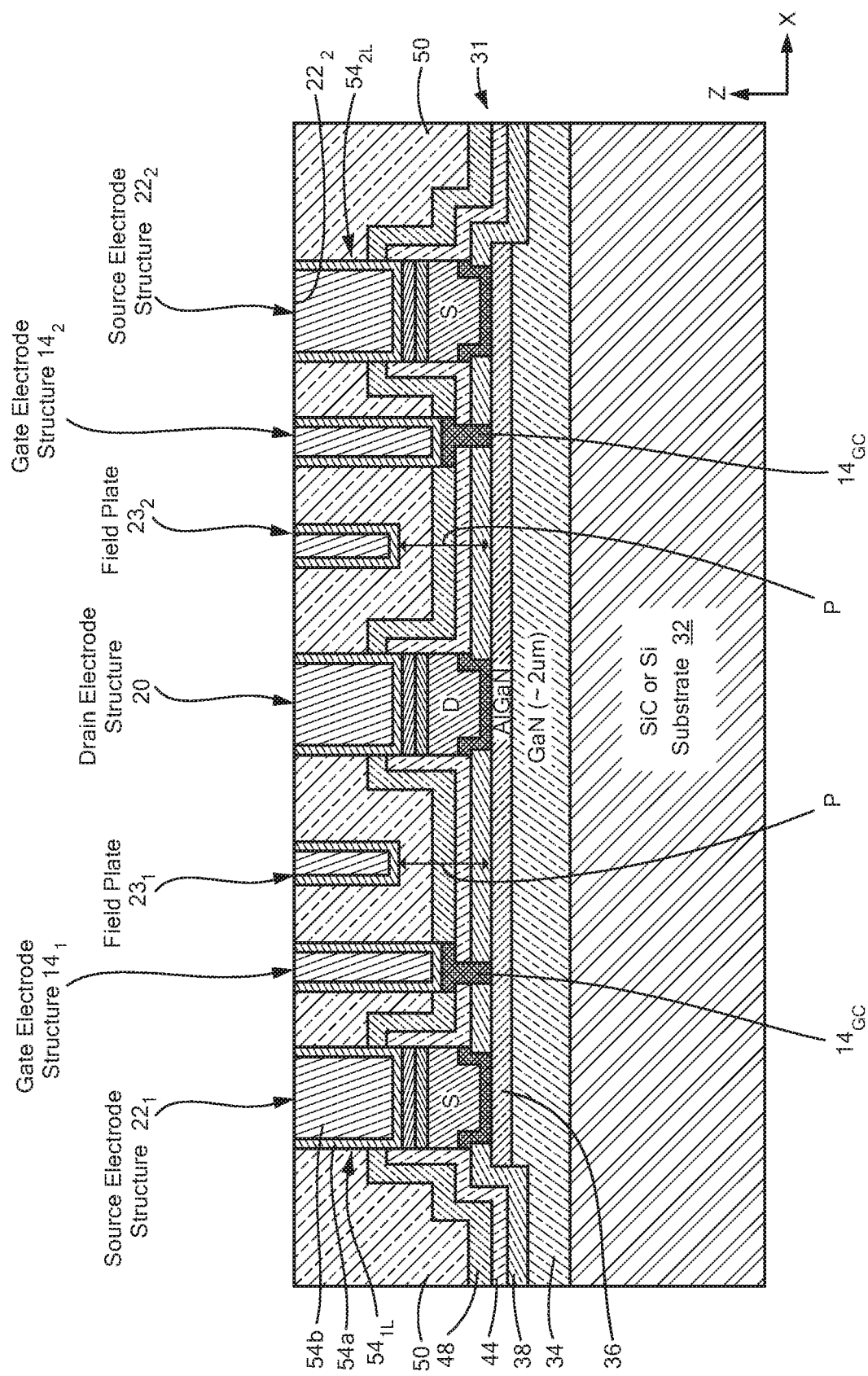
Figure 13B:
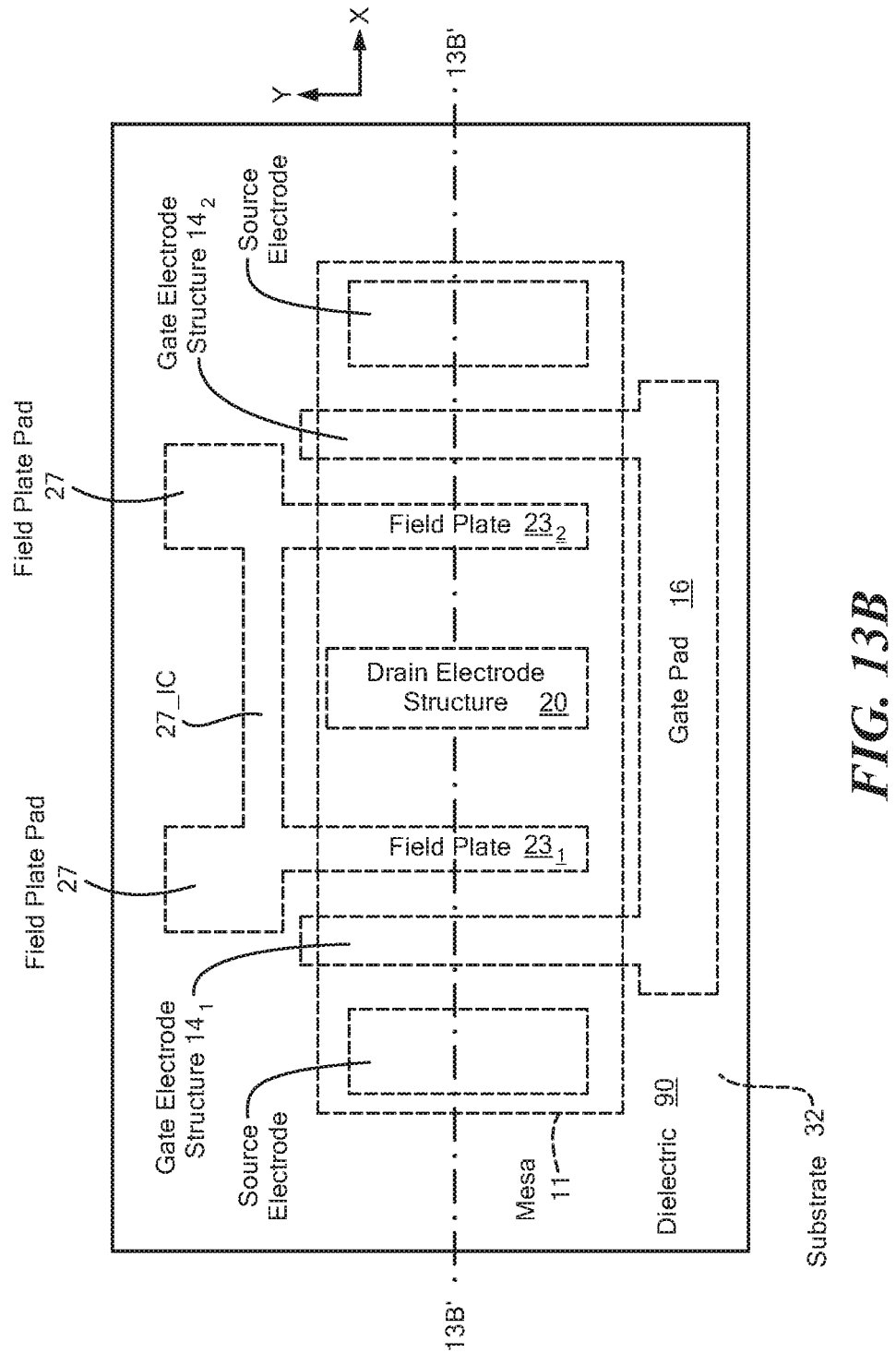
Figure 13B:
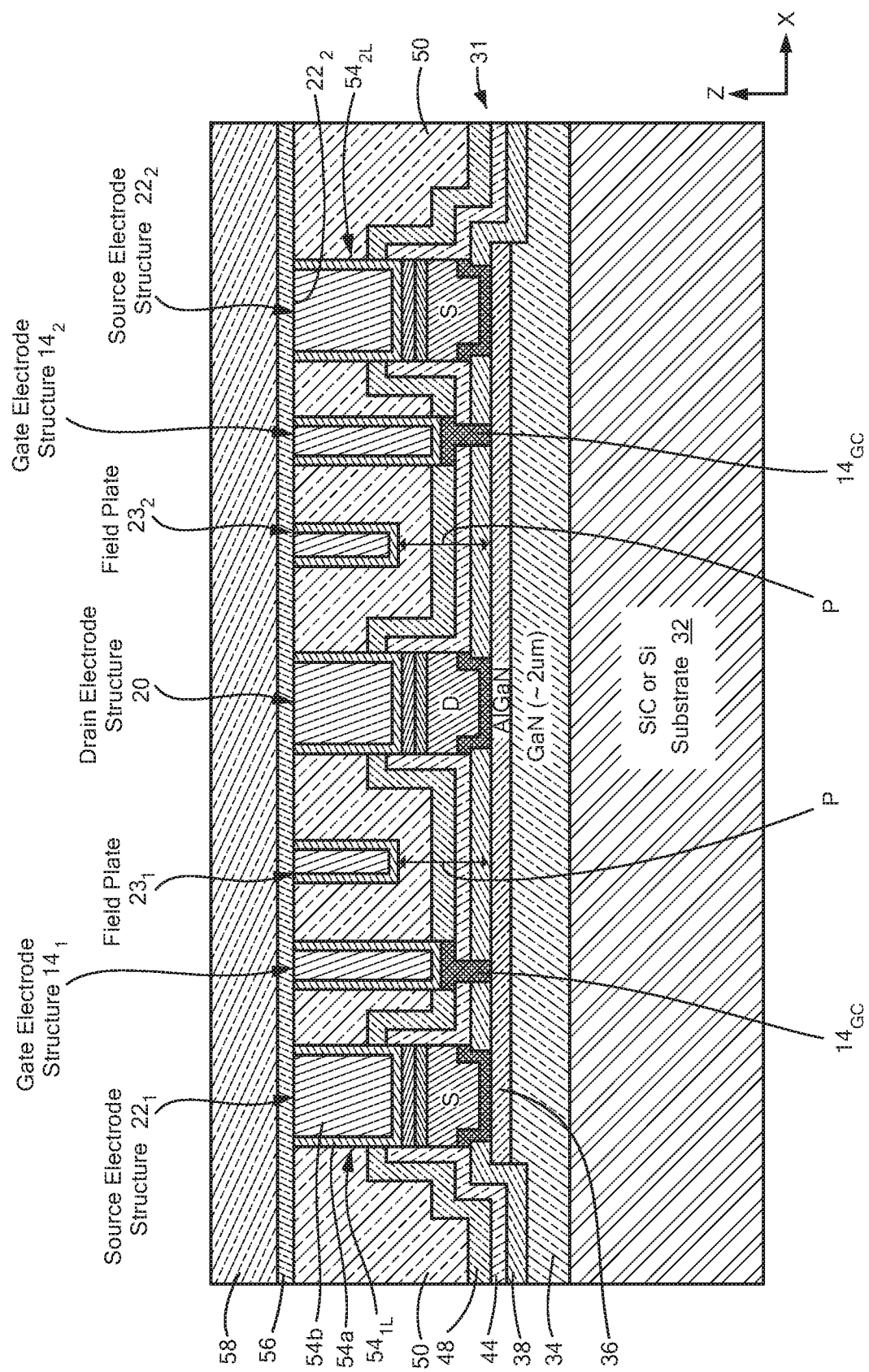
Figure 13C:
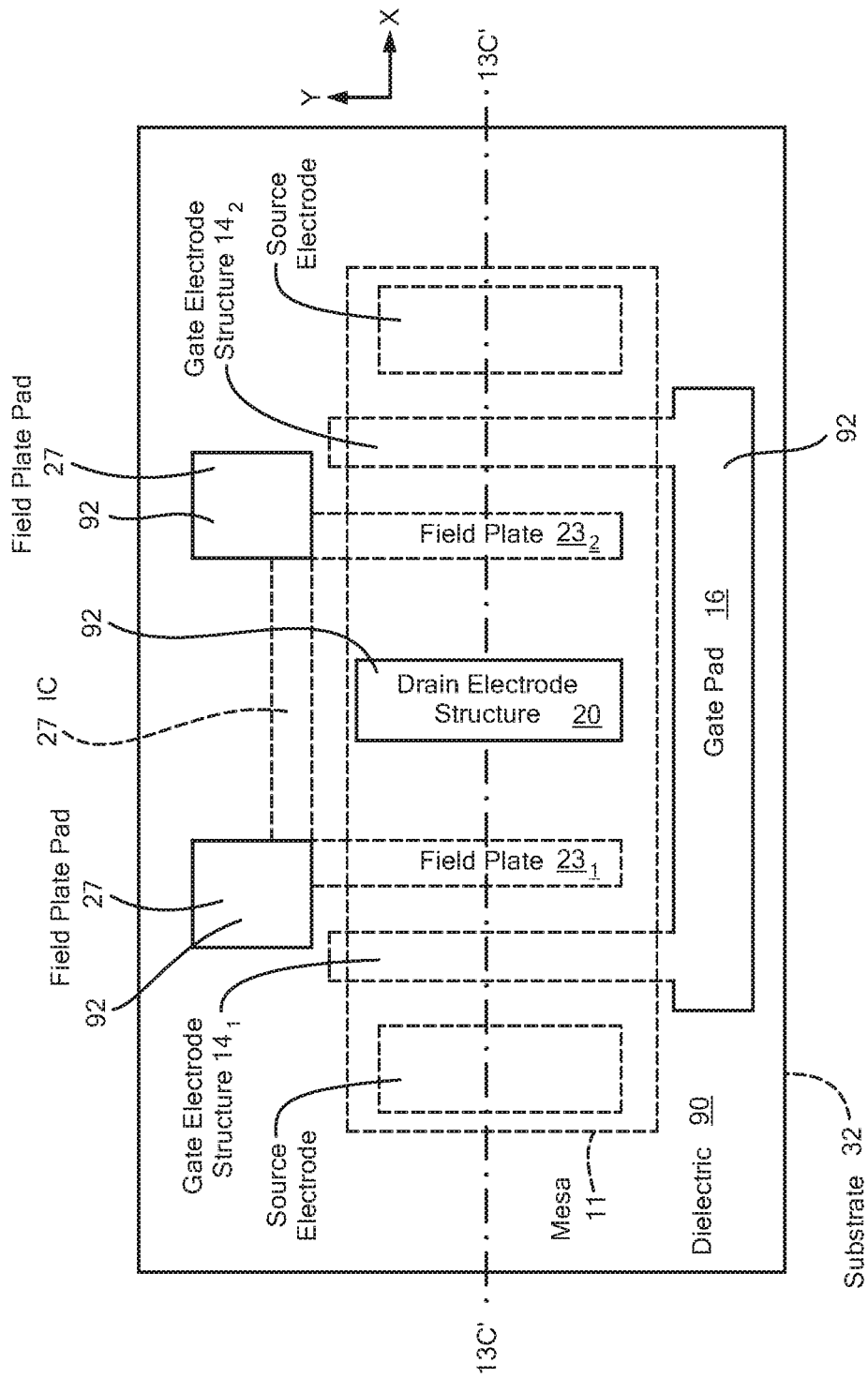
Figure 13C:
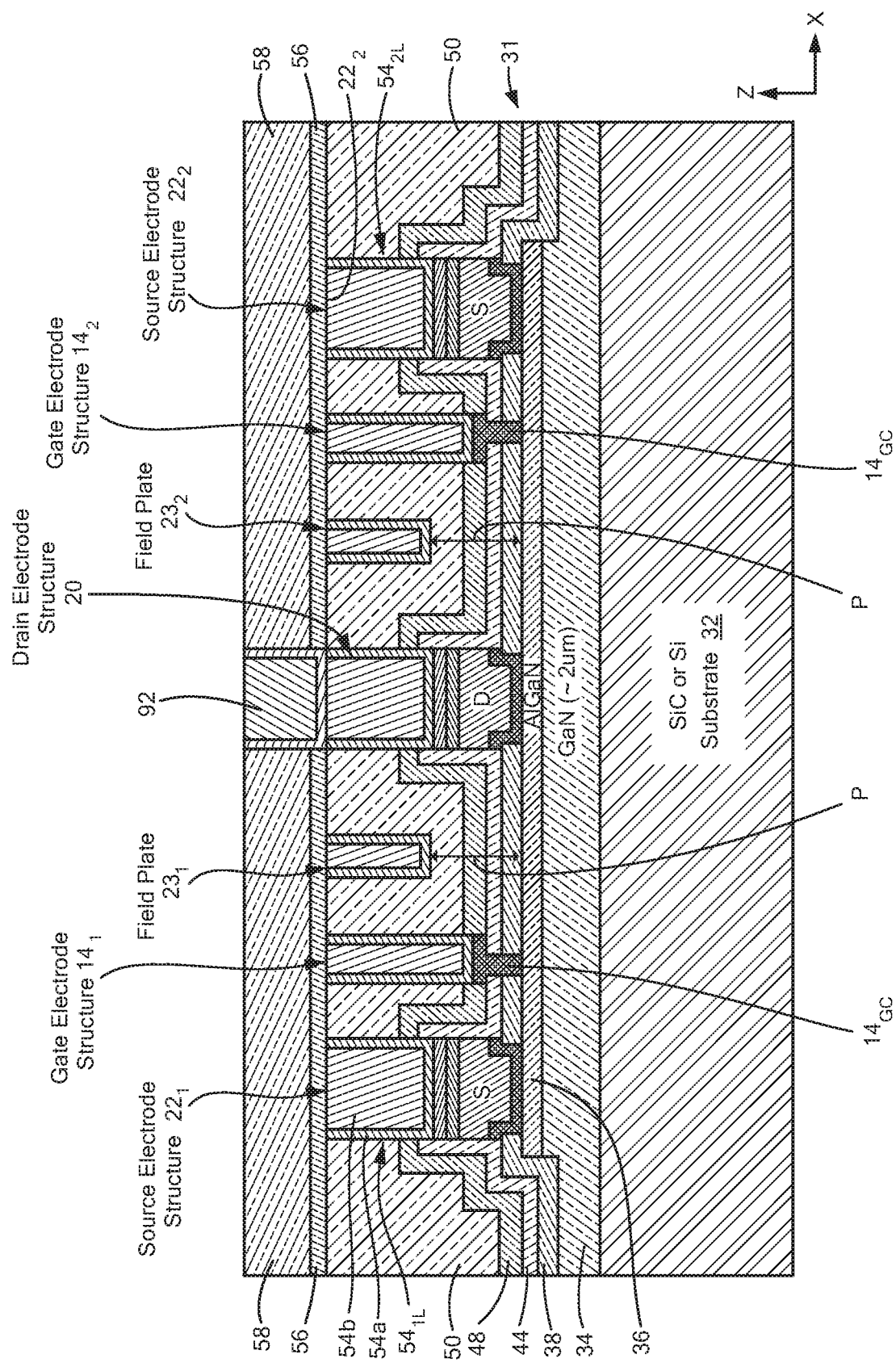
Figure 13D:
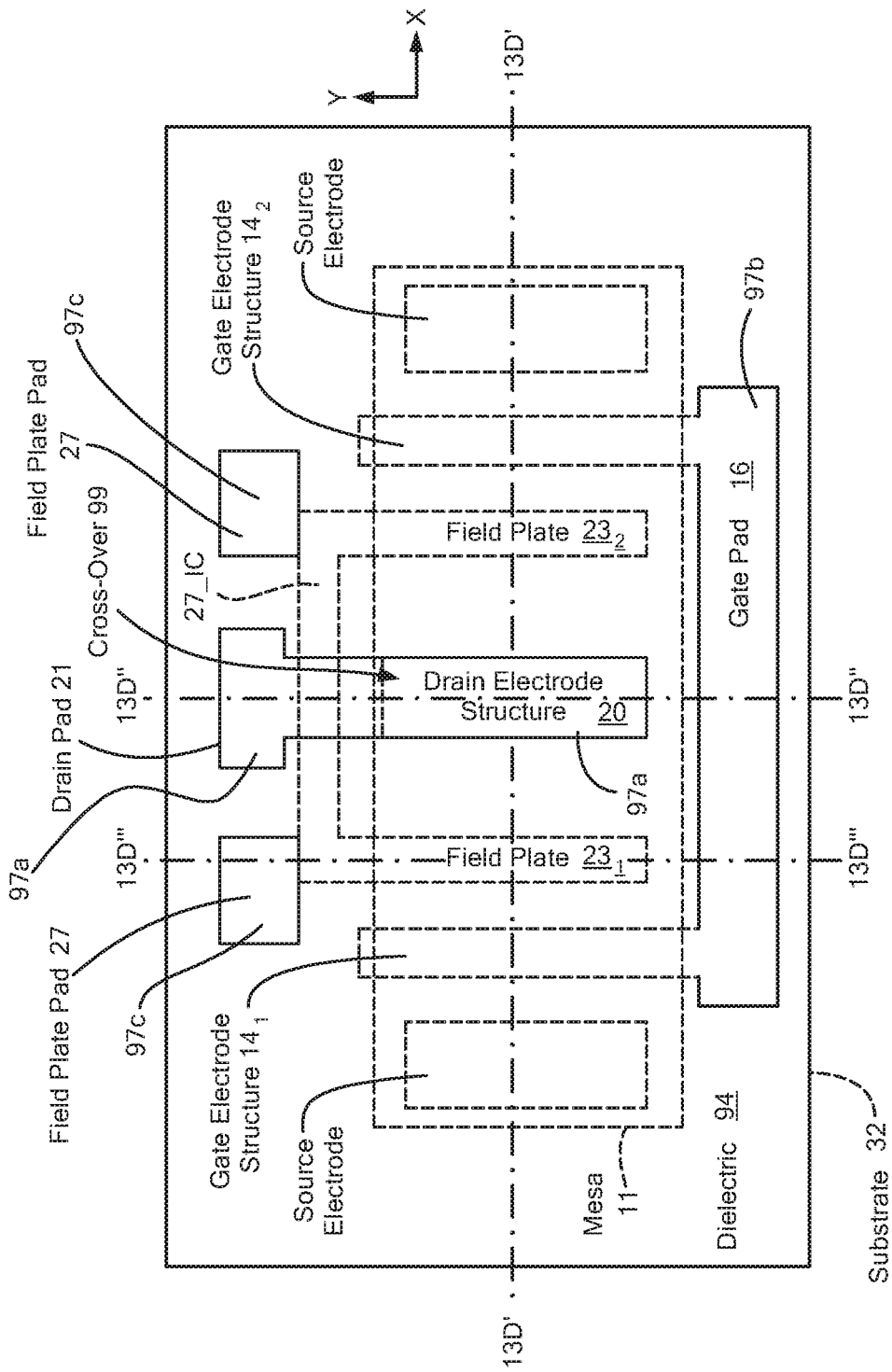
Figure 13D:
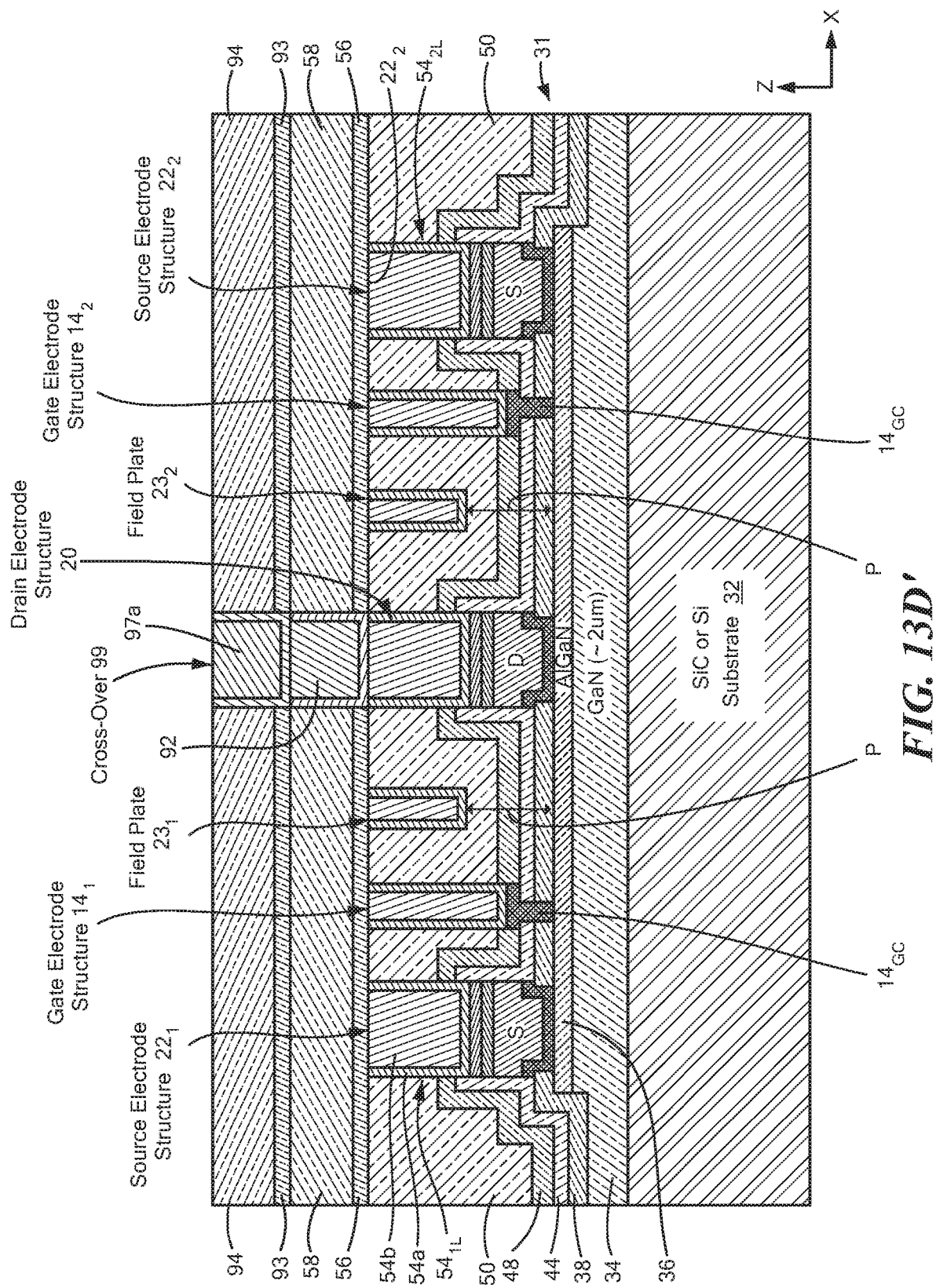
Figure 13D:
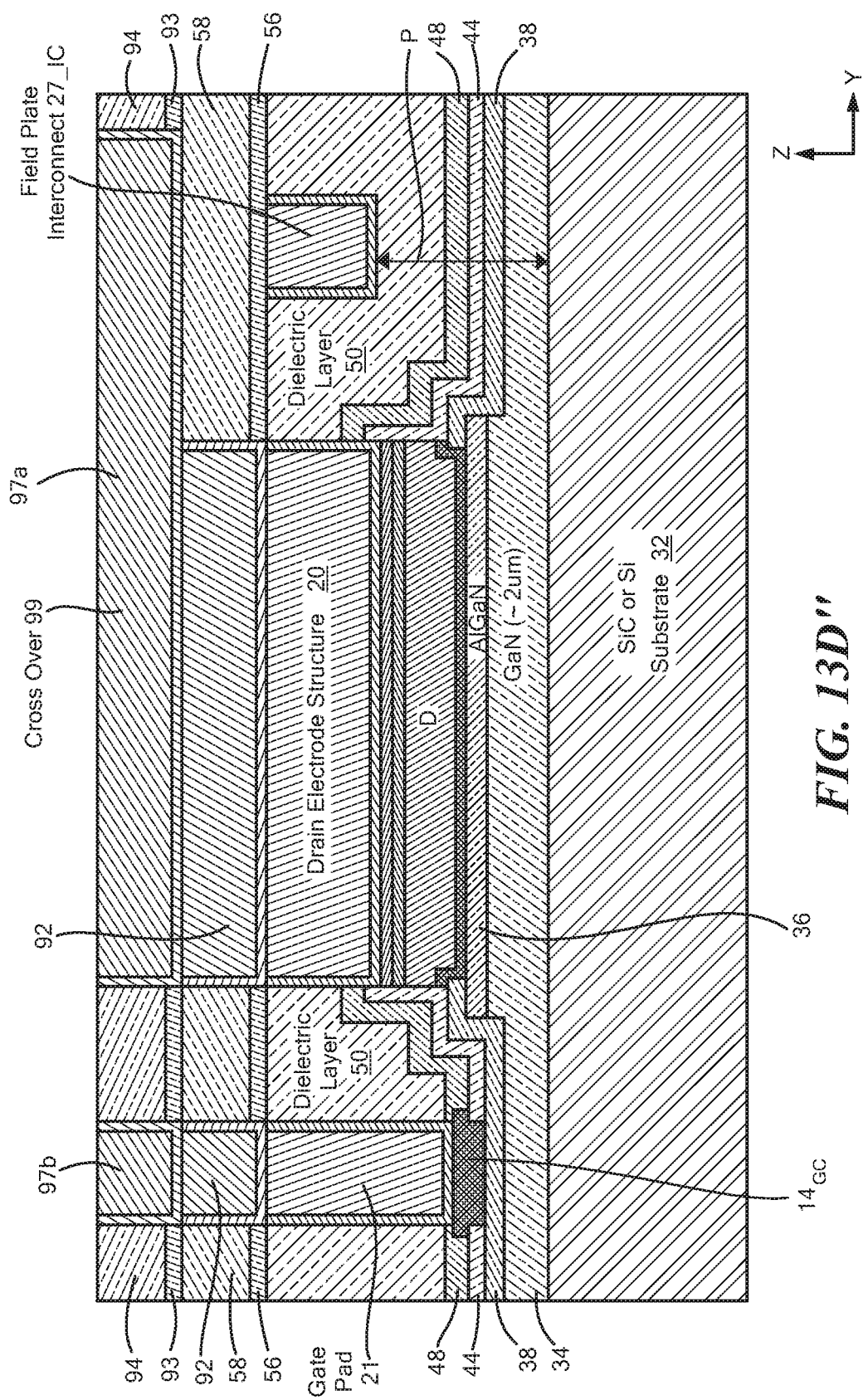
Figure 13D:
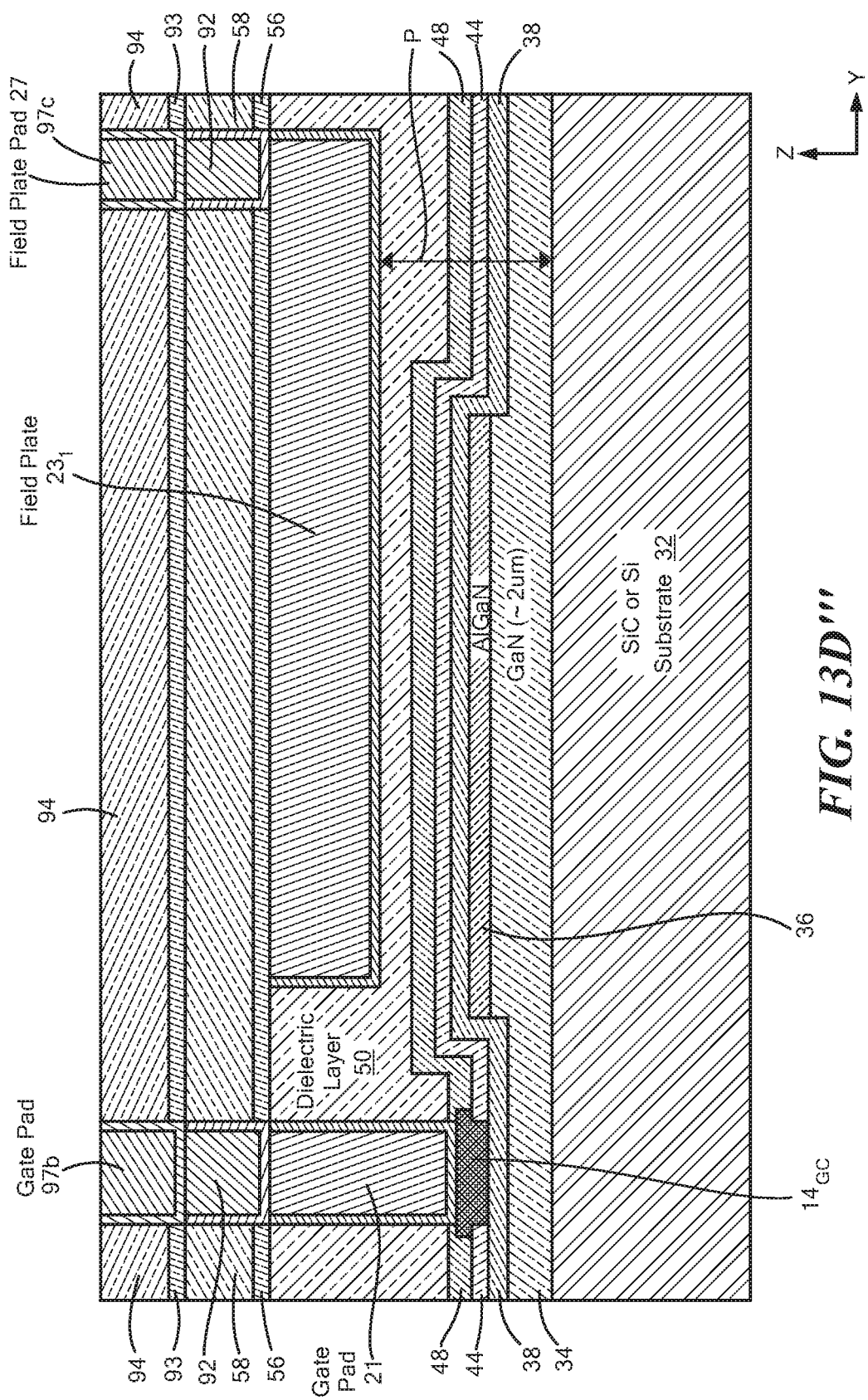

Referring now to FIGS. 13A-13E and FIGS. 13A'-13E', and FIG. 13D" another embodiment of the disclosure is shown. Here the field plate structures 23i, $23_2$ are not connected to the source electrode structures $22_1$, $22_2$ but rather are connected to an independent field plate pads 27 through a field plate interconnect 27_IC (FIG. 13 C), as shown. Thus, the pair of field plate structures $23_1$, $23_2$ may be connected to a voltage source independent of a voltage applied to either the source electrode structures $22_1$, $22_2$ or the drain electrode structure 20 or the gate electrode structure $14_1$, $14_2$. Accordingly, for example, instead of the field plate structures $23_1$, $23_2$ being connected to the source they could be either floating (not electrically connected to another electrode) or electrically connected to voltage values other than the voltage applied to the gate structures $14_1$, $14_2$, drain electrode structure 20, or source electrode structures $22_1$, $22_2$).

More particularly, here the field plate interconnect structure 27_IC is formed at the same time as (concurrently with) the field plate structures $23_1$ and $23_2$ and field plate pad 27 as copper Damascene structures of the type described above having a copper layer disposed to within a diffusion barrier layer; albeit off of the semiconductor mesa 11. Thus, field plate interconnect structure 27_IC is formed in layer 50 at the same predetermined depth, P, from the semiconductor layer 36 as the bottom of the field plate structures $23_1$ and $23_2$.

After forming the structure shown in FIGS. 13A and 13A' using the processes described above, a dielectric structure, here for example silicon dioxide (SiO2) layer 58 on top of a silicon nitride (SiNx) etch stop layer 56, is formed over the entire substrate 32, as shown in FIGS. 13B and 13B'. It is noted that the dielectric structure (silicon dioxide (SiO2) layer 58 on top of a silicon nitride (SiNx) etch stop layer 56) is formed over the field plate pads 27, the field plate interconnect structure 27_IC, the gate pad 16, and entire the semiconductor mesa 11, as shown.

Next, referring to FIGS. 13C and 13C', openings are formed through the portions of dielectric structure (silicon dioxide (SiO2) layer 58 on top of a silicon nitride (SiNx) etch stop layer 56) (vertically along the Z axis (FIG. 13C')) over: (A) the drain electrode structure 20, to expose such drain electrode 20; (B) the gate pad 16 to expose the gate pad 16 and, (C) the field plate pads 27 to expose the field plate pads 27. Copper Damascene structures 92 are formed through the openings onto the exposed: drain electrode 20; gate pad 16; and field plate pads 27; the Damascene structure 92 on the drain electrode 20 providing a bottom portion of a drain electrode crossover 99 (FIGS. 13D, 13D'; and 13D"), to be described. It is noted that not only does the Damascene structure 92 on the drain electrode 20 provide a bottom portion of a drain electrode crossover 99, the Damascene structure 92 on the gate pad 16 and on the field plate pads 27 builds up the heights of the field plate pads 27 and the gate pad 16 to the same height as the bottom portion of the drain crossover 99 being formed.

Next, referring to FIGS. 13D, 13D', 13D" and 13D''', a second dielectric structure (silicon dioxide (SiO2) layer 94 on top of a silicon nitride (SiNx) etch stop layer 93), is formed over the entire structure and then openings are formed through portions of the second dielectric structure layers 94 and 93 to expose: (A) the Damascene structure 92 on the drain electrode 20 and the bottom portion of the drain crossover 99; (B) the Damascene structure 92 over the gate pad 16; and (C) the Damascene structure 92 over the field plate pads 27. Then Damascene structures 97a, 97b and 97c are formed through the openings onto, respectively: (A) the Damascene structure 92 on the drain electrode 20 thereby completing the crossover 99 (which crosses over the field plate interconnect 27_IC but is electrically insulated from the field plate interconnect 27_IC by the dielectric structure 90, as shown in FIG. 13D"); (B) Damascene structure 92 over the gate pad 16 and (C) the Damascene structure 92 over the field plate pads 27. A simplified, diagrammatical sketch of a portion of the structure of FIG. 13D is shown in FIG. 13D'''.

Figure 13E:
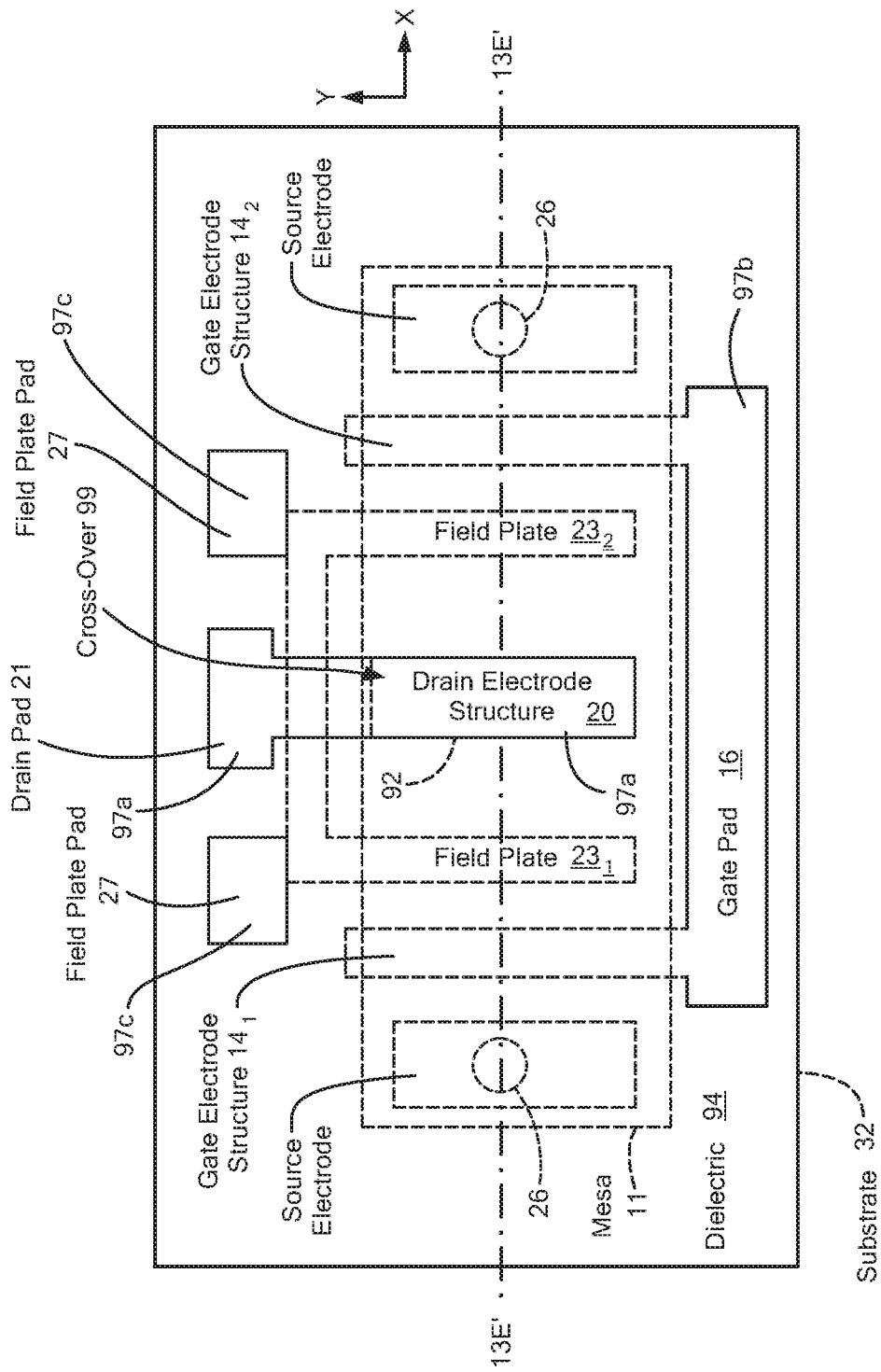
Figure 13E:
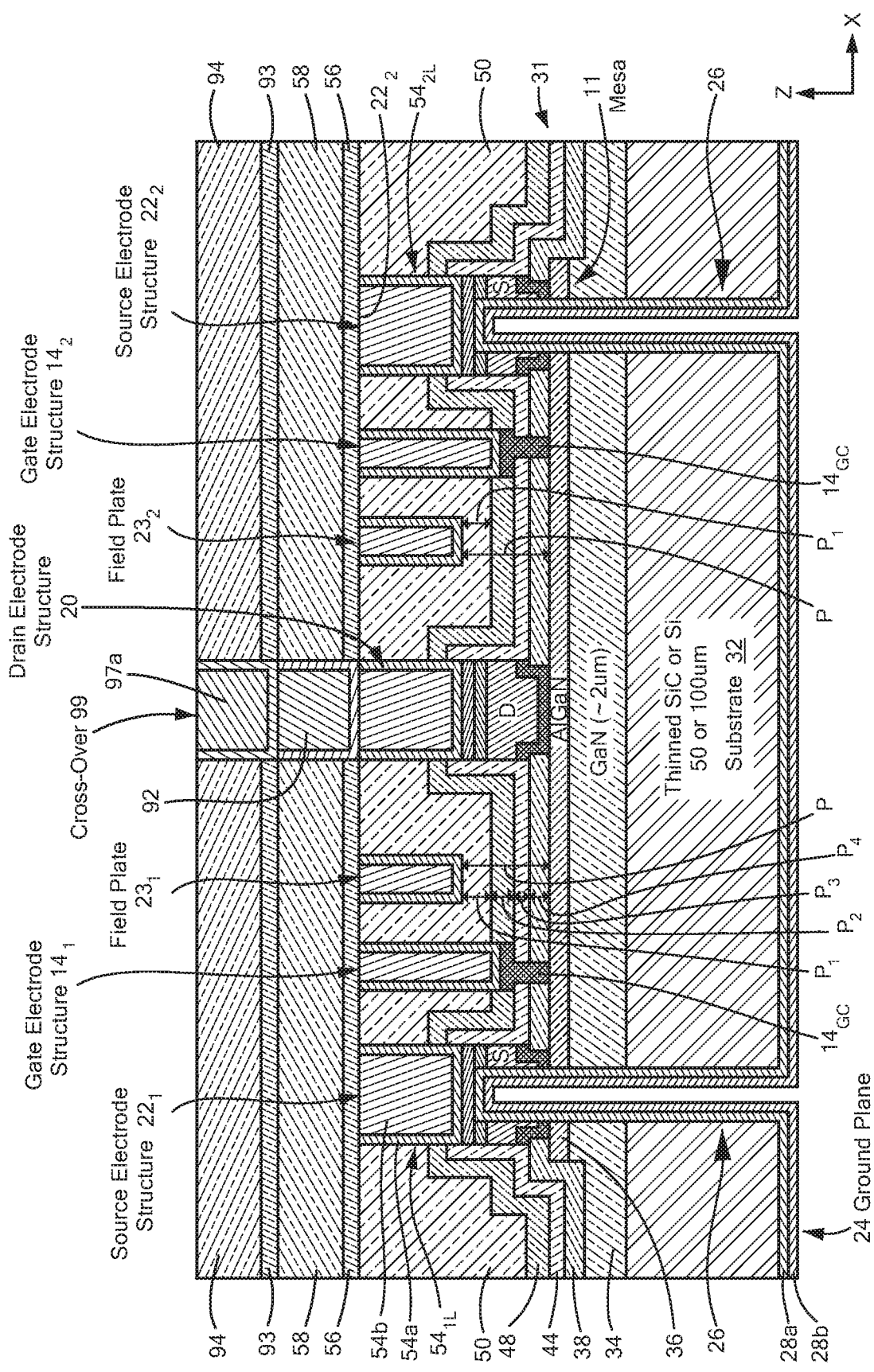

After the completion of front-side processing, the back-side processing begins; for example as described above in connection with FIG. 3R and subsequent FIGS. The competed FET is shown in FIGS. 13E and 13E'.

It is noted that, as described above, the gate electrode structure $14_1$, $14_2$ controls a flow of carriers between the source electrode structures $22_1$, $22_2$ (which are electrically connected by the ground plane conductor 24 on the bottom of the substrate 32, (the ground plane conductor 24 serving as a source pad 25 as described above in connection with FIG. 2B) and drain electrode structure 20 through the semiconductor layer 34. It is also noted that substrate 32 provides electrical isolation between the source pad 25, gate pad 16 and drain pad 21. It is also noted, as described above, a the second Damascene structure 97a of the drain crossover 99, which crosses over the field plate interconnect 27_IC, is electrically insulated from the field plate interconnect 27_IC by the dielectric structure 58. Therefore, the gate pad 16, drain pad 20, source pad 25, and field plate pad 27 (and hence the field plates $23_1$ and $23_2$ which are over the semiconductor layers 34 and 38 and control an electric field in a region in the semiconductor layers 34 and 38 beneath the field plates $23_1$ and $23_2$), may all be fed separate, independent voltages.

It should be noted that the predetermined distance between the bottom of the field plate and the semiconductor, referred to above as P, P''' and P''' are determined by, for example, simulation and adjusted to provide optimum device performance. Likewise, the voltage applied to the field plate pad 27 in FIGS. 13A and 13 B is determined by, for example, simulation and adjusted to provide optimum device performance.

A number of embodiments of the disclosure have been described. Nevertheless, it will be understood that various modifications may be made without departing from the spirit and scope of the disclosure. For example, the FET structure 12 shown in FIGS. 2A and 2B may be fabricated such that the electrical contact structures $42_1$-$42_3$ (FIG. 3D) are fabricated without the electrically conductive etch stop layer $42_{ES}$, here for example, nickel or molybdenum or platinum, disposed on the Ohmic contact structure $42_{OC}$ that is shown for electrical contact structure $42_1$ FIG. 4A'. An example of the electrical contact structures $42_1$-$42_3$ (FIG. 2B) fabricated without an electrically conductive etch stop layer $42_{ES}$, is shown in FIG. 4B. Additionally, the dielectric stop etch layers 48 and 56', here for example SiNx, can be removed in a single etch step or during sequential etches (as shown in many of the figures) during the formation of electrical interconnect structures ($54_{1L}$-$54_{3L}$, $14_1$, $14_2$) and field plate structures ($29_L$) to electrode structures electrical contact structures ($42_1$, $42_3$, and $42_2$) and gate contacts $14_{GC}$. When etch stop layers 48 and 56', here for example SiNx, are removed in a single etch step during the formation of electrical interconnect structures, the bottom of the field plate structures ($29_L$) will terminate in layer 50' (instead of 56' as is shown in FIG. 11F). Accordingly, other embodiments are within the scope of the following claims.

What is claimed is:

1. A transistor structure, comprising:
   a semiconductor;
   a first electrode structure;
   a second electrode structure;
   a third electrode structure for controlling a flow of carriers in the semiconductor between the first electrode structure and the second electrode structure;
   a dielectric structure having a first dielectric layer, a second dielectric layer and a third dielectric layer and a fourth dielectric layer, the dielectric structure disposed over the semiconductor and extending horizontally between first electrode structure, the second electrode structure and the third electrode structure; and
   a fourth electrode structure passing into the dielectric structure extending through the first dielectric layer, the second dielectric layer and third dielectric layer and terminating a predetermined, finite distance above the semiconductor at the fourth dielectric layer.

2. The transistor structure recited in claim 1 wherein the fourth electrode structure is a field plate structure.

3. The transistor structure recited in claim 2 wherein the field plate structure is connected to the first electrode structure.

4. The transistor structure recited in claim 1 wherein the fourth electrode structure is connected to the first electrode structure.

5. The transistor structure recited in claim 1 wherein the first electrode structure and the fourth electrode structure are electrically isolated one from another.

6. The transistor structure recited in claim 1 wherein the first electrode structure, the second electrode structure and the fourth electrode structure are electrically isolated one from another.

7. The transistor structure recited in claim 1 wherein the first electrode structure and the second electrode structure are in Ohmic contact with the semiconductor.

8. The transistor structure recited in claim 2 wherein the first electrode structure and the second electrode structure are in Ohmic contact with the semiconductor.

9. The transistor structure recited in claim 3 wherein the first electrode structure and the second electrode structure are in Ohmic contact with the semiconductor.

10. A Field Effect Transistor (FET) structure, comprising:
    a semiconductor;
    a first dielectric structure disposed over the semiconductor;
    a second dielectric structure having a first layer, a second layer and a third layer disposed on the first dielectric structure;
    a source electrode and a drain electrode each having an upper electrical interconnect portion and a lower Ohmic contact portion in Ohmic contact with the semiconductor, the lower Ohmic contact portion passing vertically through the first dielectric structure to the semiconductor, the upper electrical interconnect portion passing vertically into the second dielectric structure to the lower Ohmic contact portion;
    a gate electrode for controlling a flow of carriers in the semiconductor between the source electrode and the drain electrode, the gate electrode having an upper electrical interconnect portion and a lower portion in contact with the semiconductor, the upper electrical interconnect portion of the gate electrode passing vertically into the second dielectric structure to the lower portion of the gate electrode;
    wherein a portion of the second dielectric structure extends horizontally between the gate electrode and the drain electrode; and
    a field plate parallel to the upper electrical interconnect portion of the source electrode and the upper electrical interconnect portion of the drain electrode, and the upper electrical interconnect portion of the gate electrode, the field plate being disposed between the upper electrical interconnect portion of the drain electrode and the upper electrical interconnect portion of the gate electrode, the field plate having an upper, electrical interconnect portion electrically connected to the upper electrical interconnect portion of the source electrode, the upper electrical interconnect portion of the field plate passing vertically from the upper surface of the FET structure into the second dielectric structure and terminating at a lower portion of the field plate, the lower portion of the field plate being disposed a predetermined, finite distance from the semiconductor at the first dielectric structure.

11. The Field Effect Transistor (FET) recited in claim 10 wherein the first dielectric structure comprises an etch stop layer and wherein the lower portion of the field plate terminates at the etch stop layer.

12. The Field Effect Transistor (FET) recited in claim 10 wherein the first dielectric structure comprises an etch stop layer and wherein the lower portion of the field plate terminates at an upper surface of the first dielectric structure.

13. The Field Effect Transistor (FET) recited in claim 10 wherein: the second dielectric structure comprises an etch stop layer and wherein the lower portion of the field plate terminates within the second dielectric layer.

14. The Field Effect Transistor (FET) recited in claim 10 wherein the upper electrical interconnect portion of the source electrode, the upper electrical interconnect portion of the drain electrode and the upper electrical interconnect portion of the gate electrode each is a copper Damascene structure.

15. The Field Effect Transistor (FET) recited in claim 11 wherein the upper electrical interconnect portion of the field plate is electrically connected to the upper electrical interconnect portion of the source electrode through an interconnection structure and wherein the interconnection structure is a copper Damascene structure.

16. The Field Effect Transistor (FET) recited in claim 10 wherein: the lower portion of the field plate terminates on a metal layer disposed above the first dielectric structure layer.

17. The Field Effect Transistor (FET) recited in claim 16 wherein the upper, electrical interconnect portion of the field plate is electrically connected to the upper portion of the source electrode though an interconnection structure and wherein the interconnection portion is a copper Damascene structure.

18. The transistor structure recited in claim 1 wherein the first electrode structure, the second electrode structure, the third electrode structure and the fourth electrode structure are electrically isolated one from another.

19. The transistor structure recited in claim 18 wherein the first electrode structure is a source electrode structure, the second electrode structure is a drain electrode structure and the fourth electrode structure is an electrode structure for controlling an electric field in the semiconductor under the fourth electrode structure.

* * * * *